(12) United States Patent
Kim et al.

(10) Patent No.: US 12,401,110 B2
(45) Date of Patent: Aug. 26, 2025

(54) ELECTRONIC DEVICE COMPRISING ANTENNA

(71) Applicant: Samsung Electronics Co., Ltd., Suwon-si (KR)

(72) Inventors: Gyusub Kim, Suwon-si (KR); Jiho Kim, Suwon-si (KR); Kyungmoon Seol, Suwon-si (KR); Seongyong An, Suwon-si (KR); Minkyung Lee, Suwon-si (KR); Kyihyun Jang, Suwon-si (KR); Myunghun Jeong, Suwon-si (KR); Nakchung Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 129 days.

(21) Appl. No.: 18/493,239

(22) Filed: Oct. 24, 2023

(65) Prior Publication Data
US 2024/0106103 A1 Mar. 28, 2024

Related U.S. Application Data

(63) Continuation of application No. PCT/KR2023/014812, filed on Sep. 26, 2023.

(30) Foreign Application Priority Data

Sep. 26, 2022 (KR) .................. 10-2022-0121327
Oct. 27, 2022 (KR) .................. 10-2022-0140147

(51) Int. Cl.
*H01Q 1/22* (2006.01)
*H01Q 1/48* (2006.01)
*H01Q 5/40* (2015.01)

(52) U.S. Cl.
CPC ............... *H01Q 1/22* (2013.01); *H01Q 1/48* (2013.01); *H01Q 5/40* (2015.01)

(58) Field of Classification Search
CPC ...... H01Q 1/22; H01Q 1/243; H01Q 1/38–48; H01Q 1/52; H01Q 5/30–40
See application file for complete search history.

(56) References Cited

U.S. PATENT DOCUMENTS 9,098,241 B1 8/2015 Cho et al.
10,498,033 B2 12/2019 Zhu et al.
(Continued)

FOREIGN PATENT DOCUMENTS

KR 10-2019-0089375 A 7/2019
KR 10-2020-0045661 A 5/2020
(Continued)

OTHER PUBLICATIONS

International Search Report dated Jan. 4, 2024, issued in International Application No. PCT/KR2023/014812.

*Primary Examiner* — Hasan Islam
(74) *Attorney, Agent, or Firm* — Jefferson IP Law, LLP

(57) ABSTRACT

An electronic device is provided. The electronic device includes a housing including a lateral member including a first side surface, a second side surface, and a third side surface, a first conductive portion segmented through a first segmentation portion, a substrate including a ground, and a wireless communication circuit disposed on the substrate, the first conductive portion includes a first power feed unit, a second power feed unit, a first ground part, and a second ground part.

20 Claims, 37 Drawing Sheets

(56) References Cited

U.S. PATENT DOCUMENTS

| | | |
|---|---|---|
| 11,101,827 B2 * | 8/2021 | Kim .................... H01Q 5/35 |
| 11,184,987 B1 | 11/2021 | Jung et al. |
| 2020/0127404 A1 | 4/2020 | Seo et al. |
| 2020/0321988 A1 | 10/2020 | Kim et al. |
| 2021/0021018 A1 | 1/2021 | Yoon et al. |
| 2021/0135351 A1 * | 5/2021 | Son .................... H01Q 5/328 |
| 2021/0226319 A1 | 7/2021 | Sung et al. |
| 2022/0006176 A1 | 1/2022 | Froese et al. |
| 2022/0158331 A1 | 5/2022 | Jeon et al. |
| 2022/0166867 A1 | 5/2022 | Nam et al. |
| 2022/0223998 A1 | 7/2022 | Jang et al. |
| 2023/0085200 A1 | 3/2023 | Oh et al. |
| 2023/0239385 A1 | 7/2023 | Lee et al. |

FOREIGN PATENT DOCUMENTS

| | | |
|---|---|---|
| KR | 10-2020-0089330 A | 7/2020 |
| KR | 10-2020-0101234 | 8/2020 |
| KR | 10-2021-0116380 | 9/2021 |
| KR | 10-2022-0021400 A | 2/2022 |
| KR | 10-2022-0046309 | 4/2022 |
| KR | 10-2022-0068889 A | 5/2022 |
| KR | 10-2022-0102464 | 7/2022 |

\* cited by examiner

ELECTRONIC DEVICE COMPRISING ANTENNA

CROSS-REFERENCE TO RELATED APPLICATION(S)

This application is a continuation application, claiming priority under § 365(c), of an International application No. PCT/KR2023/014812, filed on Sep. 26, 2023, which is based on and claims the benefit of a Korean patent application number 10-2022-0121327, filed on Sep. 26, 2022, in the Korean Intellectual Property Office, and of a Korean patent application number 10-2022-0140147, filed on Oct. 27, 2022, in the Korean Intellectual Property Office, the disclosure of each of which is incorporated by reference herein in its entirety.

TECHNICAL FIELD

The disclosure relates to an electronic device comprising an antenna.

BACKGROUND ART

Electronic devices are gradually becoming slimmer to meet consumers' purchase desires as the functional gap of each manufacturer decreases, and they are being developed to increase the rigidity of electronic devices, strengthen design aspects, and at the same time differentiate their functional elements. As part of this trend, an electronic device may include at least one antenna, which must be provided for communication among its components. Such an antenna may be implemented through a metal bezel (e.g., a lateral member) used as a part of a housing of an electronic device and is being developed to exhibit excellent radiation performance.

The above information is presented as background information only to assist with an understanding of the disclosure. No determination has been made, and no assertion is made, as to whether any of the above might be applicable as prior art with regard to the disclosure.

DISCLOSURE

Technical Problem

The volume and number of antennas used in the electronic device may be determined according to the frequency, bandwidth and/or type of each service. For example, a low band (LB) of about 600 megahertz (MHz) to 960 MHz, a mid band (MB) of about 1700 MHz to 2200 MHz, a high band (HB) of about 2300 MHz to 2800 MHz, or a high frequency band of about 3 gigahertz (GHz) to 300 GHz (e.g., fifth generation (5G) (new radio (NR))) (e.g., ultra-high band (UHB)/frequency range 1 (FR1), about 3.2 GHz~4.5 GHz) may be used as the main communication band. As another example, various wireless communication services such as Bluetooth™ (BT), global positioning system (GPS), or wireless fidelity (WI-FI) may be used. While a plurality of antennas must be included in an electronic device to support the above-mentioned communication bands, in an electronic device having a diversified operating structure (e.g., a rollable electronic device or a foldable electronic device), the space for antennas to be placed may be reduced. To overcome this, service bands with similar frequency bands can be combined and designed to be separated into several antennas.

The electronic device may include at least one housing structure for preparing a space for accommodating electronic components. The housing structure may include a lateral member used as at least a portion of a side surface of the electronic device. In an embodiment, the lateral member may be at least partially formed of a metal material (e.g., a conductive member, a conductive portion, or a conductive material) to reinforce the rigidity of the electronic device and/or perform a designated function (e.g., an antenna function), and the remaining portion may be formed of a polymer material (e.g., a non-conductive member, a non-conductive portion, or a non-conductive material) combined with a metal material. For example, the conductive portion of the lateral member may include at least one antenna formed through at least one non-conductive portion (e.g., a segmentation portion). For example, the conductive portion is segmented through at least one segmentation portion, and by feeding power to both sides of the segmentation portion respectively, it can be implemented as at least two antennas operating in various frequency bands.

However, when antennas, having a power feed structure through two power feed units disposed on the left and right sides of the same side based on the segmentation portion, operate simultaneously (e.g., carrier aggregation (CA) mode or 4Rx mode), since the distribution of the current is formed in the same direction (e.g., a horizontal direction), isolation between antennas may be lowered and radiation performance may be deteriorated.

Aspects of the disclosure are to address at least the above-mentioned problems and/or disadvantages and to provide at least the advantages described below. Accordingly, an aspect of the disclosure is to provide an electronic device including an antenna that may help improve radiation performance through proper segmentation and power feed of a conductive member used as a lateral member.

Another aspect of the disclosure is to provide an electronic device including an antenna that may help improve isolation of antennas when power is fed to both sides of a segmentation portion.

Additional aspects will be set forth in part in the description which follows and, in part, will be apparent from the description, or may be learned by practice of the presented embodiments.

Technical Solution

In accordance with an aspect of the disclosure, an electronic device is provided. The electronic device includes at least one housing including a lateral member, the lateral member includes a first side surface, a second side surface extending from a first end of the first side surface, and a third side surface extending from a second end of the first side surface, a first conductive portion formed in a loop shape and segmented through a first segmentation portion when the first side surface is viewed from the outside, a substrate disposed in an inner space of the at least one housing and including a ground, and a wireless communication circuit disposed on the substrate and configured to transmit or receive a wireless signal in at least one frequency band through the first conductive portion. The first conductive portion includes a first power feed unit electrically connected to the wireless communication circuit through a first point in one direction of the first segmentation portion, a second power feed unit electrically connected to the wireless communication circuit through a second point in the other direction of the first segmentation portion, a first ground part electrically connected to the ground through the third point between the first segmentation portion and the first point in one direction, and a second ground part electrically connected to the ground through the fourth point between the second point and the first point in the other direction.

Advantageous Effects

According to various embodiments, isolation can be improved even if the antennas operate simultaneously by being induced to have an electrical path (or current distribution) of different directions each other through a power feed structure in which, when one side of the electronic device is viewed from the outside, a loop-shaped conductive portion segmented through the segmentation portion is formed and power is fed to both sides based on the segmentation portion.

Other aspects, advantages, and salient features of the disclosure will become apparent to those skilled in the art from the following detailed description, which, taken in conjunction with the annexed drawings, discloses various embodiments of the disclosure.

DESCRIPTION OF DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

MODE FOR DISCLOSURE

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
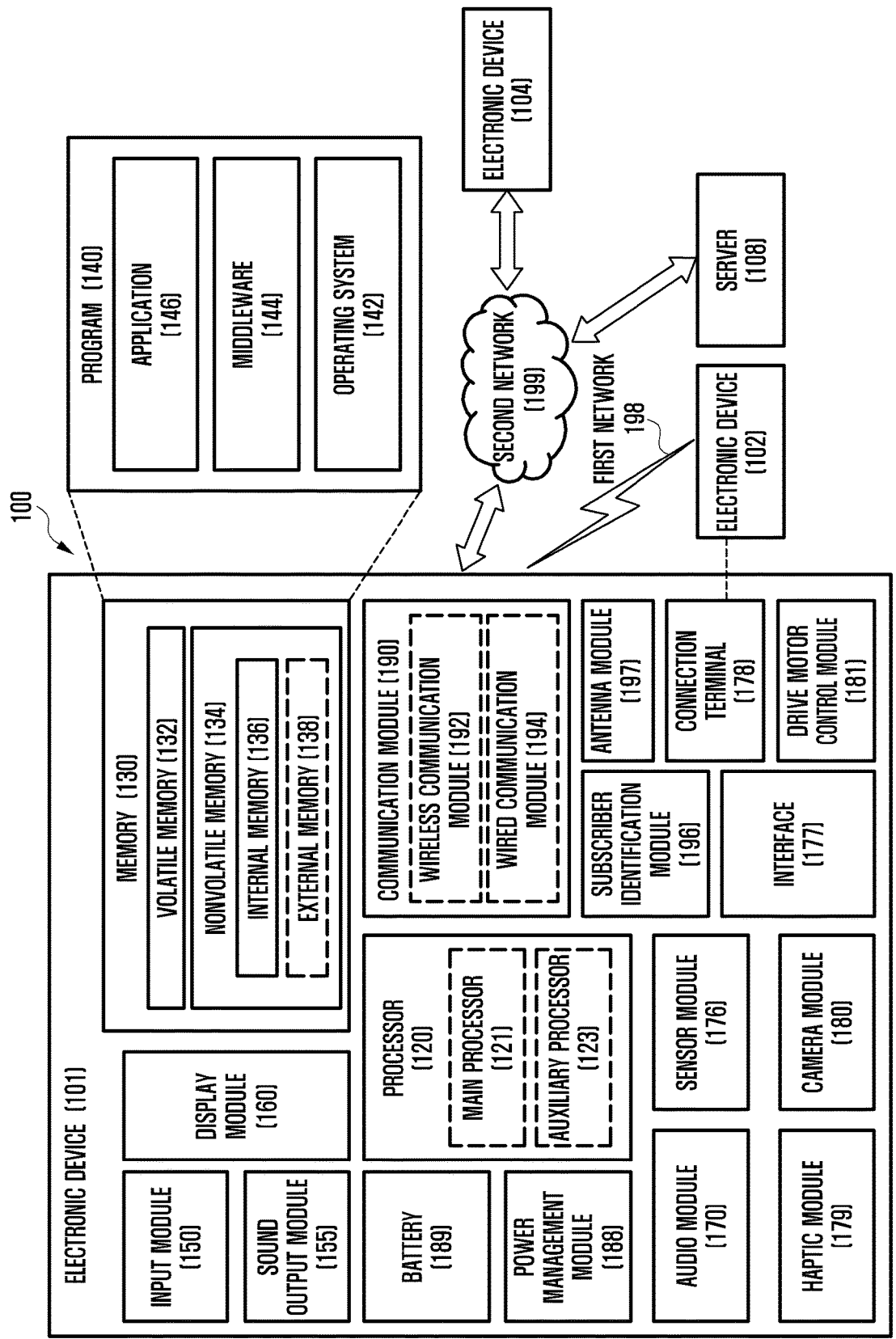
FIG. 1 is a block diagram of an electronic device in a network environment according to an embodiment of the disclosure.

FIG. 1 is a block diagram illustrating an electronic device in a network environment according to an embodiment of the disclosure.

Referring to FIG. 1, an electronic device 101 in a network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, a memory 130, an input module 150, a sound output module 155, a display module 160, an audio module 170, a sensor module 176, an interface 177, a connection terminal 178, a haptic module 179, a camera module 180, a power management module 188, a battery 189, a communication module 190, a subscriber identification module (SIM) 196, a drive motor control module 181, or an antenna module 197. In some embodiments, at least one of the components (e.g., the connection terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 may include the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134. The non-volatile memory may include an internal memory 136 and an external memory 138.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101.

The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the strength of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., the electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

The connection terminal 178 may include a connector via which the electronic device 101 may be physically connected with the external electronic device (e.g., the electronic device 102). According to an embodiment, the connection terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power fed to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN))). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a fourth generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the millimeter wave (mmWave) band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 gigabits per second (Gbps) or more) for implementing eMBB, loss coverage (e.g., 164 decibels (dB) or less) for implementing mMTC, or U-plane latency (e.g., 0.5 milliseconds (ms) or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form an mmWave antenna module. According to an embodiment, the mmWave antenna module may include a printed circuit board, an RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a lateral) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic device 102 or 104 may be a device of a same type as, or a different type, from the electronic device 101. According to an embodiment, all or some of operations to be executed at the electronic device 101 may be executed at one or more of the external electronic device (e.g., electronic devices 102 and 104 or the server 108). For example, if the electronic device 101 should perform a function or a service automatically, or in response to a request from a user or another device, the electronic device 101, instead of, or in addition to, executing the function or the service, may request the one or more external electronic devices to perform at least part of the function or the service. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) on the basis of 5G communication technology or IoT-related technology.

Figure 2A:
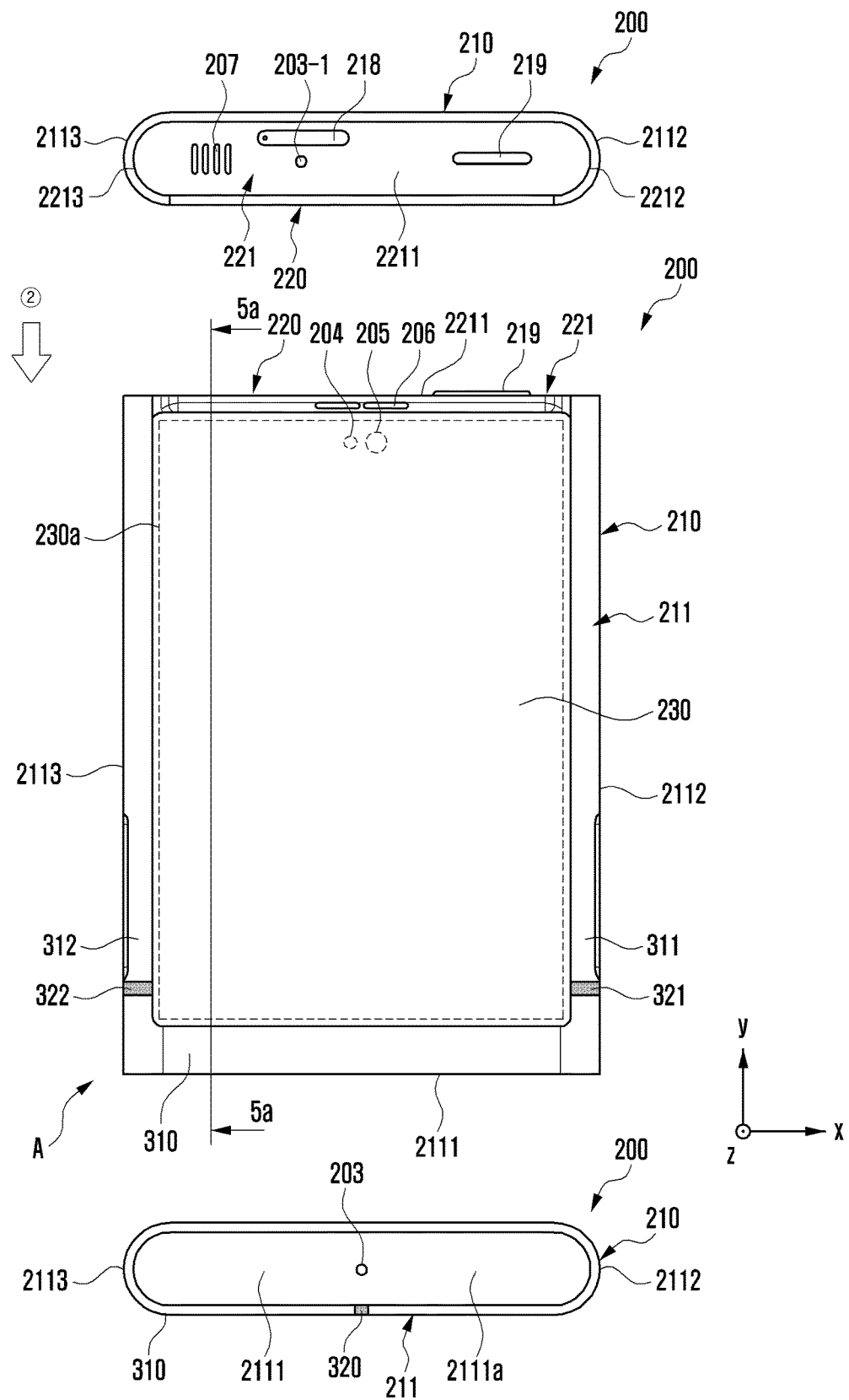
FIGS. 2A and 2B are diagrams illustrating front surface and rear surface of an electronic device in a slide-in state according to various embodiments of the disclosure.
Figure 2B:
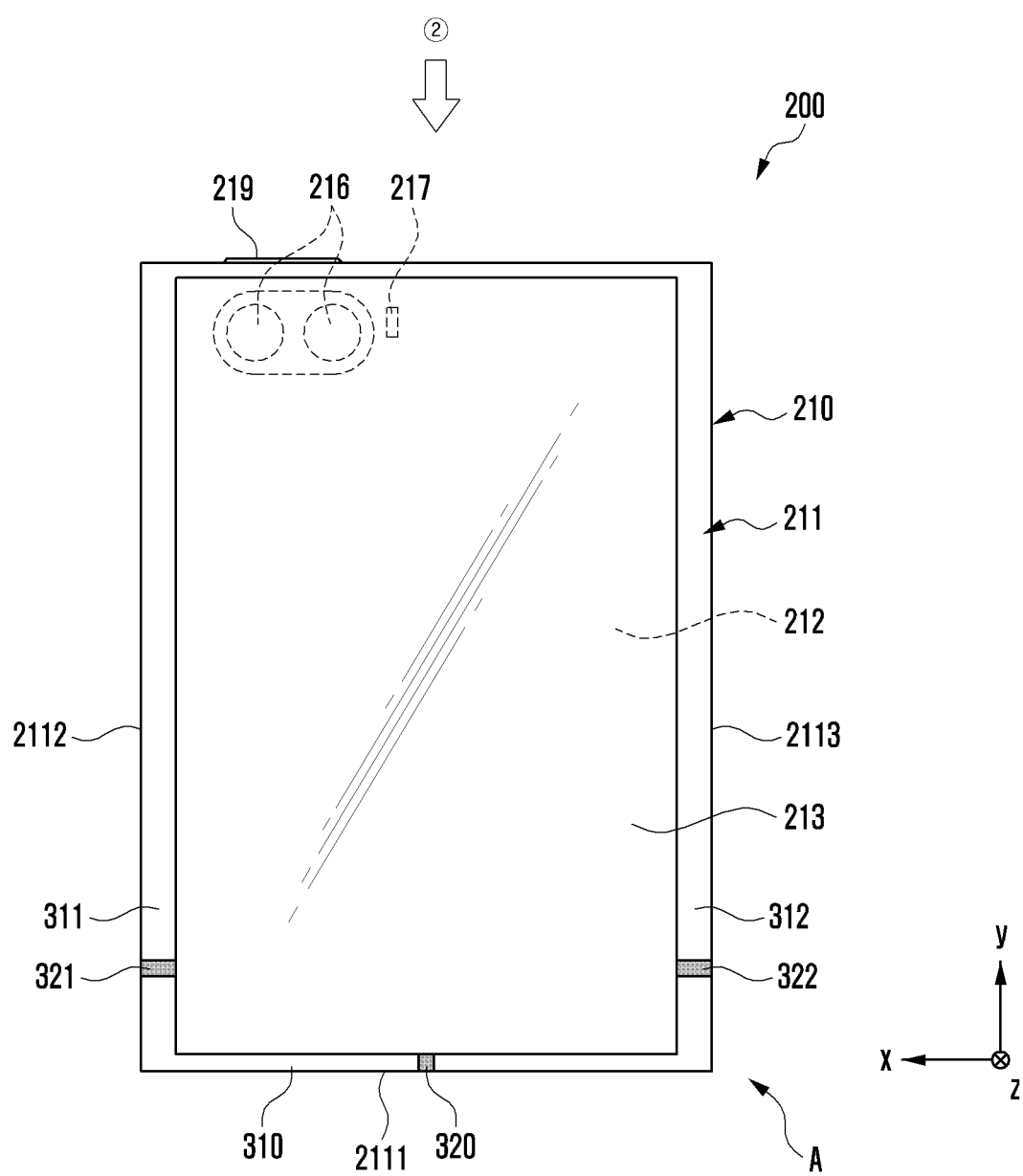

FIGS. 2A and 2B are diagrams illustrating front surface and rear surface of an electronic device in a slide-in state according to various embodiments of the disclosure.

Figure 3A:
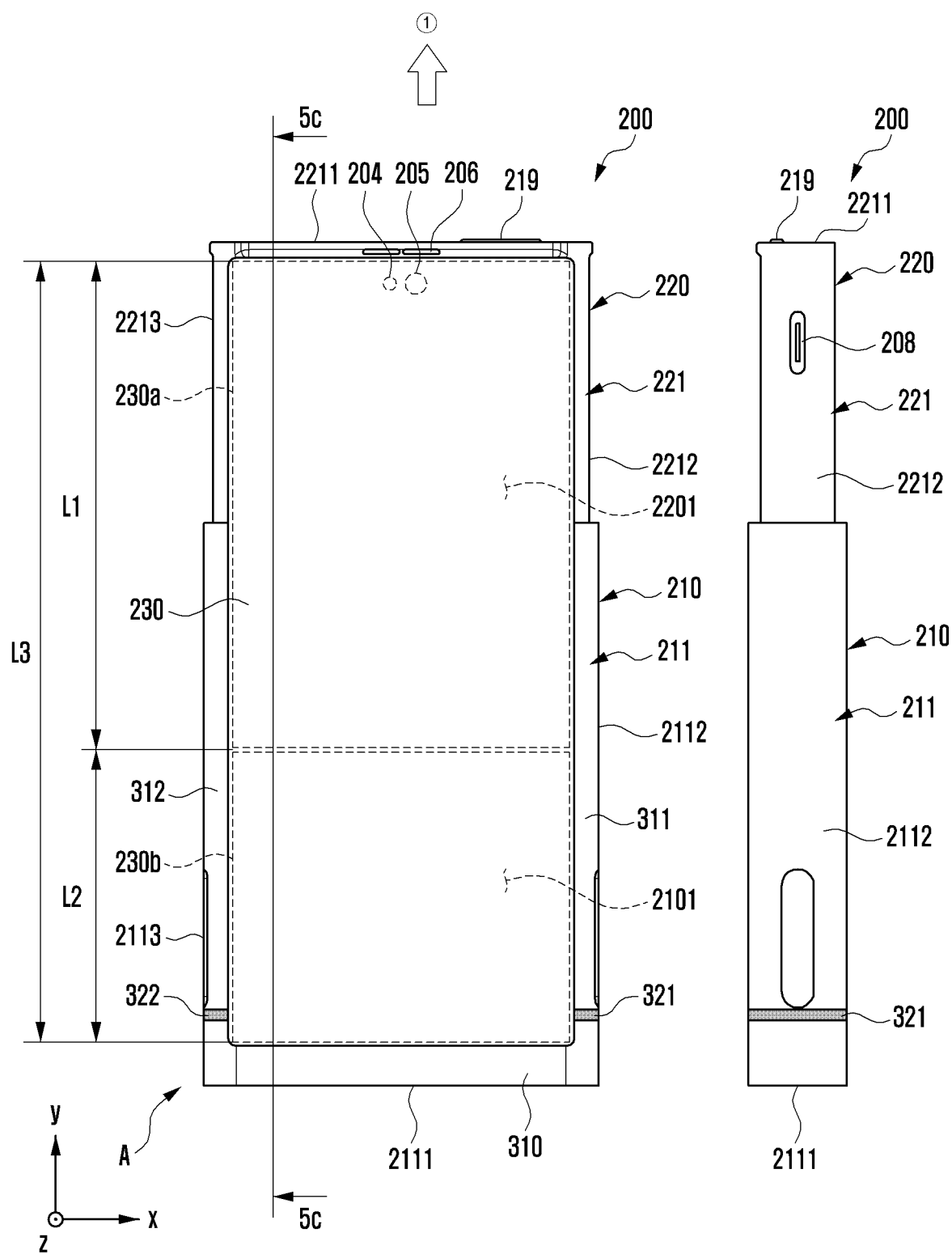
FIGS. 3A and 3B are diagrams illustrating front surface and rear surface of an electronic device in a slide-out state according to various embodiments of the disclosure.
Figure 3B:
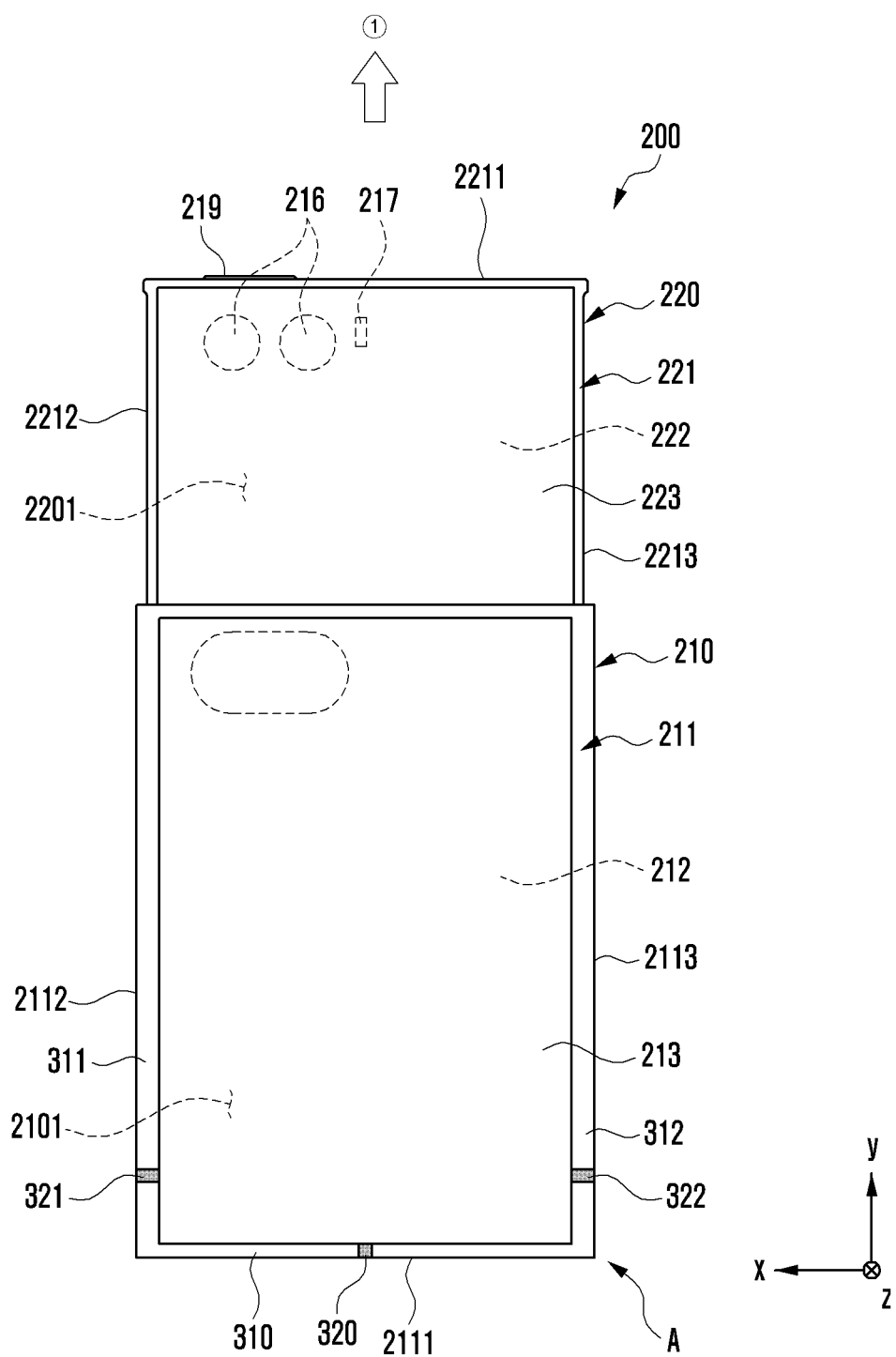

FIGS. 3A and 3B are diagrams illustrating front surface and rear surface of an electronic device in a slide-out state according to various embodiments of the disclosure.

Electronic device 200 of FIGS. 2A, 2B, 3A, and 3B may be at least partially similar to the electronic device 101 of FIG. 1 or may further include other embodiments of the electronic device.

Referring to FIGS. 2A, 2B, 3A, and 3B, an electronic device 200 may include a first housing 210, a second housing 220 slidably coupled in a designated direction (e.g., first direction ① or second direction ②) (e.g., ±y-axis direction) from the first housing 210, and a flexible display 230 (e.g., a rollable display, an expandable display, a stretchable display) disposed to be supported through at least a portion of the first housing 210 and the second housing 220. In an embodiment, the second housing 220 may be slidably coupled to the first housing so that it may be slid out in a first direction (first direction ①) with respect to the first housing 210, or it may be slid in the second direction ②) opposite to the first direction (first direction ①). In an embodiment, the electronic device 200 may transition to a slide-in state (e.g., the slide-in state) by at least a portion of the second housing 220 being accommodated in at least a portion of a first space 2101 formed through the first housing 210. In an embodiment, the electronic device 200 may transition to a slide-out state (e.g., the slide-out state) by at least a portion of the second housing 220 being moved in an outward direction (e.g., first direction ①) from the first space 2101. In an embodiment, the electronic device 200, in the slide-out state, may form at least partially the same plane as at least a portion of the second housing 220, and in the slide-in state, it may include a support member (e.g., support member 240 of FIG. 4) (e.g., a bendable member, a bendable support member, an articulated hinge module, or a multi-bar assembly) accommodated at least partially into the first space 2101 of the first housing 210 in a bending manner. In an embodiment, at least a portion of the flexible display 230 may be disposed in such a way that it is attached to at least a portion of the second housing 220. In an embodiment, at least a portion of the remaining portion of the flexible display 230 may be attached to the support member 240 (e.g., the support member 240 of FIG. 4). In an embodiment, at least a portion of the flexible display 230, in a slide-in state, may be disposed to be invisible from the outside by being accommodated into the first space 2101 of the first housing 210 in a bent manner while being supported by the support member (e.g., the support member 240 of FIG. 4). In an embodiment, at least a portion of the flexible display 230, in a slide-out state, may be disposed to be visible from the outside while being supported by the support member (e.g., the support member 240 of FIG. 4) that forms at least partially the same plane as the second housing 220.

According to various embodiments, the electronic device 200 may include a first housing 210 that includes a first lateral member 211 and a second housing 220 that includes a second lateral member 221. In an embodiment, the first lateral member 211 may include a first side surface 2111 having a first length; a second side surface 2112 extending in a direction (e.g., the y-axis direction) perpendicular to one end of the first side surface 2111 and having a second length; and a third side surface 2113 extending parallel to the second side surface 2112 from the other end of the first side surface 2111 and having a second length. In an embodiment, the first lateral member 211 may be at least partially formed of a conductive member (e.g., metal). In some embodiments, the first lateral member 211 may be formed by combining a conductive member and a non-conductive member (e.g., polymer). In an embodiment, the first housing 210 may include a first extension member 212 extending from at least a portion of the first lateral member 211 to at least a portion of the first space 2101. In an embodiment, the first extension member 212 may be integrally formed with the first lateral member 211. In some embodiments, the first extension member 212 may be formed separately from the first lateral member 211 and structurally coupled with the first lateral member 211.

According to various embodiments, the second lateral member 221 may include a fourth side surface 2211 having a third length, a fifth side surface 2212 extending to correspond to the second side surface 2112 in a direction perpendicular to one end of the fourth side surface 2211 (e.g., −y axis direction) and having a fourth length, and a sixth side surface 2213 extending to correspond to the third side surface 2113 in a direction parallel to the fifth side surface 2212 from the other end of the fourth side surface 2211 and having a fourth length. In an embodiment, the second lateral member 221 may be at least partially formed of a conductive member (e.g., metal). In some embodiments, the second lateral member 221 may be formed by combining a conductive member and a non-conductive member (e.g., polymer). In an embodiment, at least a portion of the second lateral member 221 may include a second extension member 222 extending to at least a portion of a second space 2201 of the second housing 220. In an embodiment, the second extension member 222 may be integrally formed with the second lateral member 221. In some embodiments, the second extension member 222 may be formed separately from the second lateral member 221 and structurally combined with the second lateral member 221.

According to various embodiments, the second side surface 2112 and the fifth side surface 2212 may be slidably coupled to each other. In an embodiment, the third side surface 2113 and the sixth side surface 2213 may be slidably coupled to each other. In an embodiment, in the slide-in state, the fifth side surface 2212 may be disposed substantially invisible from the outside by overlapping with the second side surface 2112. In an embodiment, in the slide-in state, the sixth side surface 2213 may be substantially invisible from the outside by overlapping with the third side surface 2113. In some embodiments, at least a portion of the fifth side surface 2212 and the sixth side surface 2213 may be disposed to be at least partially visible from the outside in a slide-in state. In an embodiment, in the slide-in state, the second extension member 222 may be disposed substantially invisible from the outside by overlapping with the first extension member 212. In some embodiments, the second extension member 222 may be disposed to be at least partially visible from the outside in the slid-in state.

According to various embodiments, the first housing 210 may include a first rear surface cover 213 coupled to at least a portion of the first lateral member 211. In an embodiment, the first rear surface cover 213 may be disposed in a manner coupled with at least a portion of the first extension member 212. In some embodiments, the first rear surface cover 213 may be integrally formed with the first lateral member 211. In an embodiment, the first rear surface cover 213 may be formed of polymer, coated or colored glass, ceramic, metal (e.g., aluminum, stainless steel (STS), or magnesium), or a combination of at least two of these materials. In some embodiments, the first rear surface cover 213 may extend to at least a portion of the first lateral member 211. In some embodiments, the first rear surface cover 213 may be omitted, and at least a portion of the first extension member 212 may be replaced with the first rear surface cover 213.

According to various embodiments, the second housing 220 may include a second rear surface cover 223 coupled to at least a portion of the second lateral member 221. In an embodiment, the second rear surface cover 223 may be disposed in a manner that is combined with at least a portion of the second extension member 222. In some embodiments, the second rear surface cover 223 may be integrally formed with the second lateral member 221. In an embodiment, the second rear surface cover 223 may be formed of polymer, coated or colored glass, ceramic, metal (e.g., aluminum, stainless steel (STS), or magnesium), or a combination of at least two of these materials. In some embodiments, the second rear surface cover 223 may extend to at least a portion of the second lateral member 221. In some embodiments, the second rear surface cover 223 may be omitted, and at least a portion of the second extension member 222 may be replaced with the second rear surface cover 223.

According to various embodiments, the flexible display 230 may include a first portion 230a (e.g., a flat portion) always visible from the outside and a second portion 230b (e.g., a bendable portion or a bending portion) extending from the first portion 230a and accommodated in a manner that is at least partially bent into the first space 2101 of the first housing 210 to be invisible from the outside in a slide-in state. In an embodiment, the first portion 230a may be disposed to be supported by the second housing 220, and the second portion 230b may be disposed to receive support at least partially from the support member (e.g., the support member 240 of FIG. 4). In an embodiment, the second portion 230b of the flexible display 230 may form substantially the same plane as the first portion 230a and be disposed to be visible from the outside while being supported by the support member (e.g., the support member 240 of FIG. 4) in a state that the second housing 220 slides out along the first direction (first direction ①). In an embodiment, the second portion 230b of the flexible display 230 may be accommodated in a manner that is bent into the first space 2101 of the first housing 210 and be disposed to be invisible from the outside in a state that the second housing 220 slides in along the second direction (second direction ②). Accordingly, the display area of the flexible display 230 can be varied as the second housing 220 is moved in a sliding manner along a designated direction (e.g., ±y-axis direction) from the first housing 210.

According to various embodiments, the flexible display 230 may have a variable length in a first direction (first direction ①) according to the sliding movement of the second housing 220 moving relative to the first housing 210. For example, in the slide-in state, the flexible display 230 may have a first display area corresponding to a first length L1 (e.g., an area corresponding to the first portion 230a). In an embodiment, the flexible display 230, in the slide-out state, may be expanded to correspond to a third length L3 longer than the first length L1 and to have a second display area (e.g., an area including the first portion 230a and the second portion 230b) larger than the first display area according to the sliding movement of the second housing 220 additionally moved by a second length L2 relative to the first housing 210.

According to various embodiments, the electronic device 200 may include at least one of an input device (e.g., a microphone 203-1) disposed in the second space 2201 of the second housing 220, an audio output device (e.g., a receiver 206 and/or a speaker 207 for a call), sensor modules 204 and 217, a camera module (e.g., a first camera module 205 or a second camera module 216), a connector port 208, a socket device 218, a key input device 219, or an indicator (not shown). In an embodiment, the electronic device 200 may include another input device (e.g., a microphone 203) disposed in the first housing 210. In another embodiment, the electronic device 200 may be configured so that at least one of the above-described components is omitted or other components are additionally included. In some embodiments, at least one of the above-described components may be disposed in the first space 2101 of the first housing 210.

According to various embodiments, the input device may include a microphone 203-1. In some embodiments, the input device (e.g., the microphone 203-1) may include a plurality of microphones disposed to detect the direction of sound. The audio output device may include, for example, the receiver 206 and the speaker 207 for a call. In an embodiment, the speaker 207 may correspond to the outside through at least one speaker hole formed in the second housing 220 in a position always exposed to the outside regardless of the slide-in/the slide-out state (e.g., the fifth side surface 2212). In an embodiment, the connector port 208 may correspond to the outside through a connector port hole formed in the second housing 220 in a slide-out state. In some embodiments, the connector port 208 may correspond to the outside through an opening formed in the first housing 210 and formed to correspond to the connector port hole. In some embodiments, the receiver 206 for a call may include a speaker (e.g., a piezo speaker) operating while excluding a separate speaker hole.

According to various embodiments, the sensor modules 204 and 217 may generate electrical signals or data values corresponding to an internal operating state of the electronic device 200 or an external environmental state. In an embodiment, the sensor modules 204 and 217 may include, for example, a first sensor module 204 (e.g., a proximity sensor or an illuminance sensor) disposed on the front surface of the electronic device 200 and/or a second sensor module 217 (e.g., a heart rate monitoring (HRM) sensor) disposed on the rear surface of the electronic device 200. In an embodiment, the first sensor module 204 may be disposed below the flexible display 230 on the front surface of the electronic device 200. In an embodiment, the first sensor module 204 and/or the second sensor module 217 may include at least one of a proximity sensor, an illuminance sensor, a time of flight (TOF) sensor, an ultrasonic sensor, a fingerprint recognition sensor, a gesture sensor, a gyro sensor, an air pressure sensor, a magnetic sensor, an acceleration sensor, a grip sensor, a color sensor, an infrared (IR) sensor, a bio sensor, a temperature sensor, or a humidity sensor.

According to various embodiments, the camera module may include a first camera module 205 disposed on the front side of the electronic device 200 and a second camera module 216 disposed on the rear surface of the electronic device 200. In an embodiment, the electronic device 200 may include a flash (not shown) located near the second camera module 216. In an embodiment, the camera modules 205 and 216 may include one or a plurality of lenses, an image sensor, and/or an image signal processor. In an embodiment, the first camera module 205 may be disposed under the flexible display 230 and be configured to photograph a subject through a part of an active area (e.g., a display area) of the flexible display 230.

According to various embodiments, the first camera module 205 among the camera modules and part of the first sensor module 204 among the sensor modules 204 and 217 may be disposed to detect the external environment through the flexible display 230. For example, the first camera module 205 or part of the first sensor module 204 may be disposed in the second space 2201 of the second housing 220 to be in contact with the external environment through a transparent area or a perforated opening formed in the flexible display 230. In an embodiment, an area facing the first camera module 205 of the flexible display 230 may be formed as a transmissive area having a designated transmittance as a part of a display area displaying content. In an embodiment, the transmissive area may be formed to have a transmittance in a range of about 5% to about 20%. Such a transmissive area may include an area overlapping with an effective area (e.g., an angle of view area) of the first camera module 205 through which light for generating an image formed by an image sensor passes. For example, the transmissive area of the flexible display 230 may include an area in which a pixel arrangement density and/or a wiring density are lower than the surrounding area. For example, a transmissive area may replace the aforementioned opening. For example, some types of the first camera module 205 may include an under display camera (UDC). In some embodiments, some types of the first sensor module 204 may be disposed to perform their function in the second space 2201 of the second housing 220 without being visually exposed through the flexible display 230.

According to various embodiments, a slide-in/a slide-out operation of the electronic device 200 may be automatically performed. For example, the slide-in/the slide-out operation of the electronic device 200 may be performed through gear-coupling of a driving motor (e.g., the driver motor control module 181 of FIG. 1 or a driving motor 260 of FIG. 4) including a pinion gear (e.g., pinion gear 261 of FIG. 4) disposed in the first space 2101 of the first housing 210, with a rack gear (e.g., a rack gear 2221 of FIG. 4) disposed in the second space 2201 of the second housing 220 and gear-coupled with the pinion gear 261. In some embodiments, the driving motor 260 including the pinion gear 261 may be disposed in the second space 2201 of the second housing 220 and the rack gear 2221 coupled to the pinion gear 261 may be disposed in the first space 2101 of the first housing 210. For example, the processor (e.g., processor 120 of FIG. 1) of the electronic device 200 may operate a driving motor (e.g., the driving motor 260 of FIG. 4) disposed inside the electronic device 200 in the case of detecting a triggering operation to switch from a slide-in state to a slide-out state or to switch from a slide-out state to a slide-in state. In an embodiment, the triggering signal may include a signal according to a selection (e.g., a touch) of an object displayed on the flexible display 230 or a signal according to a manipulation of a physical button (e.g., a key button) included in the electronic device 200. In some embodiments, a slide-in/a slide-out operation of the electronic device 200 may be performed manually by the manipulation of a user.

According to various embodiments, the electronic device 200 has a structure in which the second housing 220 slides in and/or slides out relative to the first housing 210 along a longitudinal direction (e.g., a vertical direction) (e.g., a ±y-axis direction) of the electronic device 200, but is not limited thereto. For example, the electronic device 200 may have a structure in which the second housing 220 slides in and/or slides out relative to the first housing 210 along a width direction (e.g., a horizontal direction) (e.g., a ±x-axis direction) perpendicular to a length direction of the electronic device 200. In some embodiments, the electronic device 200 may be formed such that the length of the first side surface 2111 of the first housing 210 is longer than the length of the second side surface 2112. In this case, the length of the fourth side surface 2211 of the second housing 220 may also be formed to be longer than the length of the fifth side surface 2212 corresponding to this.

According to various embodiments, the electronic device 200 may include at least one antenna element (e.g., antenna element 224b of FIG. 4) electrically connected to the wireless communication circuit (e.g., the wireless communication module 192 of FIG. 1) disposed in an inner space (e.g., the second space 2201 of the second housing 220). In some embodiments, the electronic device 200 may be disposed in an inner space (e.g., the first space 2101 or the second space 2201), and it may include further at least one antenna module (e.g., an mmWave antenna module or mmWave antenna structure) disposed to transmit or receive the wireless signal in a frequency band ranging from 3 GHz to 100 GHz through another wireless communication circuit (e.g., the wireless communication module 192 of FIG. 1).

According to an embodiment of the disclosure, the electronic device 200 may include at least one antenna A disposed through at least a portion of the first lateral member 211 of the first housing 210. In an embodiment, the at least one antenna A, when viewing the first side surface 2111 from the outside (e.g., when viewing the first side surface 2111 from the front), may be formed in a loop shape (e.g., a ring shape), and it may include a first conductive portion 310 (e.g., a first conductive member) at least partially segmented through a first segmentation portion 320 (e.g., a non-conductive portion or a polymer). In an embodiment, the first conductive portion 310 may be segmented from a surrounding second conductive portion 311 at the second side surface 2112 through a second segmentation portion 321 (e.g., a non-conductive portion or polymer). In an embodiment, the first conductive portion 310 may be segmented at the third side surface 2113 from a surrounding third conductive portion 312 through a third segmentation portion 322 (e.g., a non-conductive portion or a polymer). Therefore, the first conductive portion 310 may be disposed as a unit conductive member separated from the surrounding conductive portions (e.g., the second and third conductive portions 311 and 312) through the second and third segmentation portions 321 and 322, and it may be used as at least one antenna A. In an embodiment, the electronic device 200 may include a wireless communication circuit (e.g., the wireless communication module 192 of FIG. 1) electrically connected to the first conductive portion 310. In an embodiment, the wireless communication circuit (e.g., the wireless communication module 192 of FIG. 1) may be configured to transmit or receive at least one frequency band (e.g., about 600 MHz to 9000 MHz) (e.g., a legacy band or NR band) through the first conductive portion 310. In an embodiment, the electronic device 200 may include a side surface cover 2111a disposed on the first side surface 2111 to cover at least a portion of the first segmentation portion 320 (covered or concealed). In some embodiments, the loop-shaped first conductive portion 310 used as the at least one antenna A may be formed on at least one side surface of the second side surface 2112 and/or the third side surface 2113. In some embodiments, the loop-shaped first conductive portion 310 used as the at least one antenna A may be formed at least one side surface of the fourth side surface 2211, the fifth side surface 2212, or the sixth side surface 2213 of the second housing 220.

According to an embodiment of the disclosure, in at least one antenna A1, an isolation can be improved even if the antennas operate simultaneously by being induced to have an electrical path (or current distribution) of different directions each other through a power feed structure in which power is fed to both sides of the first conductive portion 310 based on the first segmentation portion.

Figure 4:
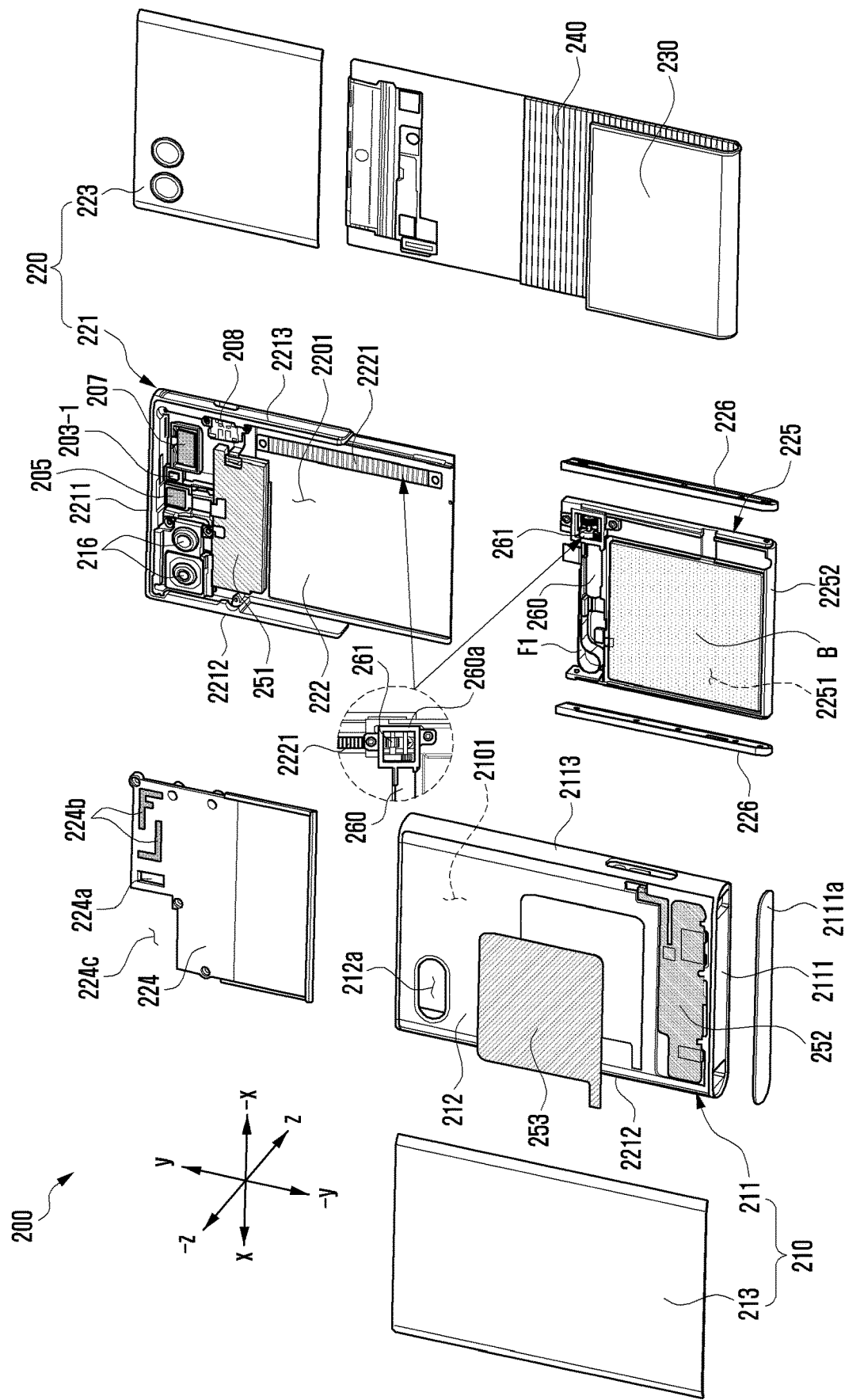
FIG. 4 is an exploded perspective view of an electronic device according to an embodiment of the disclosure.

FIG. 4 is an exploded perspective view of an electronic device according to an embodiment of the disclosure.

In describing the electronic device 200 of FIG. 4, the same reference numerals are assigned to components substantially the same as those of the electronic device 200 of FIGS. 2A, 2B, 3A, and 3B, and detailed descriptions thereof may be omitted.

Referring to FIG. 4, the electronic device 200 may include a first housing 210 including a first space 2101, a second housing 220 slidably coupled to the first housing 210 and including a second space 2201, a support member 240 fixed to at least a portion of the second housing 220 and at least partially bendably accommodated in the first space 2101 according to a slide-in operation, a flexible display 230 disposed to be supported by at least a portion of the support member 240 and the second housing 220, and a driving module (e.g., a driving mechanism) driving the second housing 220 in a slide-in direction (e.g., −y axis direction) and/or in a slide-out direction (e.g. +y axis direction) from the first housing 210. In an embodiment, the first housing 210 may include a first lateral member 211 and a first rear surface cover 213 coupled to at least a portion (e.g., at least a portion of the first extension member 212) of the first lateral member 211. In an embodiment, the second housing 220 may include a second lateral member 221 and a second rear surface cover 223 coupled to at least a portion (e.g., at least a portion of the second extension member 222) of the second lateral member 221. In an embodiment, the driving module may include a driving motor 260 disposed in the first space 2101 and including a pinion gear 261 and a rack gear 2221 disposed to be gear-coupled to the pinion gear 261 in the second space 2201. In an embodiment, the driving module may include further a deceleration module (e.g., a deceleration gear assembly) disposed to reduce rotational speed and increase a driving force by being coupled with the driving motor 260. In an embodiment, the driving motor 260 may be disposed to be supported through a motor bracket 260a disposed in a support bracket 225 which is disposed in the first space 2101 of the first housing 210. In an embodiment, the driving motor 260, in the first space 2101, may be fixed in the end (e.g., the edge area) of the support bracket 225 in the slide-out direction (e.g., y axis direction). In an embodiment, the rack gear 2221 may be disposed in such a way as to be fixed to the second extension member 222 of the second housing 220. In some embodiments, the rack gear 2221 may be formed integrally with at least a portion of the second extension member 222 by being injected. In an embodiment, the rack gear 2221 may be disposed to have a length in a direction parallel to the sliding direction) (e.g., ±y-axis direction). Accordingly, when the electronic device 200 is assembled, the pinion gear 261 may maintain a gear-coupled state with the rack gear 2221, and, as a result, the second housing 220 may be moved relative to the first housing 210 by the pinion gear 261 receiving the driving force of the driving motor 260 being moved along the rack gear 2221. In an embodiment, the sliding distance of the second housing 220 may be determined by the length of the rack gear 2221.

According to various embodiments, the electronic device 200 may include a plurality of electronic components disposed in the second space 2201. In an embodiment, the plurality of electronic components may include a first substrate 251 (e.g., a main board), a second camera module 216 disposed around the first substrate 251, a speaker 207, and a connector port 208 and a microphone 203-1. In an embodiment, since the plurality of electronic components are disposed around the first substrate 251 in the second space 2201 of the second housing 220, efficient electrical connection may be possible. In some embodiments, at least one of the plurality of electronic components described above may be disposed in the first space 2101 of the first housing 210.

According to various embodiments, the electronic device 200 may include a rear bracket 224 disposed between the second extension member 222 and the second rear surface cover 223 in the second housing 220. In an embodiment, the rear bracket 224 may be disposed to cover at least a portion of the plurality of electronic components. In an embodiment, the rear bracket 224 may be structurally coupled to at least a portion of the second extension member 222. In some embodiments, the rear bracket 224 may be omitted. In an embodiment, the rear bracket 224 may cover a plurality of electronic components and may be disposed to support the second rear surface cover 223. In an embodiment, the rear bracket 224 may include an opening 224a (e.g., a through hole) formed in an area corresponding to the second camera module 216 and/or a sensor module (e.g., the second sensor module 217 of FIG. 3B) or a notch area 224c (e.g., a cutting part). In an embodiment, the rear bracket 224 may include at least one antenna element 224b. In an embodiment, the at least one antenna element 224b may be disposed on an outer surface (e.g., the surface facing −z-axis) of the rear bracket 224 when it is formed of an injection material (e.g., an antenna carrier) of a dielectric material. In an embodiment, the at least one antenna element 224b may include a laser direct structuring (LDS) antenna pattern formed on an outer surface of the rear bracket 224. In some embodiments, the at least one antenna element 224b may include a conductive plate attached to the outer surface of the rear bracket 224, a conductive paint formed on the outer surface, or a conductive pattern. In some embodiments, the at least one antenna element 224b may be disposed in a built-in manner when the rear bracket 224 is injected. In an embodiment, the at least one antenna element 224b may be configured to transmit or receive wireless signals in a designated frequency band (e.g., a legacy band) by being electrically connected to a wireless communication circuit (e.g., the wireless communication module 192 of FIG. 1) disposed on the first substrate 251. In an embodiment, the second camera module 216 and/or the second sensor module 217 may be disposed to detect an external environment through the opening 224a or notch area 224a. In an embodiment, at least an area corresponding to the second camera module 216 and/or the second sensor module 217 of the second rear surface cover 223 may be transparently processed. In some embodiments, the second rear surface cover 223 may include a through hole formed in an area corresponding to at least the second camera module 216 and/or the second sensor module 217. In this case, the through hole may be covered through the transparent window. In some embodiments, the second camera module 216 and/or second sensor module 217 may be configured to operate only when the electronic device 200 is in a slide-out state.

According to various embodiments, the electronic device 200 may include the support bracket 225 disposed in the first space 2101 of the first housing 210. In an embodiment, the support bracket 225 may be disposed at one end and have a support part 2252 formed in a curved outer surface to support the rear surface of the support member 240 that is bent during a sliding operation transitioning from a slide-out state to a slide-in state. In an embodiment, the support bracket 225 may include a support structure for supporting and fixing the driving motor 260 through the motor bracket 260a. In an embodiment, the support bracket 225 may include a battery seat 2251 for accommodating the battery. In an embodiment, the driving motor 260 may be disposed at the most end (e.g., edge) of the support bracket 225 in a slide-out direction (e.g., the y-axis direction). For example, when the assembly of the electronic device 200 is completed, the driving motor 260 may help minimize the size and/or length of a flexible board F1 (e.g., the flexible printed circuit board (FPCB) that electrically connects the first substrate 251 and the driving motor 260 by being disposed relatively close to the first substrate 251 among the electronic components disposed on the first housing 210. In an embodiment, the electronic device 200 may include a pair of guide rails 226 disposed on both sides of the support bracket 225 to guide both ends of the support member 240 in a sliding direction.

According to various embodiments, the first housing 210 may include the second camera module 216 disposed on the second housing 220 when the electronic device 200 is in a slide-in state in the first extension member 212 and/or an opening 212a (e.g., a through hole) disposed in an area corresponding to the second sensor module 217. In an embodiment, the second camera module 216 and/or the second sensor module 217, when the electronic device 200 is in a slide-in state, may detect the external environment through the opening 212a formed in the first housing 210. In some embodiments, an area of the first rear surface cover 213 corresponding to the second camera module 216 and/or the second sensor module 217 may be transparently processed.

According to various embodiments, the electronic device 200 may include a second substrate 252 (e.g., a sub substrate) and an antenna member 253 disposed between the first extension member 212 and the first rear surface cover 213 in the first housing 210. In an embodiment, the second substrate 252 and the antenna member 253 may be disposed on at least a portion of the first extension member 212. In an embodiment, the second substrate 252 and the antenna member 253 may be electrically connected to the first substrate 251 through at least one electrical connection member (e.g., a flexible printed circuit board (FPCB) or a flexible radio frequency (RF) cable (FRC)). In an embodiment, the antenna member 253 may include a multi-function coil or multi-function core (MFC) antenna for performing a wireless charging function, a near field communication (NFC) function, and/or an electronic payment function. In some embodiments, the antenna member 253 may be electrically connected to the first substrate 251 through the second substrate 252 by being electrically connected to the second substrate 252. In some embodiments, the second substrate 252 and/or the antenna member 253 may be connected to the first substrate 251 through at least a portion of the flexible board F1 connecting the driving motor 260 and the first substrate 251.

Figure 5A:
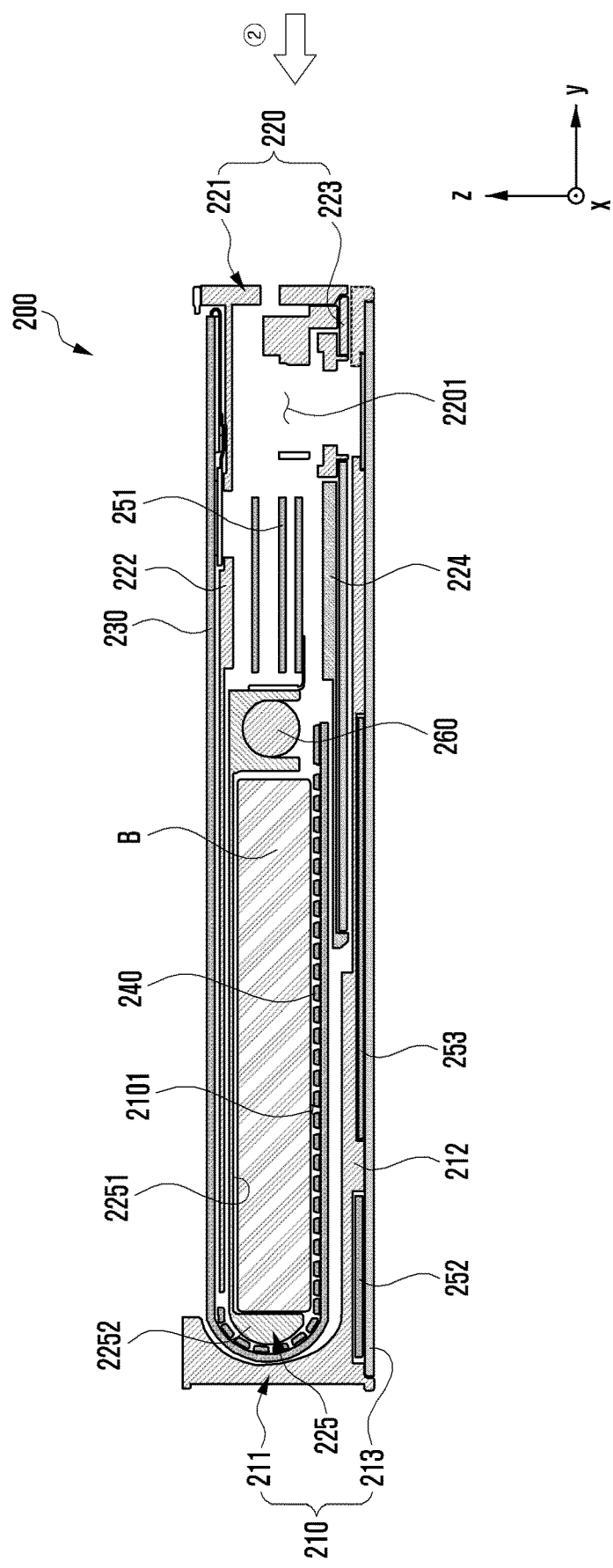
FIG. 5A is a cross-sectional view of an electronic device taken along line 5a-5a of FIG. 2A according to an embodiment of the disclosure.
Figure 5B:
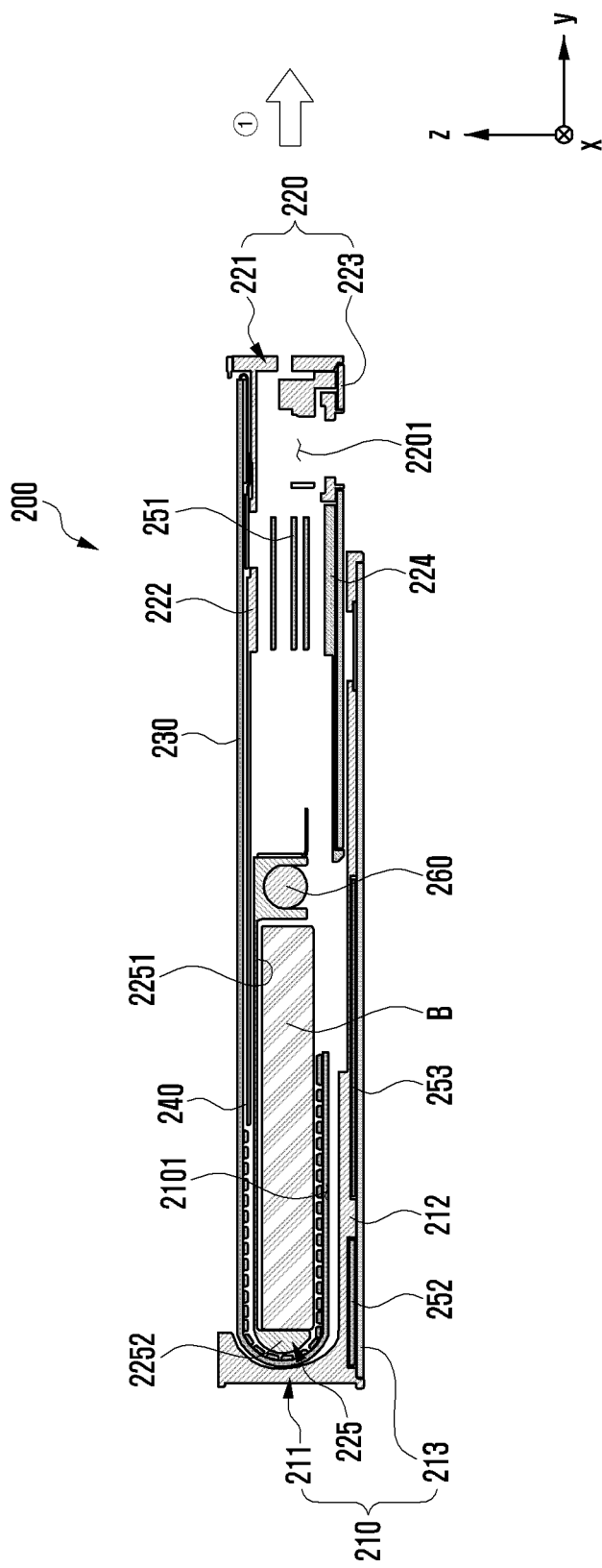
FIG. 5B is a cross-sectional view of an electronic device in an intermediate state according to an embodiment of the disclosure.
Figure 5C:
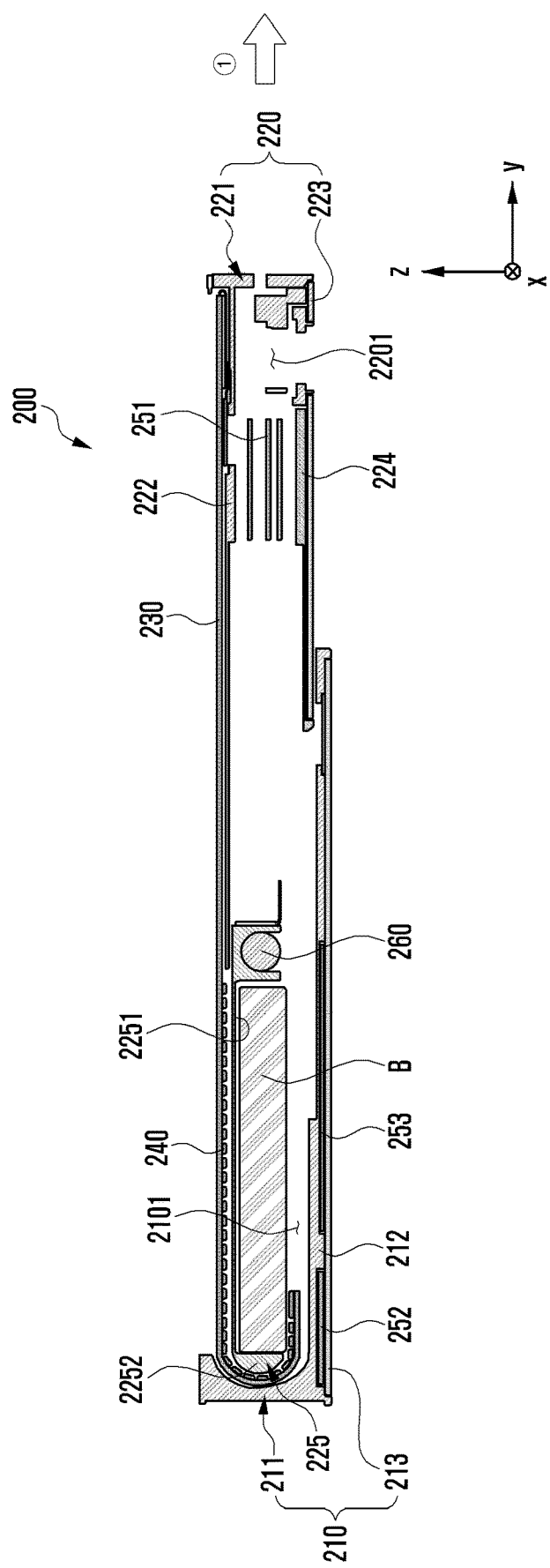
FIG. 5C is a cross-sectional view of an electronic device taken along line 5c-5c of FIG. 3A according to an embodiment of the disclosure.

FIG. 5A is a cross-sectional view of an electronic device taken along line 5a-5a of FIG. 2A according to an embodiment of the disclosure. FIG. 5B is a cross-sectional view of an electronic device in an intermediate state according to an embodiment of the disclosure. FIG. 5C is a cross-sectional view of an electronic device taken along line 5c-5c of FIG. 3A according to an embodiment of the disclosure.

In the description of the electronic device 200 of FIGS. 5A to 5C, the same reference numerals are assigned to components substantially the same as those of the electronic device 200 of FIG. 4, and detailed descriptions thereof may be omitted.

Referring to FIGS. 5A to 5C, the electronic device 200 may include a first housing 210 having a first space 2101, a second housing 220 having a second space 2201, a support member 240 connected to the second housing 220 and at least partially accommodated in the first space 2101 in a slide-in state, a flexible display 230 disposed to receive support of at least a portion of the support member 240 and at least a portion of the second housing 220, and a driving motor 260 disposed in the first space 2101 and including a pinion gear (e.g., the pinion gear 261 of FIG. 4) gear-coupled to a rack gear (e.g., the rack gear 2221 of FIG. 4) of the second space 2201. In an embodiment, the driving motor 260 may move automatically the second housing 220 relative to the first housing 210 in a slide-in direction (second direction ②) or in a slide-out direction (first direction ①) through the gear-coupling of the pinion gear (e.g., the pinion gear 261) and the rack gear (e.g., the rack gear 2221).

According to various embodiments, in the slide-in state of the electronic device 200 (the state of FIG. 5A), at least a portion of the second housing 220 may be accommodated in the first space 2101 of the first housing 210. In an embodiment, at least a portion of the flexible display 230 may be disposed to be invisible from the outside by being accommodated along with the supporting member 240 in a manner of being bent into the first space 2101. In this case, the first display area (e.g., the display area corresponding to the first portion 230a of FIG. 3A) of the flexible display 230 may be exposed to the outside.

According to various embodiments, the electronic device 200 may transition from an intermediate state (the state shown in FIG. 5B) to a slide-out state (the state shown in FIG. 5C) by controlling driving of the driving motor 260. In some embodiments, the electronic device 200 may be configured to stop in a designated intermediate state between a slide-in state and a slide-out state (free stop function). In some embodiments, the electronic device 200 may transition to a slide-in state, an intermediate state, or a slide-out state through a user's manipulation in a state in which driving force is not provided to the driving motor 260.

According to various embodiments, at least a portion of the second housing 220 may transition to a slide-out state exposed to the outside at least partially from the first housing 210 along the first direction (first direction ①) by driving the driving motor 260. In an embodiment, the part of the flexible display 230 slid into the first space 2101 may be at least partially exposed to the outside by the flexible display 230 being supported by the support bracket 225 in the slide-out state of the electronic device 200 (the state of FIG. 5C) and moving together with the support member 240. In this case, the second display area (e.g., the display area including the first portion 230a and the second portion 230b of FIG. 3A) of the flexible display 230, which is larger than the first display area, may be exposed to the outside.

According to various embodiments, the electronic device 200 may include a battery B disposed through the battery seat 2251 of the support bracket 225 fixed to the first space 2101 of the first housing 210. In an embodiment, since the battery B is disposed in the first housing 210, a separate driving gap for avoiding interference with surrounding structures according to movement may not be required. Accordingly, the battery B may help reduce sagging of the flexible display 230 and improve operational reliability by being expanded in thickness in such a way of approaching or contacting the rear surface of the support member 240 from the battery seat 2251 of the support bracket 225 so that the battery volume is relatively increased and the moving support member 240 is supported. In some embodiments, the battery B may be disposed in the second space 2201 of the second housing 220.

Figure 6A:
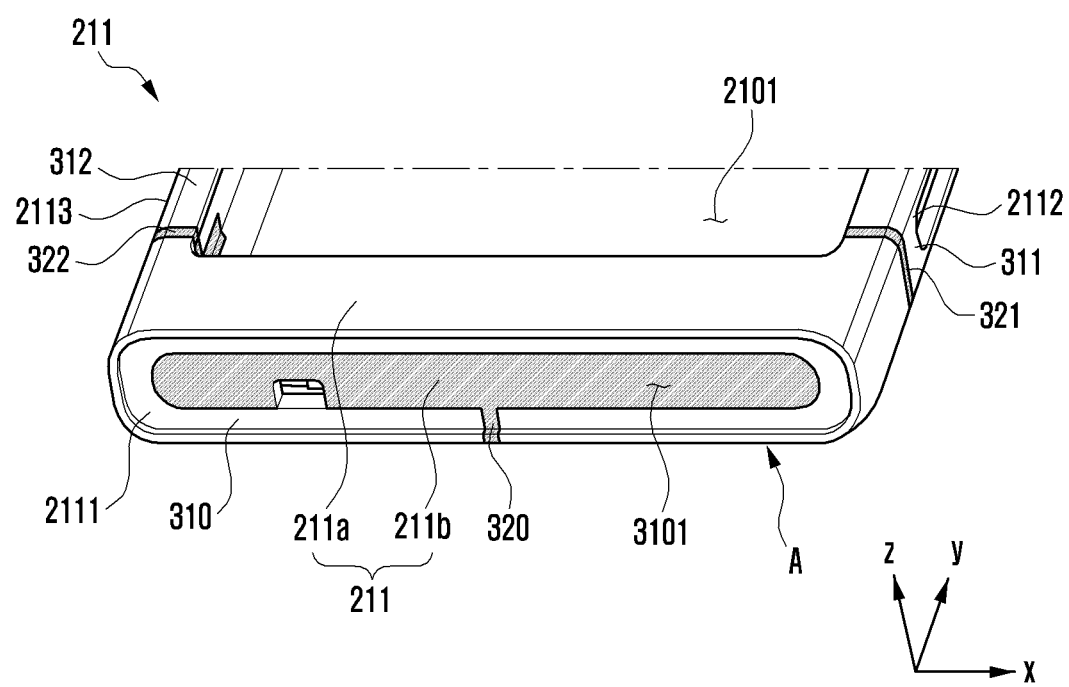
FIG. 6A is a partial perspective view of a first lateral member viewed from the front surface according to an embodiment of the disclosure.
Figure 6B:
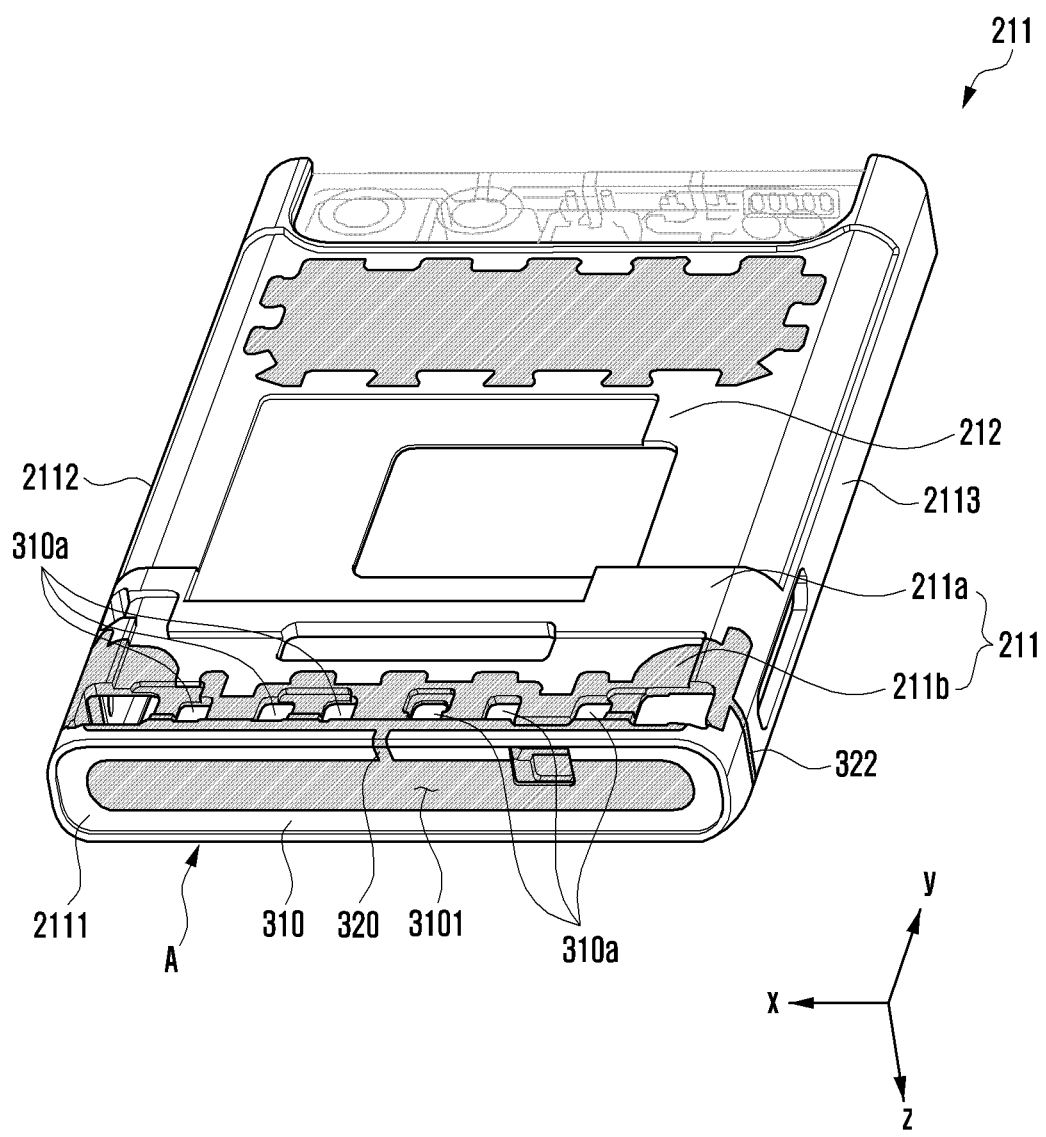
FIG. 6B is a partial perspective view of a first lateral member viewed from a rear surface according to an embodiment of the disclosure.

FIG. 6A is a partial perspective view of a first lateral member viewed from the front surface according to an embodiment of the disclosure. FIG. 6B is a partial perspective view of a first lateral member viewed from a rear surface according to an embodiment of the disclosure.

Referring to FIGS. 6A and 6B, an electronic device (e.g., the electronic device 200 of FIG. 3A) may include a first lateral member 211 disposed as at least a portion of a first housing (e.g., the first housing 210 of FIG. 3A). In an embodiment, the first lateral member 211 may include a first side surface 2111 disposed on the lower side (e.g., -y axis direction) of the electronic device 200, a second side surface 2112 extending substantially vertically from both ends of the first side surface 2111, and a third side surface 2113. In an embodiment, the first lateral member 211 may include a conductive member 211a (e.g., metal) and a non-conductive member 211b (e.g., polymer) combined with the conductive member 211a. In an embodiment, the conductive member 211a and the non-conductive member 211b may be coupled through injection or structurally coupled. In an embodiment, the conductive member 211a may form at least a portion of a side surface (e.g., first, second, and third side surfaces 2111, 2112, and 2113) of the electronic device 200 and be visible from the outside. In an embodiment, the first lateral member 211 may include the first extension member 212 extending into the inner space of the first housing 210 (e.g., the first space 2101 of FIG. 3A). In an embodiment, at least a portion of the first extension member 212 may be formed of the non-conductive member 211b.

According to various embodiments, the electronic device 200 may include the first conductive portion 310 formed through at least a portion of the first lateral member 211. In an embodiment, when the first conductive portion 310 is viewed from the outside, the first conductive portion 310 may be formed in a loop shape (e.g., a ring shape or a loop shape), and at least a portion may be segmented through the first segmentation portion 320 (e.g., non-conductive portions or polymers). In this case, an internal opening 3101 (e.g., a slot or a slit) formed by the first segmentation portion 320 and the loop-shaped first conductive portion 310 may be filled with the non-conductive member 211b. In an embodiment, the internal opening 3101 may be formed in various shapes, such as a circle, an oval, a quadrangle, or a quadrangle with both ends curved. In an embodiment, the first conductive portion 310 may be segmented from the second conductive portion 311 on the second side surface 2112 through the second segmentation portion 321. In an embodiment, the first conductive portion 310 may be segmented from the surrounding third conductive portion 312 through the third segmentation portion 322 on the third side surface 2113. In an embodiment, the second segmentation portion 321 and the third segmentation portion 322 may be filled with the non-conductive member 211b. Therefore, the first conductive portion 310 may be disposed as a unit conductive member separated from the surrounding conductive portions (e.g., the second and third conductive portions 311 and 312) through the second and third segmentation portions 321 and 322, and it may be used as at least one antenna. In an embodiment, the first conductive portion 310, the second conductive portion 311, or the third conductive portion 312 may be segmented from the conductive member 211a through the segmentation portions 320, 321, and 322.

According to various embodiments, the first lateral member 211 may be disposed on at least a portion area of the first extension member 212 and include a plurality of exposed connection pieces 310a. In an embodiment, the plurality of connection pieces 310a may be electrically separated from the surrounding conductive member 211a through the non-conductive member 211b and electrically connected to at least a portion of the first conductive portion 310. In an embodiment, the plurality of connection pieces 310a may extend from the first conductive portion 310 or may be individually disposed and electrically connected to the first conductive portion 310. In an embodiment, the plurality of connection pieces 310a may be electrically connected through the substrate (e.g., the second substrate 252 of FIG. 4) disposed to be supported through the first extension member 212 and an electrical connection member (e.g., C-clip). For example, the first conductive portion 310 may be electrically connected to a wireless communication circuit (e.g., the wireless communication module 192 of FIG. 1) disposed on a substrate (e.g., the second substrate 252 of FIG. 4) through the plurality of connection pieces 310a. In some embodiments, the wireless communication circuit 192 may be electrically connected to the second substrate 252 disposed in the first housing 210 and may be disposed on the substrate (e.g., the first substrate 251 in FIG. 4) disposed in the second housing 220.

Figure 7:
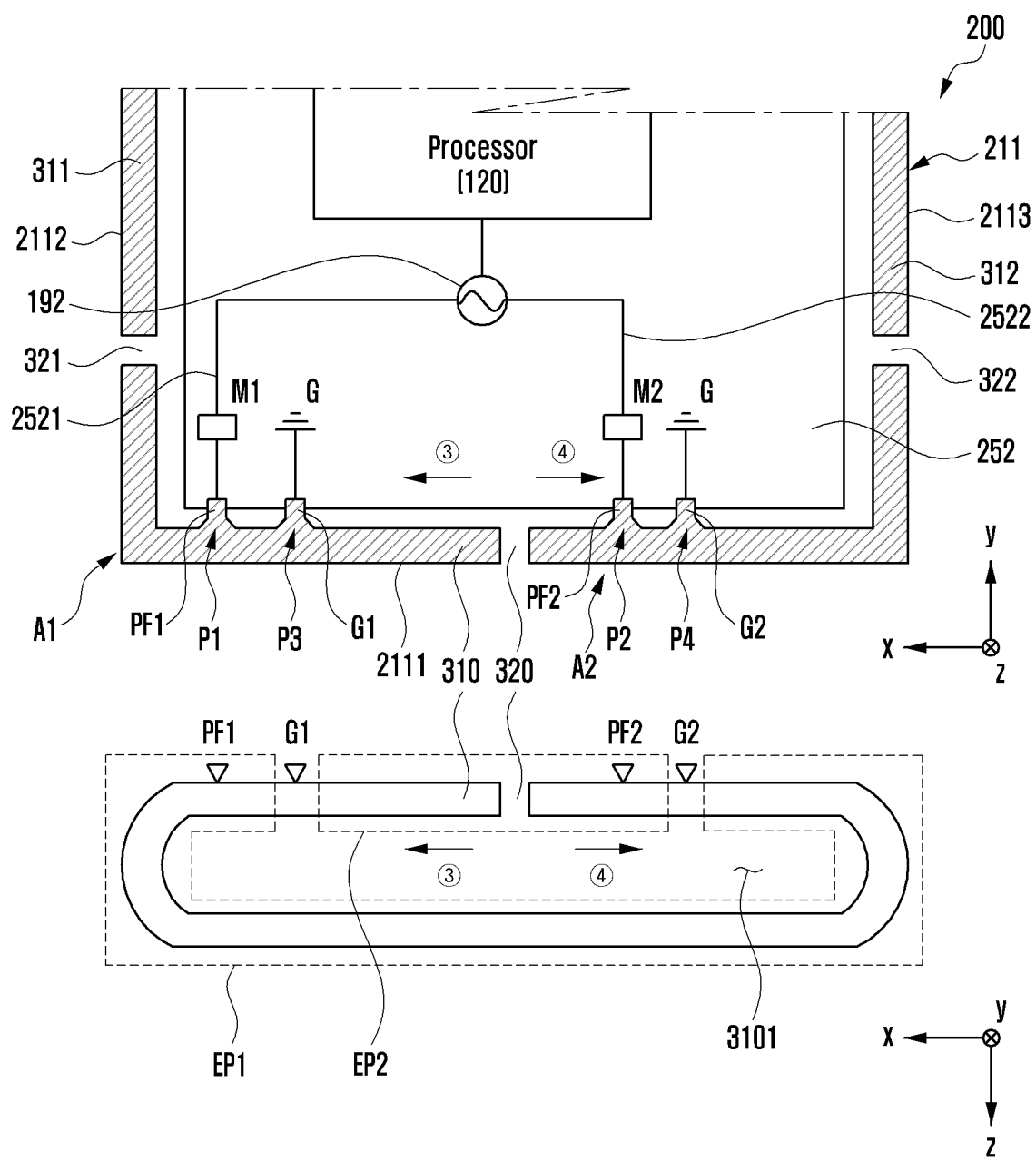
FIG. 7 is a diagram of an electronic device including an antenna disposition structure according to an embodiment of the disclosure.

FIG. 7 is a diagram of an electronic device including an antenna disposition structure according to an embodiment of the disclosure.

The first lateral member 211 of FIG. 7 may be at least partially similar to the first lateral member 211 of FIGS. 6A and 6B, or may further include other embodiments of the first lateral member 211.

Referring to FIG. 7, the electronic device 200 may include a first lateral member 211 disposed as at least a portion of the first housing (e.g., the first housing 210 of FIG. 3A). In an embodiment, the first lateral member 211 may include the first conductive portion 310 segmented into unit conductive portions by at least a portion of the conductive member (e.g., the conductive member 211a of FIG. 6A) being segmented through at least one segmentation portion (e.g., the second segmentation portion 321 and the third segmentation portion 322). In an embodiment, the first conductive portion 310 may be formed in a loop shape in which a portion of the first conductive portion 310 is open through the first segmentation portion 320 on the first side surface 2111. In an embodiment, the first conductive portion 310 may maintain a state electrically disconnected from surrounding conductive portions (e.g., the second conductive portion 311 and the third conductive portion 312) through a second segmentation portion 321 disposed on a portion of the second side surface 2112 and a third segmentation portion 322 disposed on a portion of the third side surface 2113. In an embodiment, the first segmentation portion 320 may be disposed in a symmetrical position on the left and right sides or may be formed in an asymmetrical position skewed to one side.

According to various embodiments, the electronic device 200 may include a substrate (e.g., the second substrate 252) disposed in the first housing 210 and including a ground G, and a wireless communication circuit 192 disposed on the substrate 252. In an embodiment, the first conductive portion 310 can be electrically connected, at least in part, to the substrate 252 at at least one location. For example, the first conductive portion 310 may be electrically connected to the wireless communication circuitry 192 at at least one location. In an embodiment, the first conductive portion 310 may be electrically connected to the ground G of the substrate 252 at at least one location. In an embodiment, the wireless communication circuit 192 may be electrically connected to the processor 120 (e.g., the communication processor (CP)) disposed on the substrate 252.

According to various embodiments, the first conductive portion 310 may include a first power feed unit PF1 electrically connected to the wireless communication circuit 192 at a first point P1 between the second side surface 2112 and the first segmentation portion 320 in one direction of the first segmentation portion 320 (e.g., third direction ③). In an embodiment, the first power feed unit PF1 may be electrically connected to the wireless communication circuit 192 through a first electrical path 2521 (e.g., an electrical wire) disposed on the substrate 252. In an embodiment, the electronic device 200 may include a matching circuit M1 (e.g., a capacitor and/or an inductor) disposed in the first electrical path 2521. In an embodiment, the first conductive portion 310 may include a second power feed unit PF2 electrically connected to the wireless communication circuit 192 at a second point P2 between the third side surface 2113 and the first segmentation portion 320 in the other direction of the first segmentation portion 320 (e.g., fourth direction ④). In an embodiment, the second power feed unit PF2 may be electrically connected to the wireless communication circuit 192 through a second electrical path 2522 (e.g., an electrical wire) disposed on the substrate 252. In an embodiment, the electronic device 200 may include a matching circuit M2 (e.g., a capacitor and/or an inductor) disposed in the second electrical path 2522. In an embodiment, the first conductive portion 310 may include a first ground part G1 electrically connected to the ground G of the substrate 252 at a third point P3 between the first segmentation portion 320 and the first point P1 in the direction of the second side surface 2112 (e.g., third direction ③). In an embodiment, the first conductive portion 310 may include a second ground part G2 electrically connected to the ground G of the substrate 252 at a fourth point P4 between the second point P2 and the third side surface 2113 in the direction of the third side surface 2113 (e.g., fourth direction ④). In an embodiment, the fourth point P4 may be disposed closer to the second point P2 than to the first point P1. In an embodiment, the first power feed unit PF1, the second power feed unit PF2, the first ground part G1 and/or the second ground part G2 may be the position of the plurality of connection pieces 310a extended from the first conductive portion 310 of FIG. 6A. In an embodiment, the first power feed unit PF1, the second power feed unit PF2, the first ground part G1 and/or the second ground part G2 may be disposed collinearly in the loop-shaped first conductive portion 310.

According to various embodiments, the electronic device 200 may include a pair of antennas A1 and A2 including at least a portion of the first conductive portion 310. In an embodiment, the pair of antennas A1 and A2 may include a first antenna A1 in which power is fed through the first power feed unit PF1 and which has a first electrical length EP1 from the first ground part G1 to the second ground part G2, not through the first segmentation portion 320, and a second antenna A2 in which power is fed through the second power feed unit PF2 and which has a second electrical length EP2 from the second ground part G2 to the first ground part G1, through the first segmentation portion 320. In an embodiment, the first electrical length EP1 may be configured to be longer than the second electrical length EP2. Accordingly, the first antenna A1 operating through the first power feed unit PF1 may operate in the first frequency band (e.g., low band), and the second antenna A2 operating through the second power feed unit PF2 may operate in a second frequency band (e.g., mid band and/or high band) higher than the first frequency band.

The antennas A1 and A2 configured through the loop-shaped first conductive portion 310 according to various embodiments of the disclosure may not share the first segmentation portion 320 even if they operate simultaneously by having the electrical length in opposite directions (e.g., third direction ③ and fourth direction ④)) that goes away from the first segmentation portion 320 each other with respect to the first segmentation portion 320. The disposition structure of the power feed units PF1 and PF2 and the ground parts G1 and G2 may help increase isolation of the two antennas A1 and A2.

Figure 8A:
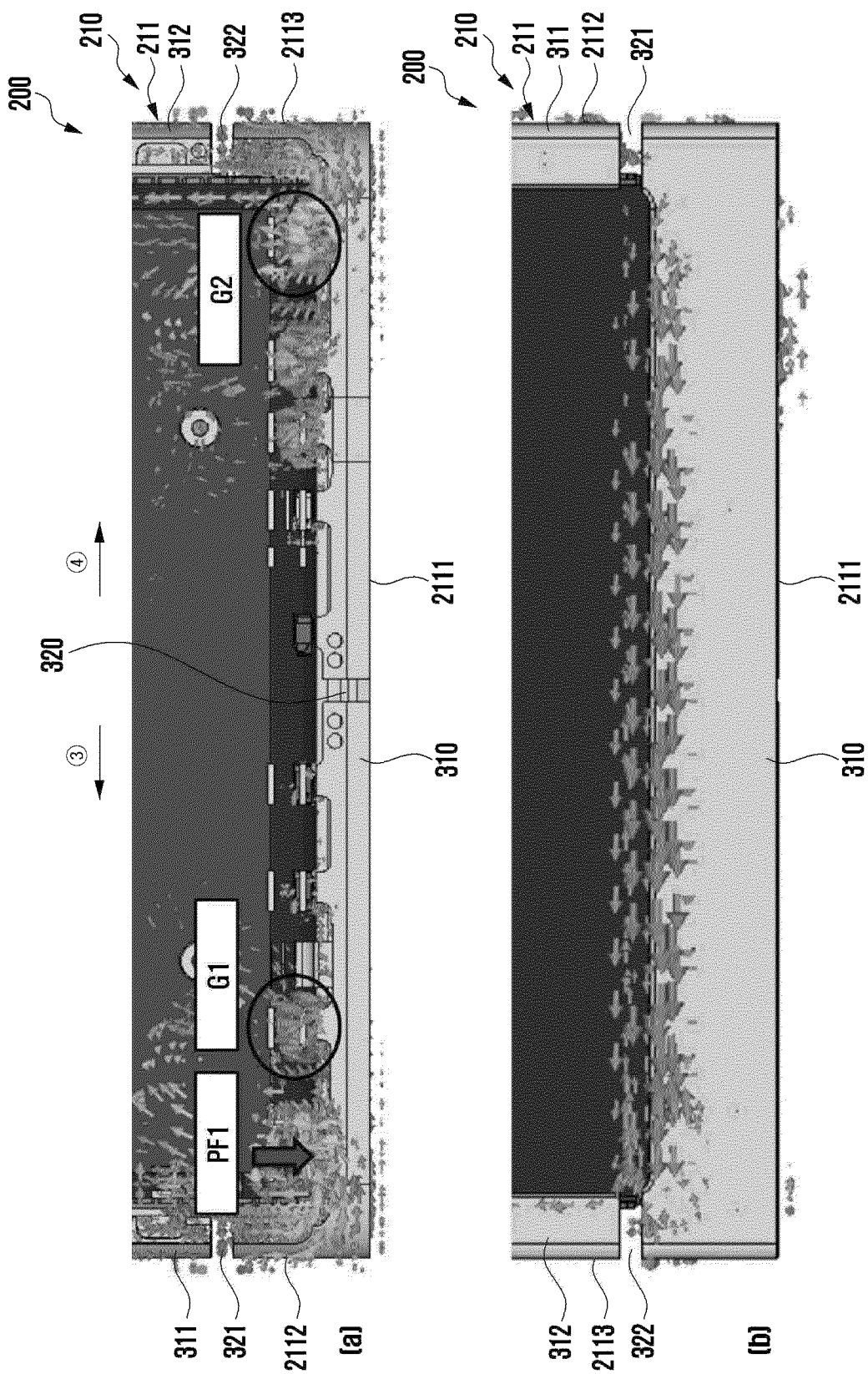
FIG. 8A is a diagram illustrating a current distribution of a first lateral member when the first antenna of FIG. 7 is operated according to an embodiment of the disclosure.

FIG. 8A is a diagram illustrating a current distribution of a first lateral member when the first antenna of FIG. 7 is operated according to an embodiment of the disclosure. A part (a) of the FIG. 8A is diagrams illustrating rear surface the first housing 210 of the electronic device 200. A part (b) of the FIG. 8A is diagrams illustrating frond surface the first housing 210 of the electronic device 200. It may be identified that, in the first conductive portion 310, a high current density is distributed from the first ground part G1 to the second ground part G2 through a portion of the front surface of the first lateral member 211 without passing through the first segmentation portion 320 based on the first power feed unit PF1.

Figure 8B:
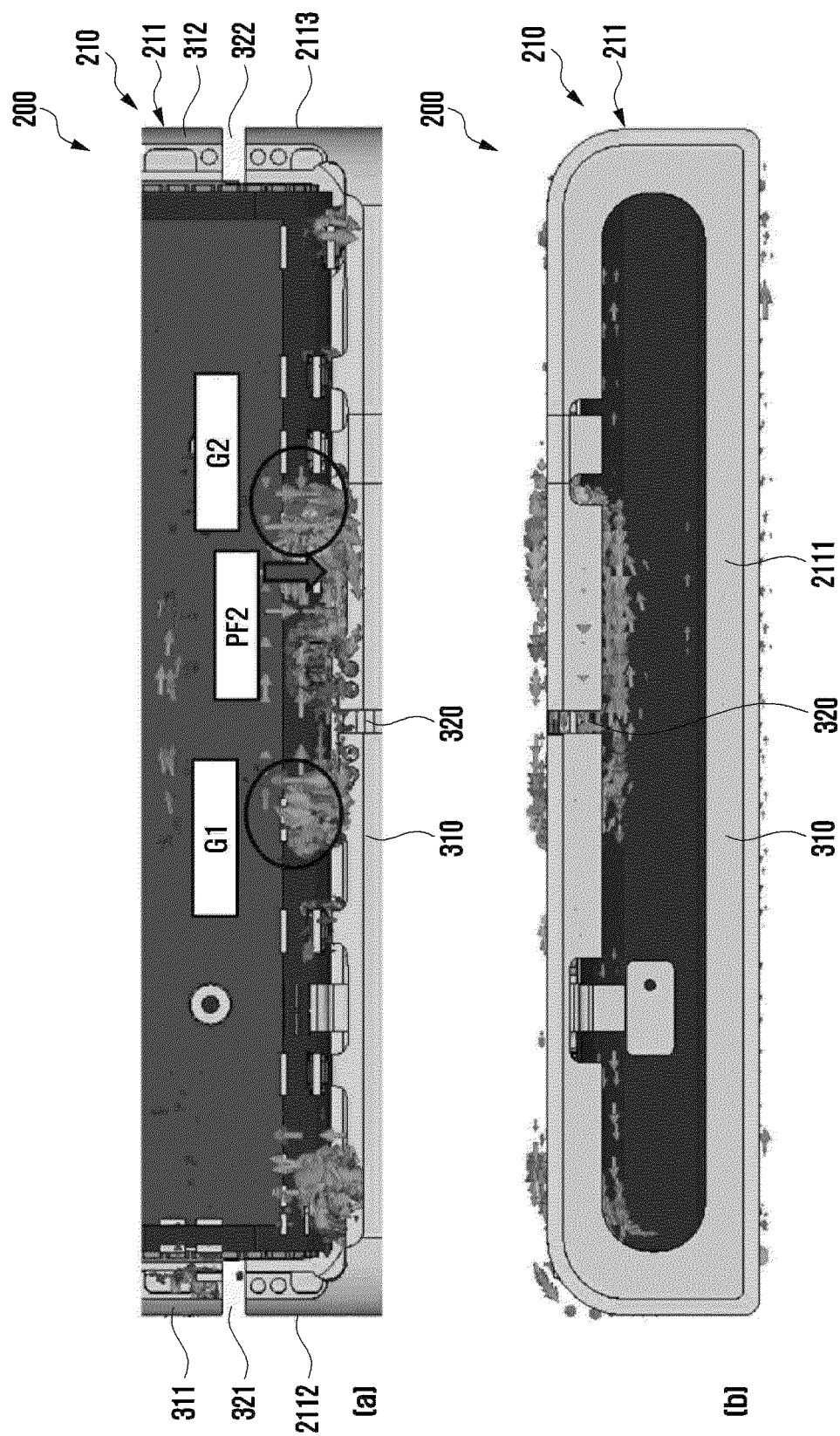
FIG. 8B is a diagram illustrating current distribution of the first lateral member when the second antenna of FIG. 7 is operated according to an embodiment of the disclosure.

FIG. 8B is a diagram illustrating current distribution of the first lateral member when the second antenna of FIG. 7 is operated according to an embodiment of the disclosure. A part (a) of the FIG. 8B is diagrams illustrating rear surface the first housing 210 of the electronic device 200. A part (b) of the FIG. 8B is diagrams illustrating the first side surface 2111 of the first housing 210 of the electronic device 200. It may be identified that, in the first conductive portion 310, a high current density is distributed between the first ground part G1 and the second ground part G2 through the first segmentation portion 320 based on the second power feed unit PF2.

This may mean that isolation between the two antennas A1 and A2 is increased because of mutual interference by forming current densities at positions that do not overlap with each other even when the two antennas A1 and A2 operate simultaneously.

Figure 8C:
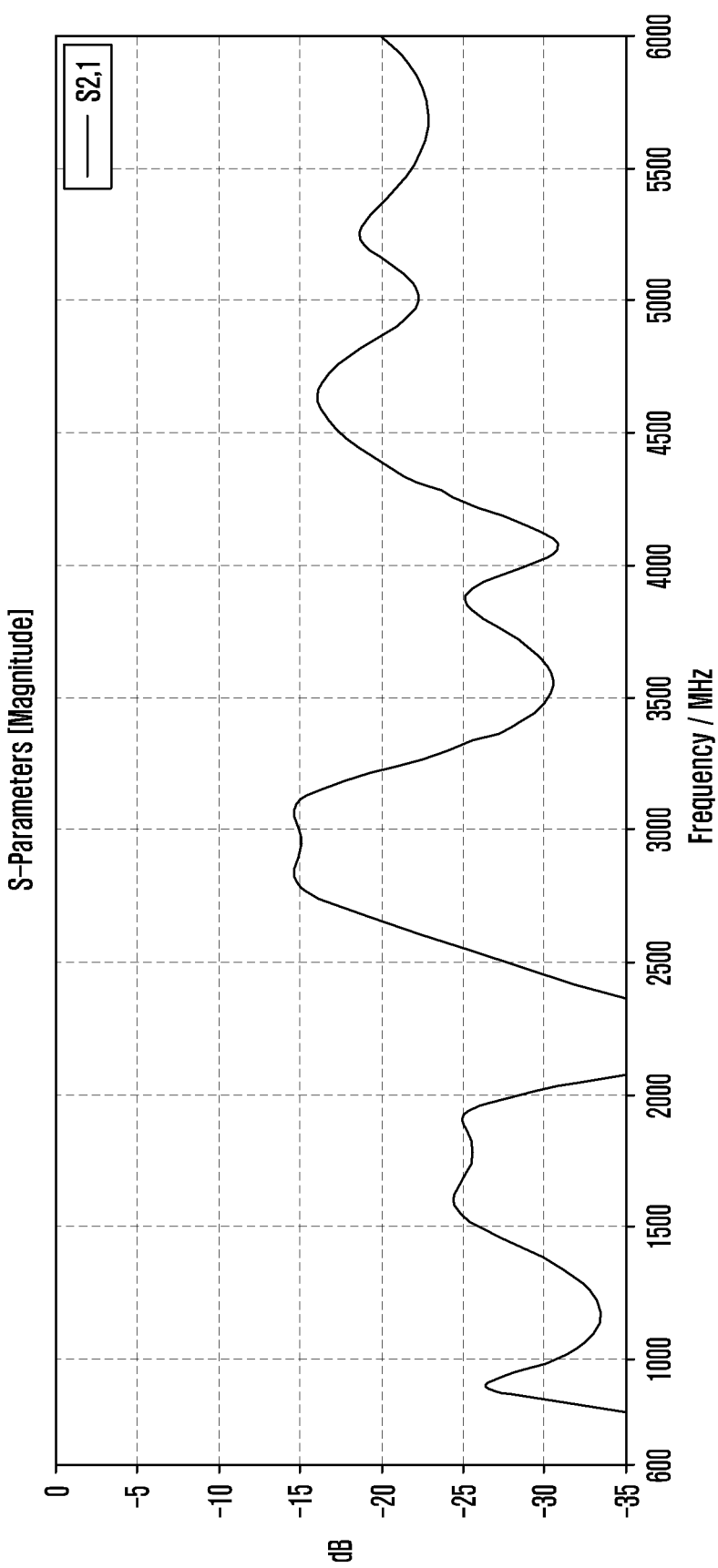
FIG. 8C is a graph illustrating an isolation degree when the first and second antennas of FIG. 7 are operated according to an embodiment of the disclosure.

FIG. 8C is a graph illustrating an isolation degree when the first and second antennas of FIG. 7 are operated according to an embodiment of the disclosure. It may be identified that excellent isolation of −15 dB or less is expressed in low band, mid band, and high band when the first and second antennas A1 and A2 of FIG. 7 are operated.

Figure 8D:
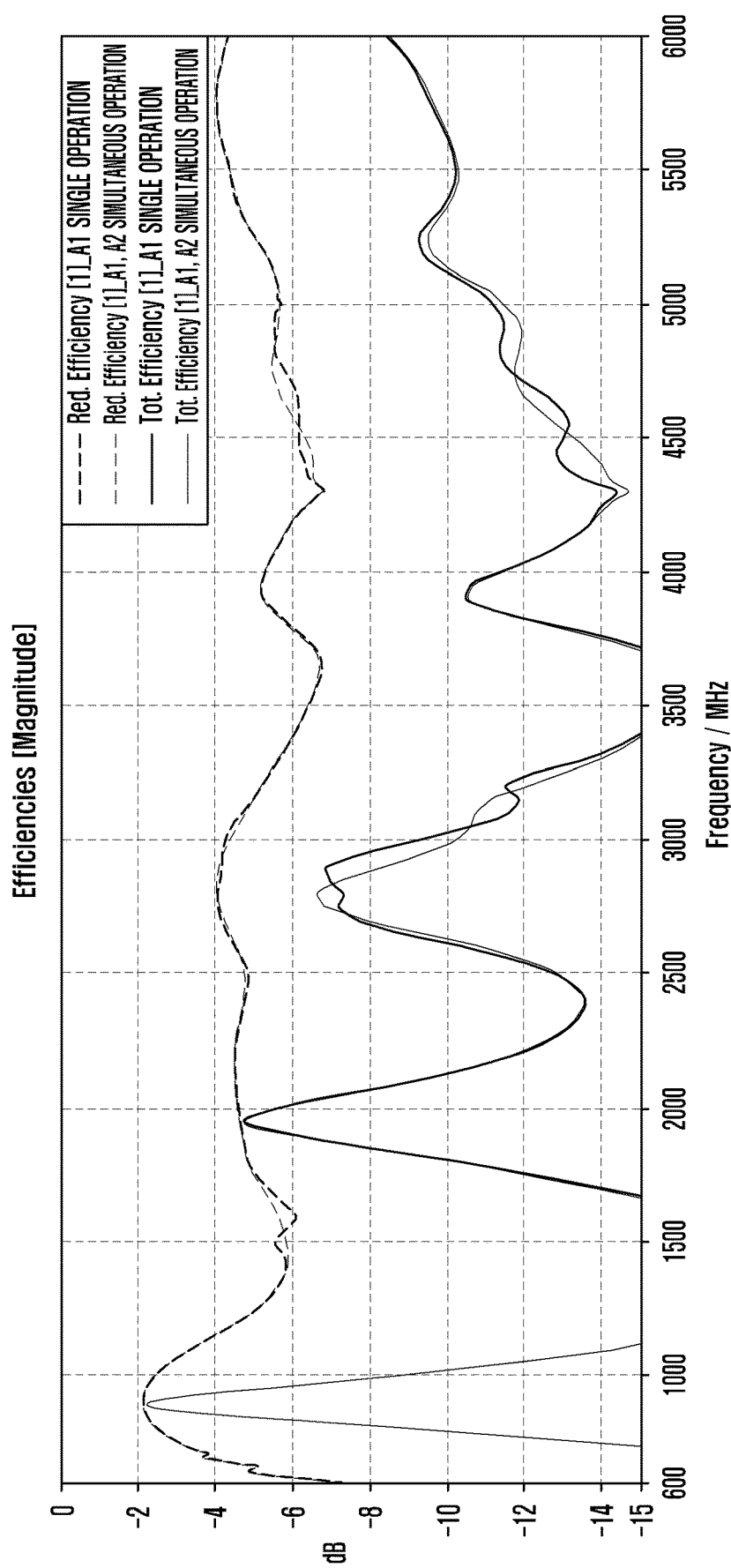
FIG. 8D is a graph comparing the performance of a single operation of the first antenna of FIG. 7 and a simultaneous operation of the first and second antennas according to an embodiment of the disclosure.

FIG. 8D is a graph comparing the performance of a single operation of the first antenna of FIG. 7 and a simultaneous operation of the first and second antennas according to an embodiment of the disclosure. It may be identified that the radiation efficiency when the first antenna A1 operates alone and the radiation efficiency when the first antenna A1 and the second antenna A2 operate at the same time are substantially the same. This may mean that even if the first antenna A1 and the second antenna A2 operate simultaneously, interference by the counterpart antenna is reduced and isolation is increased.

Figure 8E:
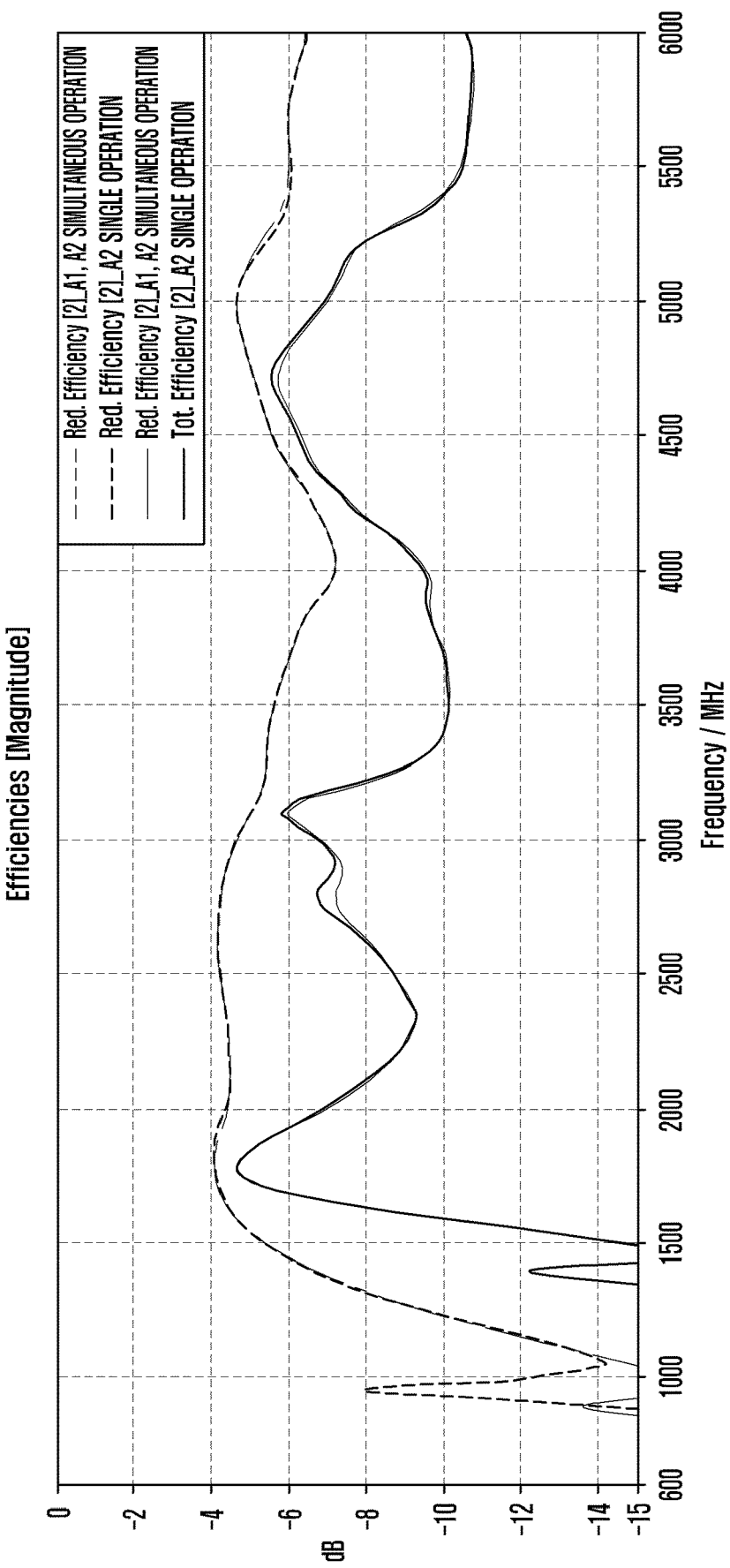
FIG. 8E is a graph comparing performances of a single operation of the second antenna of FIG. 7 and a simultaneous operation of the first and second antennas according to an embodiment of the disclosure.

FIG. 8E is a graph comparing performances of a single operation of the second antenna of FIG. 7 and a simultaneous operation of the first and second antennas according to an embodiment of the disclosure. It may be identified that the radiation efficiency when the second antenna A2 operates alone and the radiation efficiency when the first antenna A1 and the second antenna A2 operate at the same time are substantially the same. This may mean that even if the first antenna A1 and the second antenna A2 operate simultaneously, interference by the counterpart antenna is reduced and isolation is increased.

Figure 9:
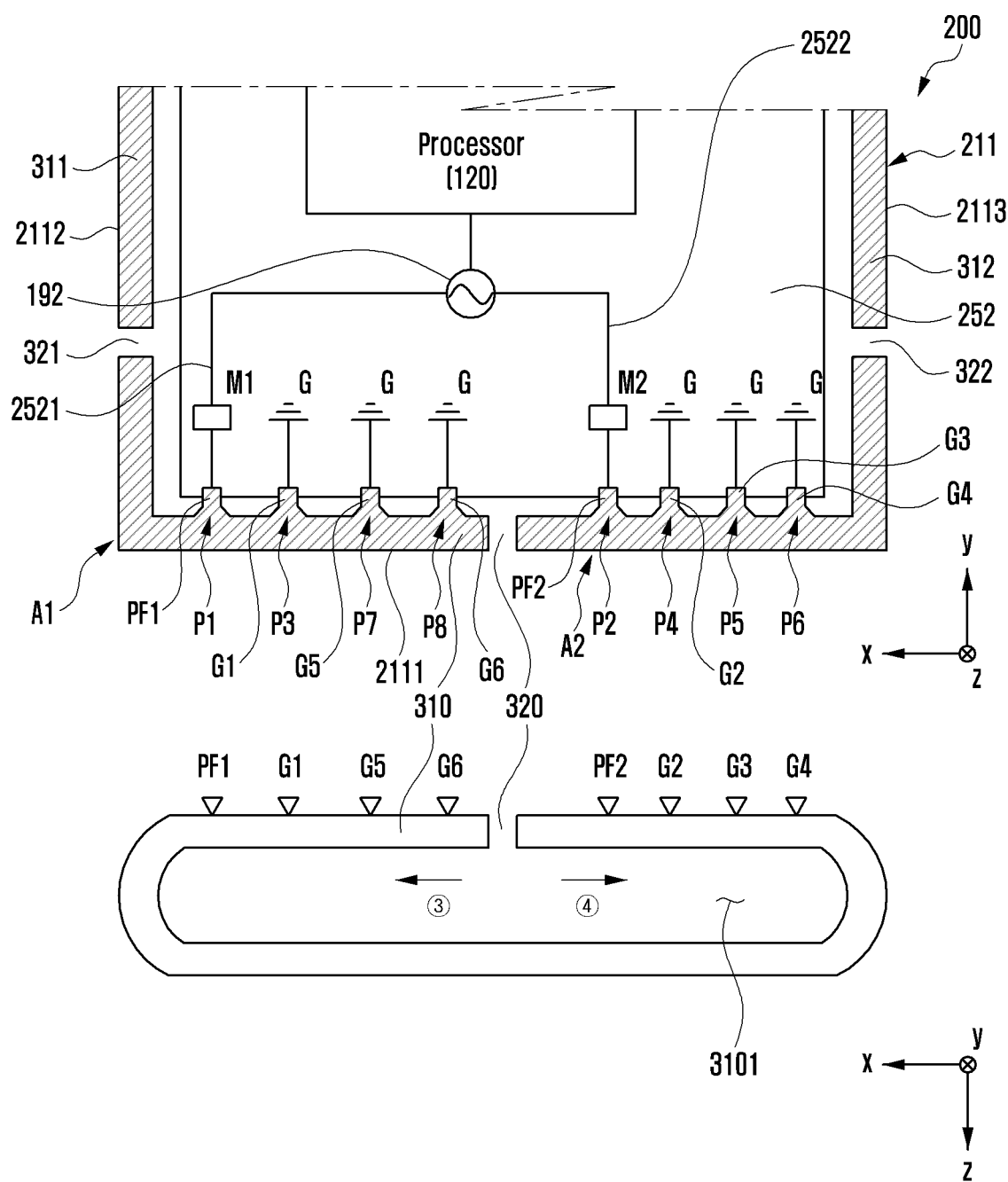
FIG. 9 is a configuration diagram of an electronic device including an additional ground part according to an embodiment of the disclosure.

FIG. 9 is a configuration diagram of an electronic device including an additional ground part according to an embodiment of the disclosure.

In describing the electronic device of FIG. 9, the same reference numerals are assigned to components substantially the same as those of the electronic device of FIG. 7, and detailed descriptions thereof may be omitted.

Referring to FIG. 9, the electronic device 200 may include a loop-shaped first conductive portion 310 disposed on a first side surface 2111 and segmented through a first segmentation portion 320. In an embodiment, the first conductive portion 310 may be segmented from the surrounding conductive portions (e.g., the second conductive portion 311 and/or the third conductive portion 312) through the second segmentation portion 321 disposed on the second side surface 2112 and the third segmentation portion 322 disposed on the third side surface 2113.

According to various embodiments, the first conductive portion 310 may include a third ground part G3 disposed on the fifth point P5 between the second ground part G2 and the third side surface 2113 in the third side surface 2113 direction (e.g., fourth direction ④) and electrically connected to the ground G of the substrate 252, and a fourth ground part G4 disposed on the sixth point P6 between the third ground part G3 and the third side surface 2113 and electrically connected to the ground G of the substrate 252. In an embodiment, the third ground part G3 or the fourth ground part G4 may be provided to increase the degree of isolation by reducing the phenomenon in which the first antenna A1 is interfered by the second power feed unit PF2. In some embodiments, the third ground part G3 or the fourth ground part G4 may be omitted. In some embodiments, the first conductive portion 310 may include further at least one additional ground part disposed between the fourth ground part G4 and the first power feed unit PF1 in a third side surface direction (e.g., fourth direction ④) from the fourth ground part G4.

According to various embodiments, the first conductive portion 310 may include a fifth ground part G5 disposed on the seventh point P7 between the first ground part G1 and the first segmentation portion 320 in the second side surface 2112 direction (e.g., third direction ③) and electrically connected to the ground G of the substrate 252, and a sixth ground part G6 electrically connected to the ground G of the substrate 252 in the eighth point P8 between the fifth ground part G5 and the first segmentation portion 320. In an embodiment, the fifth ground part G5 or the sixth ground part G6 may be provided to increase the degree of isolation by reducing the phenomenon in which the second antenna A2 is interfered by the second power feed unit PF2. In some embodiments, the fifth ground part G5 or the sixth ground part G6 may be omitted. In some embodiments, the first conductive portion 310 may include further at least one additional ground part disposed between the sixth ground part G6 and the first segmentation portion 320.

Figure 10:
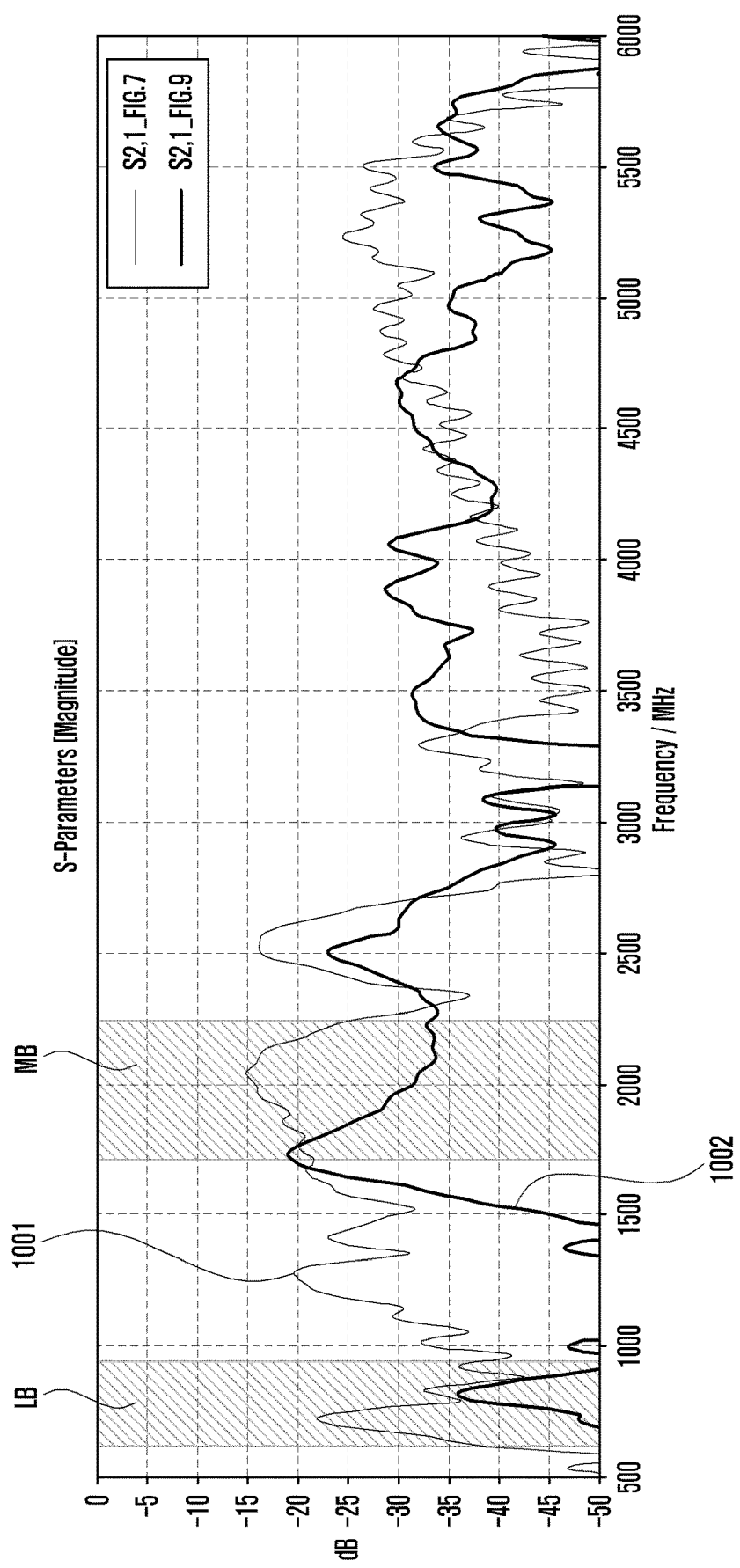
FIG. 10 is a graph comparing radiation performance according to the presence or absence of an additional ground part according to an embodiment of the disclosure.

FIG. 10 is a graph comparing radiation performance according to the presence or absence of an additional ground part according to an embodiment of the disclosure.

Referring to FIG. 10, it may be identified that excellent isolation of −15 dB or less is expressed in all of low band (LB) and mid band (MB) in the case that each of the ground parts G1 and G2 is included for the first antenna A1 and the second antenna A2 of FIG. 7 (graph 1001), and the third and fourth ground parts G3 and G4 are added for the first antenna A1 and the fifth and sixth ground parts G5 and G6 are added for the second antenna A2 (graph 1002).

According to various embodiments, it may be identified that, when the third and fourth ground parts G3 and G4 and the fifth and sixth ground parts G5 and G6 are added, isolation between the first antenna A1 and the second antenna A2 (graph 1002) is increased more than the isolation (graph 1001) of the first and second antennas A1 and A2 having one of each ground part G1 and G2 for the first and second antennas A1 and A2. This may mean that the added ground parts G3, G4, G5, and G6 can help increase isolation of the first and second antennas A1 and A2.

Figure 11A:
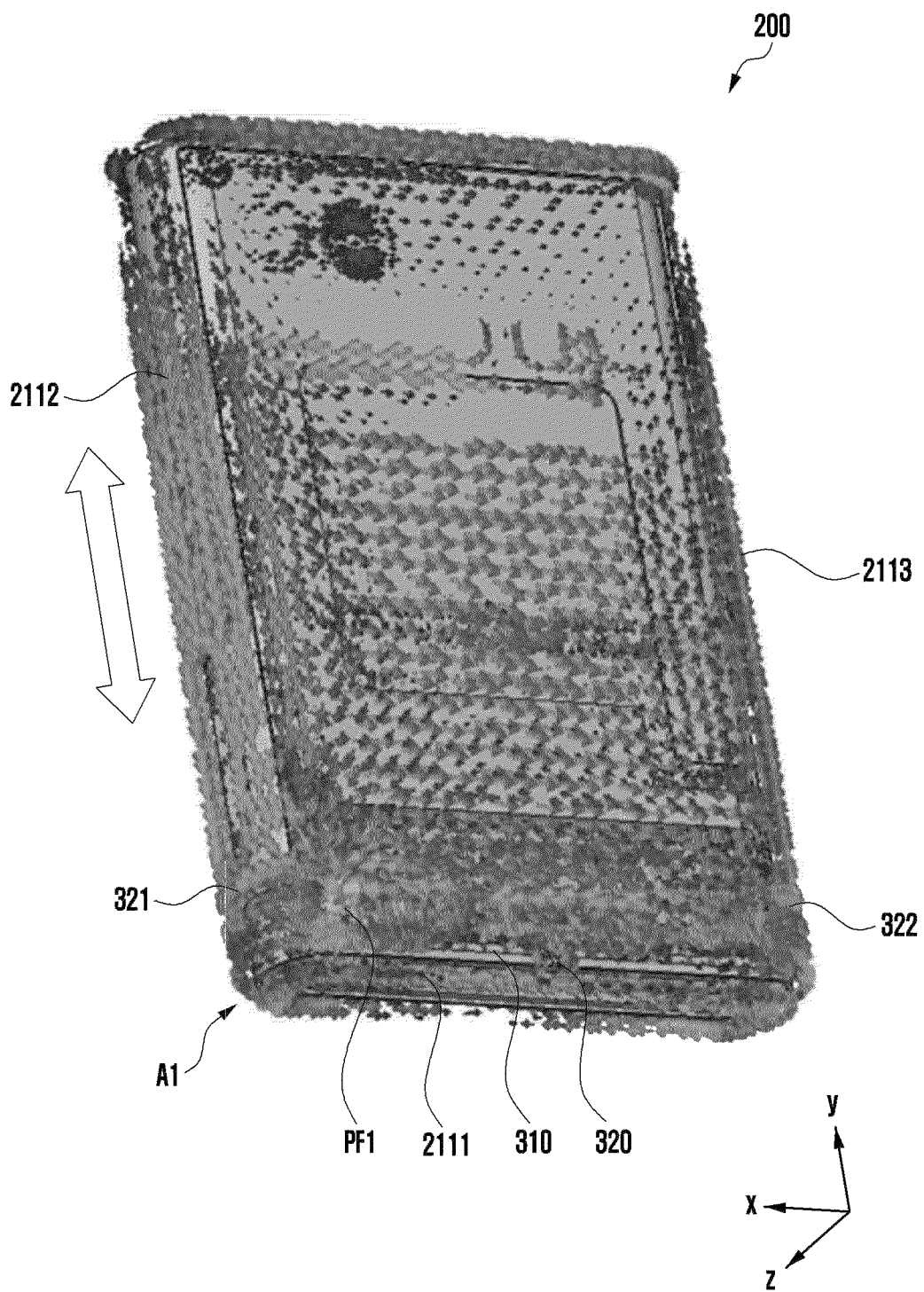
FIG. 11A is a diagram illustrating current distribution according to the operation of the first antenna of FIG. 7 according to an embodiment of the disclosure.

FIG. 11A is a diagram illustrating current distribution according to the operation of the first antenna of FIG. 7 according to an embodiments of the disclosure. The first antenna A1 fed with power through the first power feed unit PF1 operates through a portion of the first conductive portion 310 and a portion of the second side surface 2112 having a length in the y-axis direction, the direction of the surface current applied to the electronic device 200 may be substantially parallel to the y-axis direction.

Figure 11B:
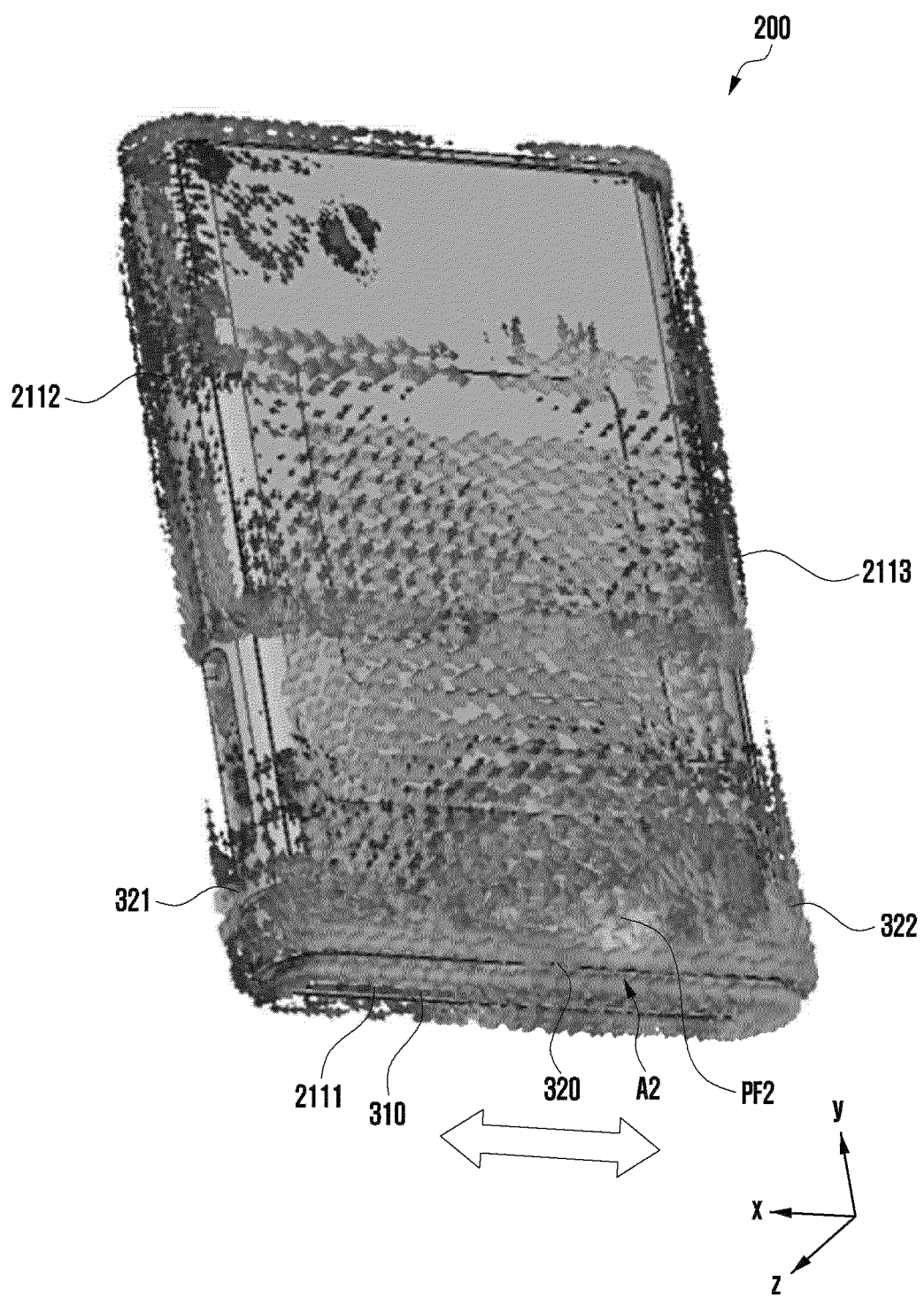
FIG. 11B is a diagram illustrating current distribution according to the operation of the second antenna of FIG. 7 according to an embodiment of the disclosure.

FIG. 11B is a diagram illustrating current distribution according to the operation of the second antenna of FIG. 7 according to an embodiment of the disclosure. In the second antenna A2 fed with power through the second power feed unit PF2, the electrical length is determined as a part corresponding to the first side surface 2111 of the first conductive portion 310 by the first ground part G1 and the second ground part G2, and only the first segmentation portion 320 operates through coupling, the surface current applied to the electronic device 200 may be substantially parallel to the x-axis direction.

This may mean that even when the first antenna A1 and the second antenna A2 are simultaneously operated, surface currents are induced in different directions and isolation is increased.

Figure 12:
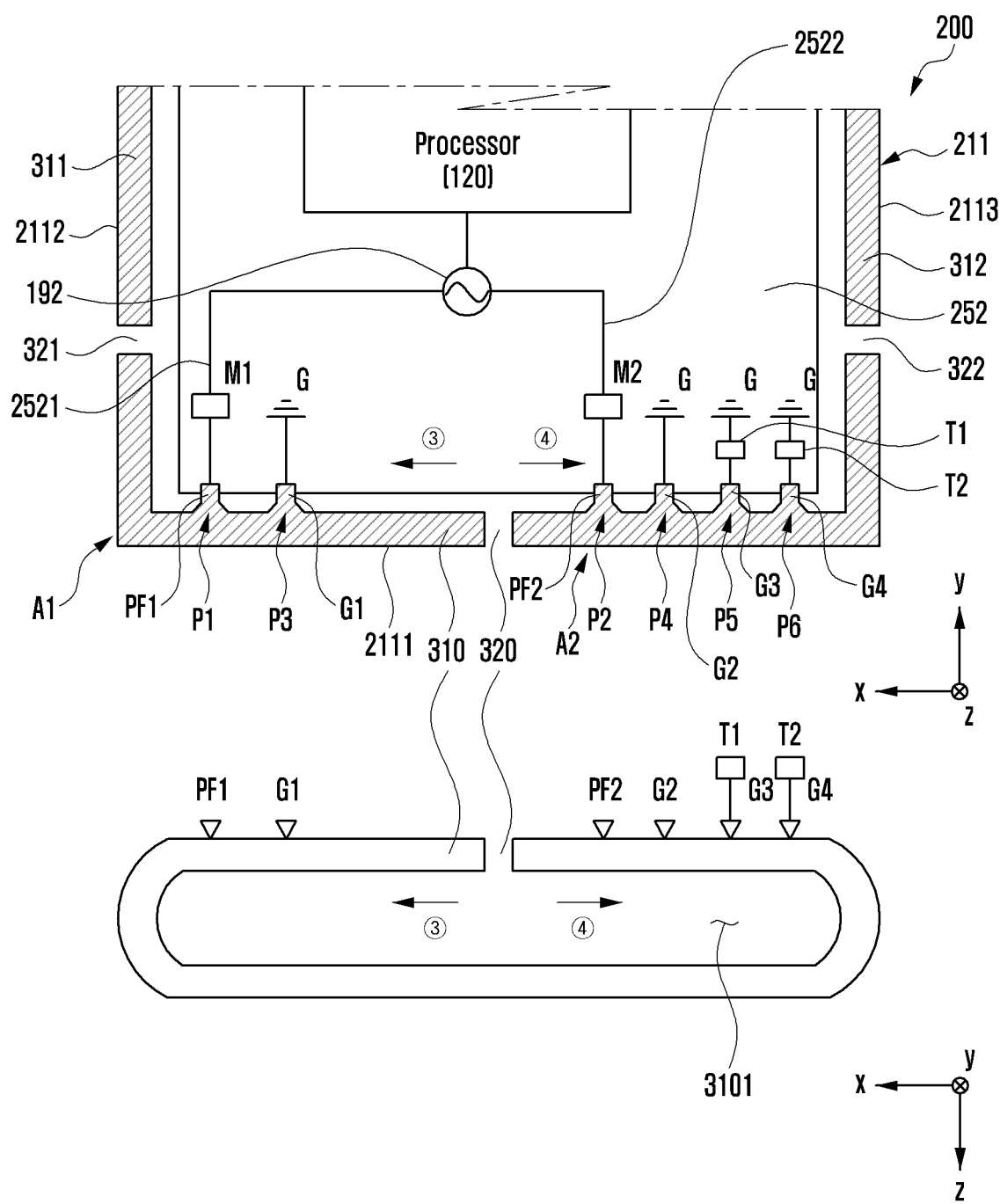
FIG. 12 is a diagram of an electronic device including an antenna disposition structure according to an embodiment of the disclosure.

FIG. 12 is a diagram of an electronic device including an antenna disposition structure according to an embodiment of the disclosure.

In describing the electronic device 200 of FIG. 12, the same reference numerals are assigned to components substantially the same as those of the electronic device 200 of FIG. 7, and detailed descriptions thereof may be omitted.

Referring to FIG. 12, the first conductive portion 310 may include, in the third side surface 2113 direction (e.g., fourth direction ④), a third ground part G3 disposed at the fifth point P5 between the second ground part G2 and the third side surface 2113 and electrically connected to the ground G of the substrate 252, and a fourth ground part G4 disposed at the sixth point P6 between the third ground part G3 and the third side surface 2113 and electrically connected to the ground G of the substrate 252. In an embodiment, the electronic device 200 may include a first variable circuit T1 (tunable IC or switching device) disposed in an electrical path connecting the ground G of the substrate 252 and the third ground part G3, and/or a second variable circuit T2 (tunable IC or switching device) disposed in an electrical path connecting the ground G of the substrate 252 and the fourth ground part G4. In an embodiment, the first variable circuit T1 and/or the second variable circuit T2, for example, may include a switching device and a plurality of passive elements (e.g., capacitor or inductor) switched to either one through the switching device. In some embodiments, the first variable circuit T1 and/or the second variable circuit T2 may include only a switching device selectively connecting the third ground part G3 and/or the fourth ground part G4 to the ground G of the substrate 252. In an embodiment, the first variable circuit T1 or the second variable circuit T2 may be disposed under the control of the processor 120 and may be electrically connected to one of each ground parts G3 and G4 in various ways according to state information of the electronic device 200. For example, the processor 120 may electrically connect (short) or disconnect (open) the third ground part G3 to the ground G of the substrate 252 through the first variable circuit T1. In an embodiment, the processor 120 may electrically connect (short) or disconnect (open) the fourth ground part G4 to the ground G of the substrate 252 through the second variable circuit T2. In an embodiment, the processor 120 may also connect the passive element having a designated value to the third ground part G3 and/or the fourth ground part G4 through the control of the first variable circuit T1 and/or the second variable circuit T2. In an embodiment, the operating frequency band of the first antenna A1 may be shifted through the first variable circuit T1 and/or the second variable circuit T2 under the control of the processor 120.

Figure 13:
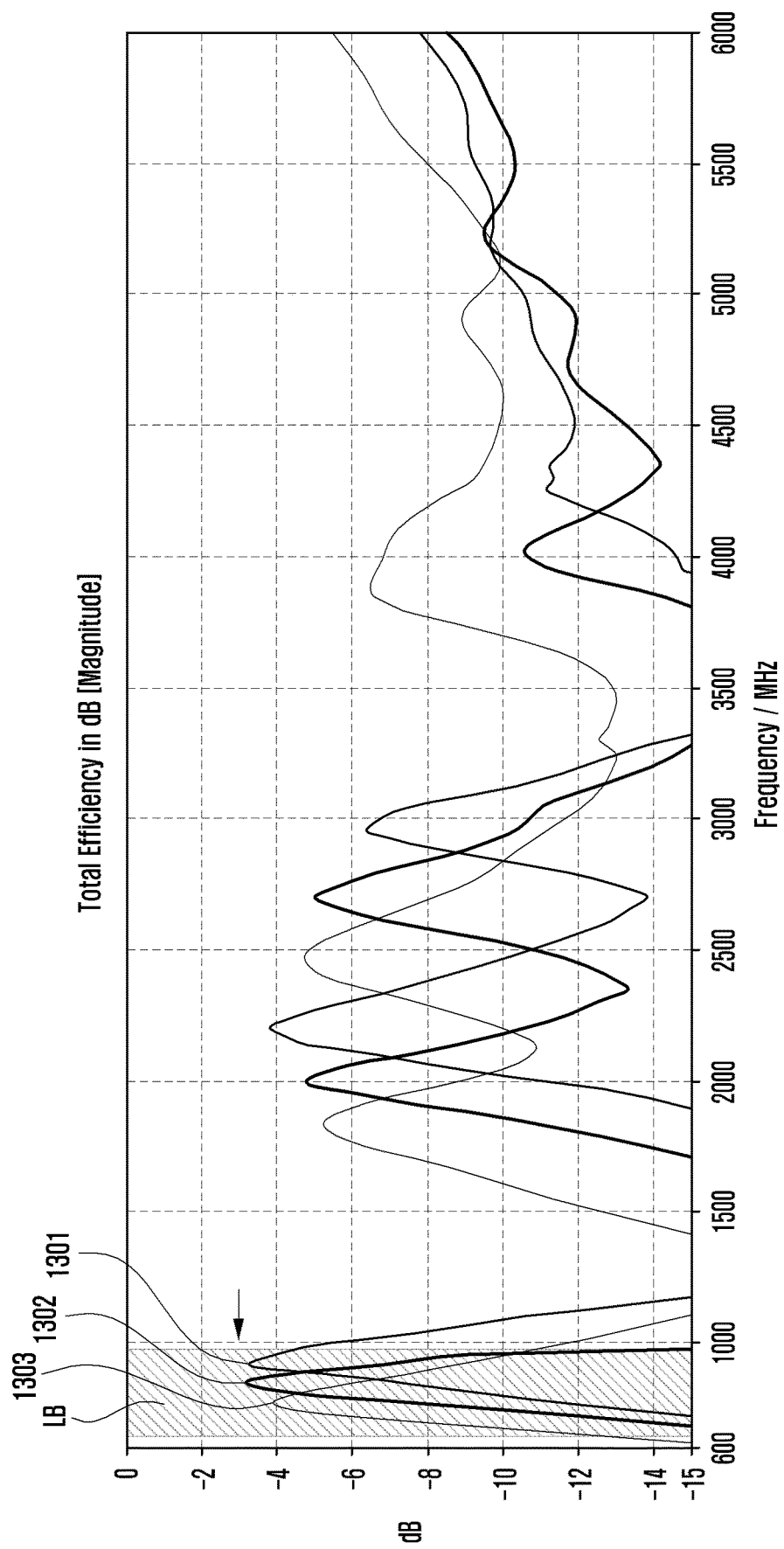
FIG. 13 is a graph illustrating a change in frequency band of the first antenna of FIG. 12 by configuring variable circuits according to an embodiment of the disclosure.

FIG. 13 is a graph illustrating a change in frequency band of the first antenna of FIG. 12 by configuring variable circuits according to an embodiment of the disclosure.

Referring to FIG. 13, the first antenna A1 may be operated in the first frequency band (graph 1301) of a low band (LB) when the fourth ground part G4 is electrically connected to the ground G of the substrate 252 through the second variable circuit T2. In an embodiment, the first antenna A1 may be operated in the second frequency band (graph 1302) lower than the first frequency band of the low band when the fourth ground part G4 is electrically disconnected from the ground G of the substrate 252 through the second variable circuit T2, and the third ground part G3 is connected to the ground G of the substrate 252 through the first variable circuit T1. In an embodiment, the first antenna A1 may be operated in the third frequency band (graph 1303) lower than the second frequency band of the low band when the third ground part G3 and the fourth ground part G4 are electrically disconnected from the substrate 252 through the first variable circuit T1 and the second variable circuit T2. This may mean that the operating frequency band of the first antenna A1 may be freely shifted through appropriate control of the first variable circuit T1 and/or the second variable circuit T2.

Figure 14:
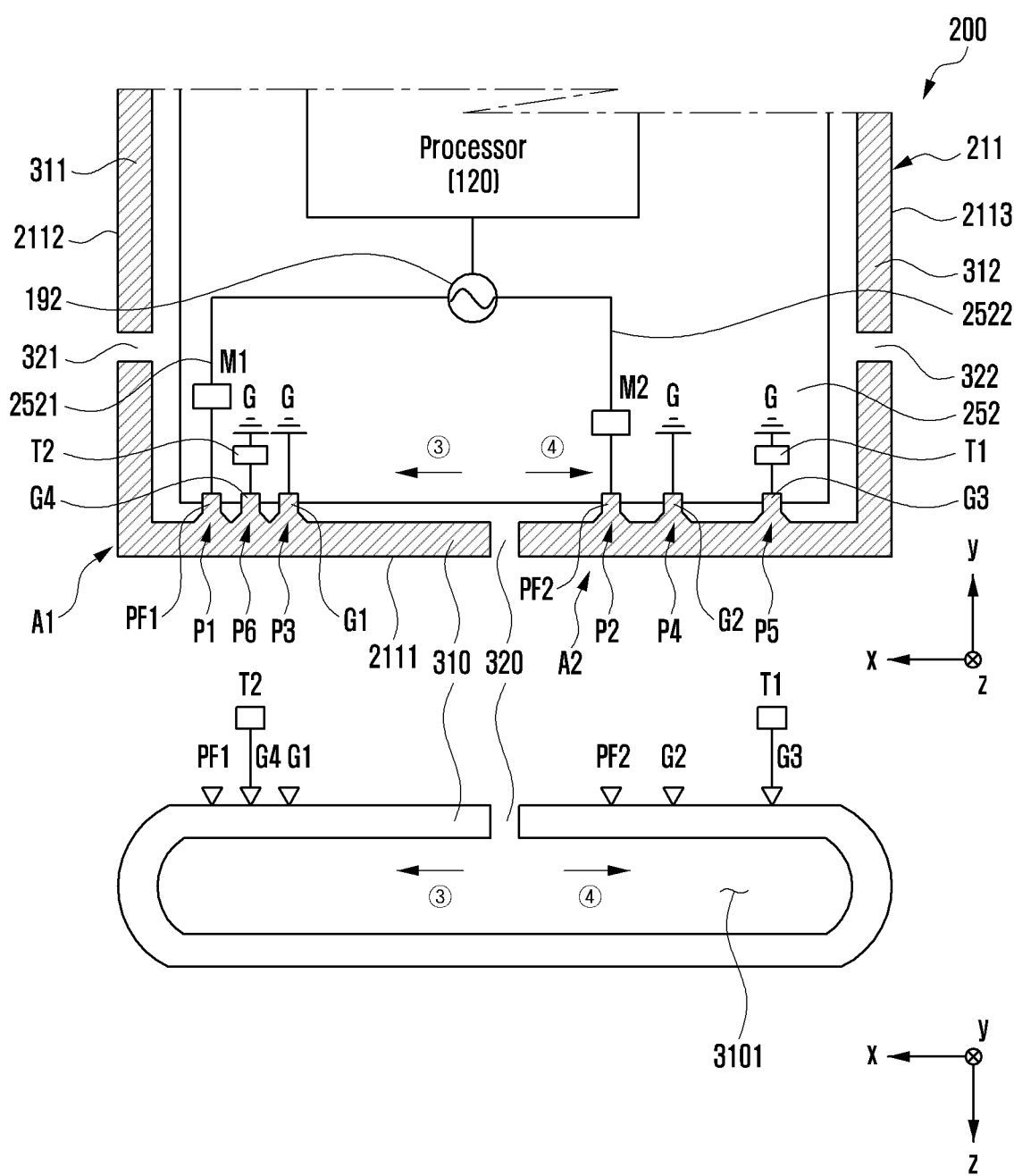
FIG. 14 is a diagram of an electronic device including an antenna disposition structure according to an embodiment of the disclosure.

FIG. 14 is a diagram of an electronic device including an antenna disposition structure according to an embodiment of the disclosure.

In describing the electronic device 200 of FIG. 14, the same reference numerals are assigned to components substantially the same as those of the electronic device 200 of FIG. 7, and detailed descriptions thereof may be omitted.

Referring to FIG. 14, the first conductive portion 310 may include, in the third side surface 2113 direction (e.g., fourth direction ④), a third ground part G3 disposed at the fifth point P5 between the second ground part G2 and the third side surface 2113 and electrically connected to the ground G of the substrate 252, and a fourth ground part G4 disposed at the sixth point P6 between the first power feed unit PF1 and the first ground part G1 and electrically connected to the ground G of the substrate 252. In an embodiment, the electronic device 200 may include a first variable circuit T1 (tunable IC or switching device) disposed in an electrical path connecting the ground G of the substrate 252 and the third ground part G3, and/or a second variable circuit T2 (tunable IC or switching device) disposed in an electrical path connecting the ground G of the substrate 252 and the fourth ground part G4. In an embodiment, the first variable circuit T1 and/or the second variable circuit T2, for example, may include a switching device and a plurality of passive elements (e.g., capacitor or inductor) switched to either one through the switching device. In some embodiments, the first variable circuit T1 and/or the second variable circuit T2 may include only a switching device selectively connecting the third ground part G3 and/or the fourth ground part G4 to the ground G of the substrate 252. In an embodiment, the first variable circuit T1 or the second variable circuit T2 may be disposed under the control of the processor 120 and may be electrically connected to one of each ground parts G3 and G4 in various ways according to state information of the electronic device 200. For example, the processor 120 may electrically connect (short) or disconnect (open) the third ground part G3 to the ground G of the substrate 252 through the first variable circuit T1. In an embodiment, the processor 120 may electrically connect (short) or disconnect (open) the fourth ground part G4 to the ground G of the substrate 252 through the second variable circuit T2. In an embodiment, the processor 120 may also connect the passive element having a designated value to the third ground part G3 and/or the fourth ground part G4 through the control of the first variable circuit T1 and/or the second variable circuit T2. In an embodiment, the operating frequency band of the first antenna A1 may be shifted through the first variable circuit T1 and/or the second variable circuit T2 under the control of the processor 120.

Figure 15:
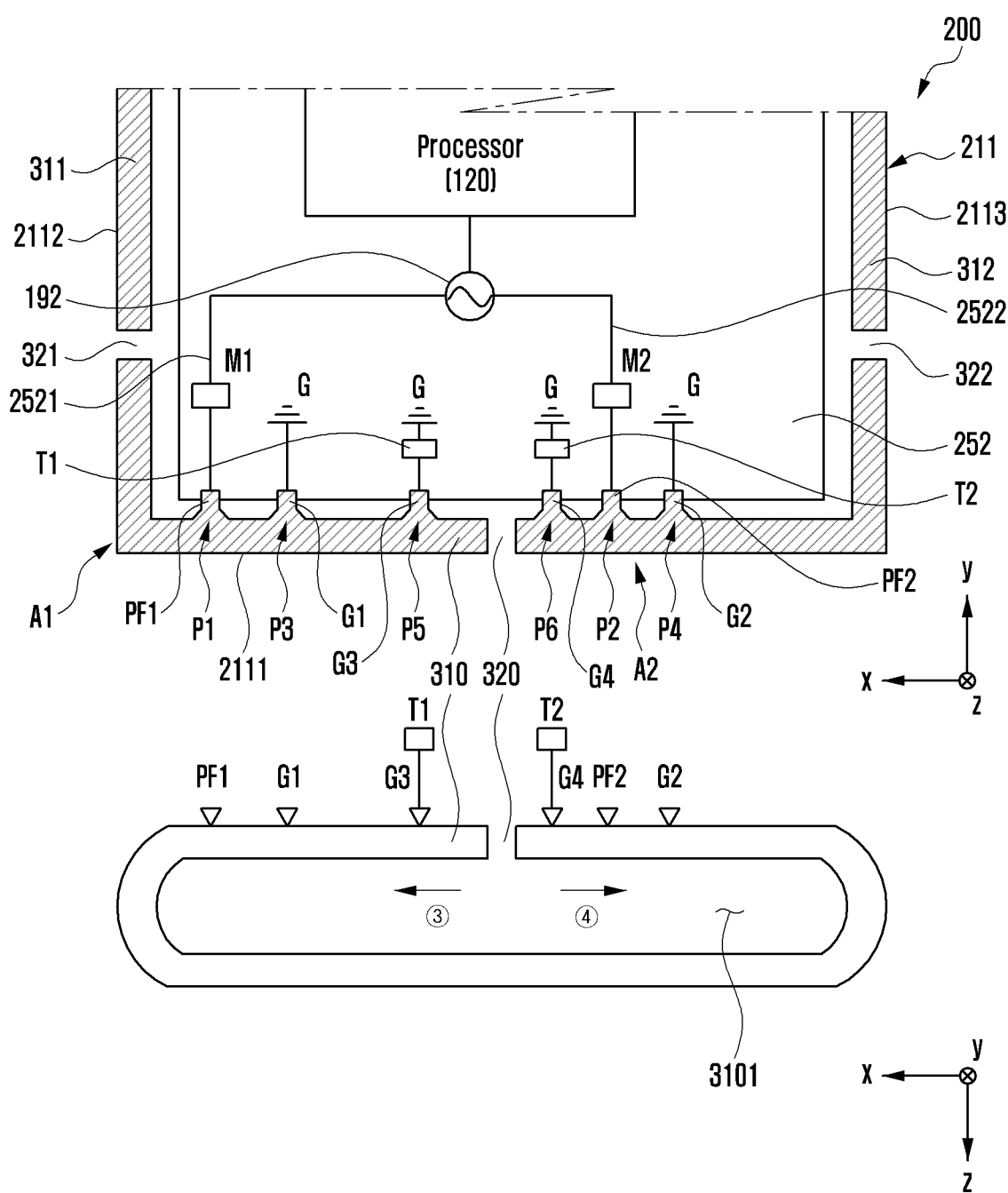
FIG. 15 is a diagram of an electronic device including an antenna disposition structure according to an embodiment of the disclosure.

FIG. 15 is a diagram of an electronic device including an antenna disposition structure according to an embodiment of the disclosure.

In describing the electronic device 200 of FIG. 15, the same reference numerals are assigned to components substantially the same as those of the electronic device 200 of FIG. 7, and detailed descriptions thereof may be omitted.

Referring to FIG. 15, the first conductive portion 310 may include, in the second side surface 2112 direction (e.g., third direction ③), a third ground part G3 disposed at the fifth point P5 between the first ground part G1 and the first segmentation portion 320 and electrically connected to the ground G of the substrate 252, and a fourth ground part G4 disposed at the sixth point P6 between the first segmentation portion 320 and the second power feed unit PF2 and electrically connected to the ground G of the substrate 252. In an embodiment, the electronic device 200 may include a first variable circuit T1 (tunable integrated circuit (IC) or switching device) disposed in an electrical path connecting the ground G of the substrate 252 and the third ground part G3, and/or a second variable circuit T2 (tunable IC or switching device) disposed in an electrical path connecting the ground G of the substrate 252 and the fourth ground part G4. In an embodiment, the first variable circuit T1 and/or the second variable circuit T2, for example, may include a switching device and a plurality of passive elements (e.g., capacitor or inductor) switched to either one through the switching device. In some embodiments, the first variable circuit T1 and/or the second variable circuit T2 may include only a switching device selectively connecting the third ground part G3 and/or the fourth ground part G4 to the ground G of the substrate 252. In an embodiment, the first variable circuit T1 or the second variable circuit T2 may be disposed under the control of the processor 120 and may be electrically connected to one of each ground parts G3 and G4 in various ways according to state information of the electronic device 200. For example, the processor 120 may electrically connect (short) or disconnect (open) the third ground part G3 to the ground G of the substrate 252 through the first variable circuit T1. In an embodiment, the processor 120 may electrically connect (short) or disconnect (open) the fourth ground part G4 to the ground G of the substrate 252 through the second variable circuit T2. In an embodiment, the processor 120 may also connect the passive element having a designated value to the third ground part G3 and/or the fourth ground part G4 through the control of the first variable circuit T1 and/or the second variable circuit T2. In an embodiment, the operating frequency band of the second antenna A2 may be shifted through the first variable circuit T1 and/or the second variable circuit T2 under the control of the processor 120.

Figure 16:
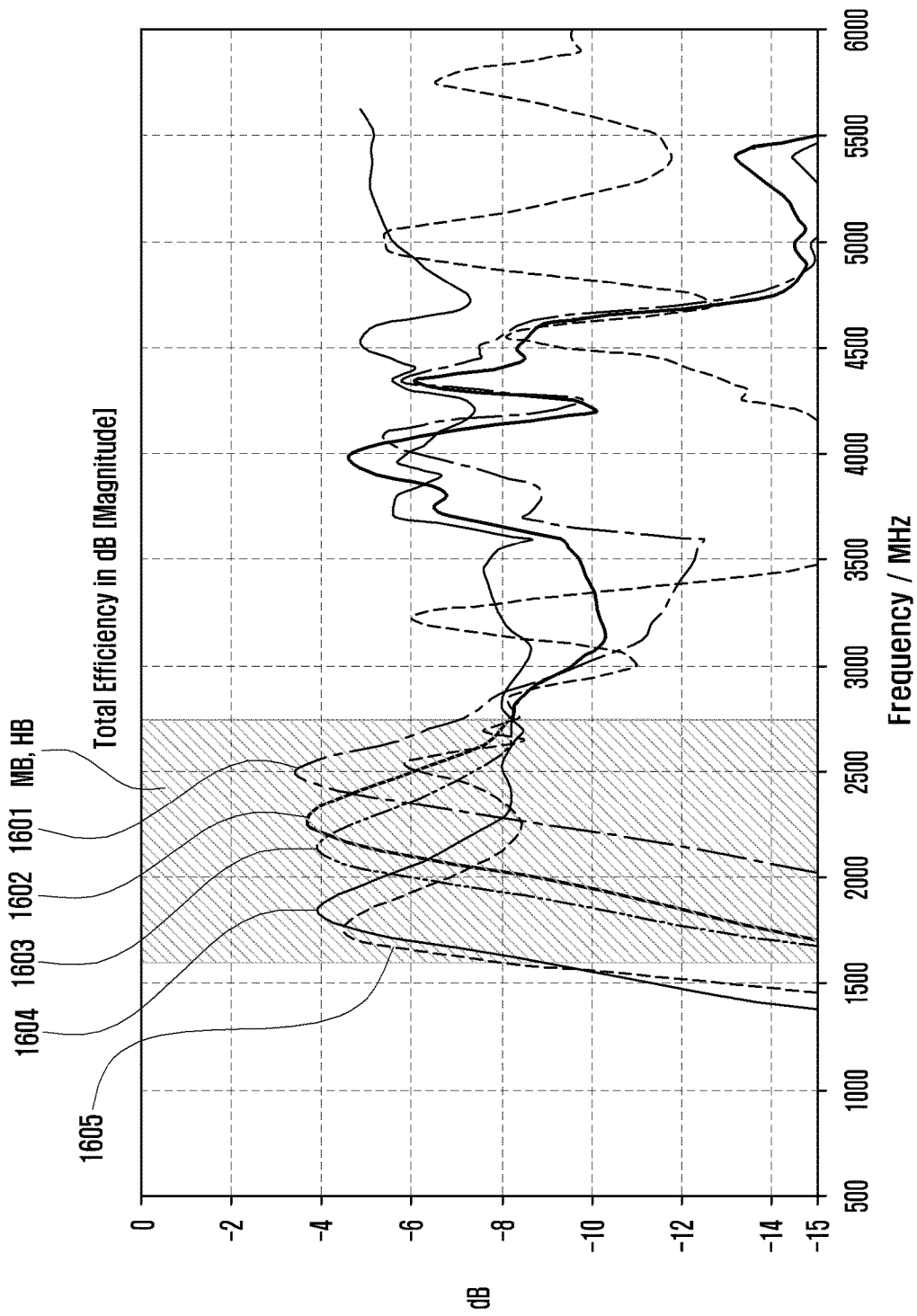
FIG. 16 is a graph illustrating a change in frequency band of the second antenna of FIG. 15 by configuring variable circuits according to an embodiment of the disclosure.

FIG. 16 is a graph illustrating a change in frequency band of the second antenna of FIG. 15 by configuring variable circuits according to an embodiment of the disclosure.

Referring to FIG. 16, the second antenna A2 may be operated in the first frequency band (graph 1601) of a mid band (MB)/high band (HB) (hereinafter mid/high band) when the third ground part G3 and the fourth ground part G4 are connected (short) to the ground G of the substrate 252 through the first variable circuit T1 and the second variable circuit T2. In an embodiment, the second antenna A2 may be operated in the second frequency band (graph 1602) of mid/high band lower than the first frequency band when the third ground part G3 is connected to the ground G of the substrate 252 through the first variable circuit T1, and the fourth ground part G4 is connected to an inductor having a designated value (e.g., 10 nanohenry (nH)) through the second variable circuit T2. In an embodiment, the second antenna A2 may be operated in a third frequency band (graph 1603) of mid/high band lower than the second frequency band when the third ground part G3 is connected to the ground G of the substrate 252 through the first variable circuit T1, and the fourth ground part G4 is disconnected (open) from the ground G of the substrate 252 through the second variable circuit T2. In an embodiment, the second antenna A2 may be operated in a fourth frequency band (graph 1604) of mid/high band lower than the third frequency band when the third ground part G3 is disconnected (open) from the ground G of the substrate 252 through the first variable circuit T1, and the fourth ground part G4 is disconnected (open) from the ground G of the substrate 252 through the second variable circuit T2. In an embodiment, the second antenna A2 may be operated in a fifth frequency band (graph 1605) of mid/high band lower than the fourth frequency band when the third ground part G3 is disconnected from the ground G of the substrate 252 through the first variable circuit T1 and is connected to the capacitor having a designated value through the second variable circuit T2. For example, the second antenna A2 may mean that the operating frequency band may be shifted in various ways through proper control of the first variable circuit T1 and/or the second variable circuit T2.

Figure 17:
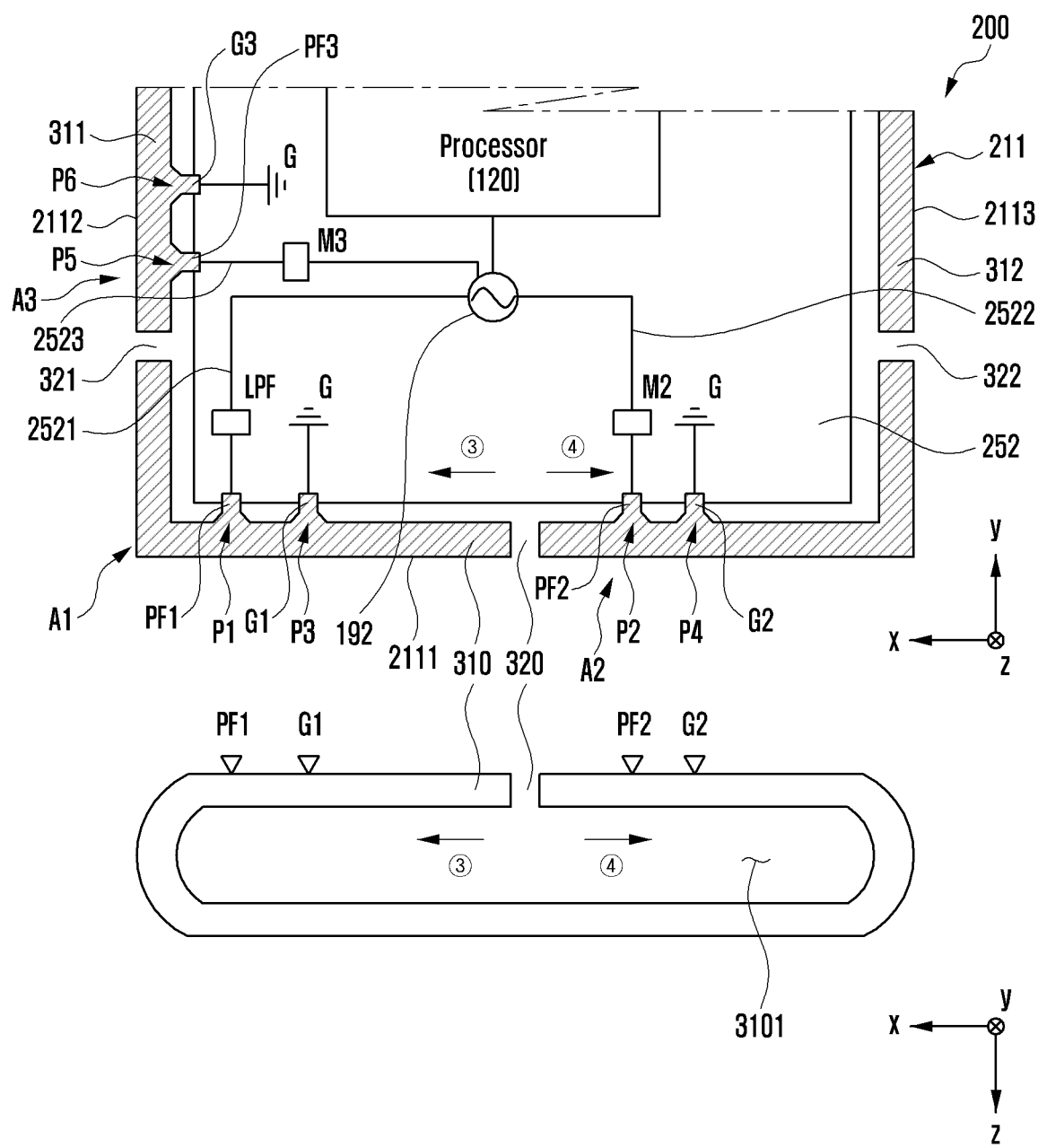
FIG. 17 is a diagram of an electronic device including an antenna disposition structure according to an embodiment of the disclosure.

FIG. 17 is a diagram of an electronic device including an antenna disposition structure according to an embodiment of the disclosure.

In describing the electronic device 200 of FIG. 17, the same reference numerals are assigned to components substantially the same as those of the electronic device 200 of FIG. 7, and detailed descriptions thereof may be omitted.

Referring to FIG. 17, the electronic device 200 may include a second conductive portion 311 segmented through the second segmentation portion 321 on the second side surface 2112 of the first lateral member 211 and/or a third conductive portion 312 segmented through the third segmentation portion 322 on the third side surface 2113. In an embodiment, the second conductive portion 311 may include a third power feed unit PF3 disposed at a fifth point P5 spaced apart from the second segmentation portion 321 and electrically connected to the wireless communication circuit 192 of the substrate 252 through a third electrical path 2523. In an embodiment, the electronic device 200 may include a matching circuit M3 disposed in the third electrical path 2523. In an embodiment, the second conductive portion 311 may include a third ground part G3 disposed at a sixth point P6 spaced apart from the fifth point P5 in a direction away from the second segmentation portion 321 (e.g., the +y-axis direction) and electrically connected to the ground G of the substrate 252. In an embodiment, at least a portion of the second conductive portion 311 may be operated as a third antenna A3 in a designated frequency band (e.g., mid band and/or high band) through a third power feed unit PF3 and a third ground part G3. In an embodiment, the third antenna A3 may operate as a slot antenna or a slit antenna. In an embodiment, the frequency band of the third antenna A3 may be determined according to the location of the third ground part G3. This configuration of the third antenna A3 may help improve the phenomenon that circuit loss increases because of the excessive use of a diplexer in the first antenna A1.

According to various embodiments, since the first antenna A1 and the third antenna A3 are operated by sharing the second segmentation portion 321, isolation may be deteriorated. To improve this phenomenon, the electronic device 200 may include a low-pass filter (LPF) disposed in the first electrical path 2521 connecting the first power feed unit PF1 and the wireless communication circuit 192. In an embodiment, the low-pass filter (LPF) may help improve the isolation of the first antenna A1 and the third antenna A3 and the efficiency of the mid/high band of the third antenna A3 by forcibly reducing the efficiency of the mid band and/or high band of the first antenna A1.

Figure 18:
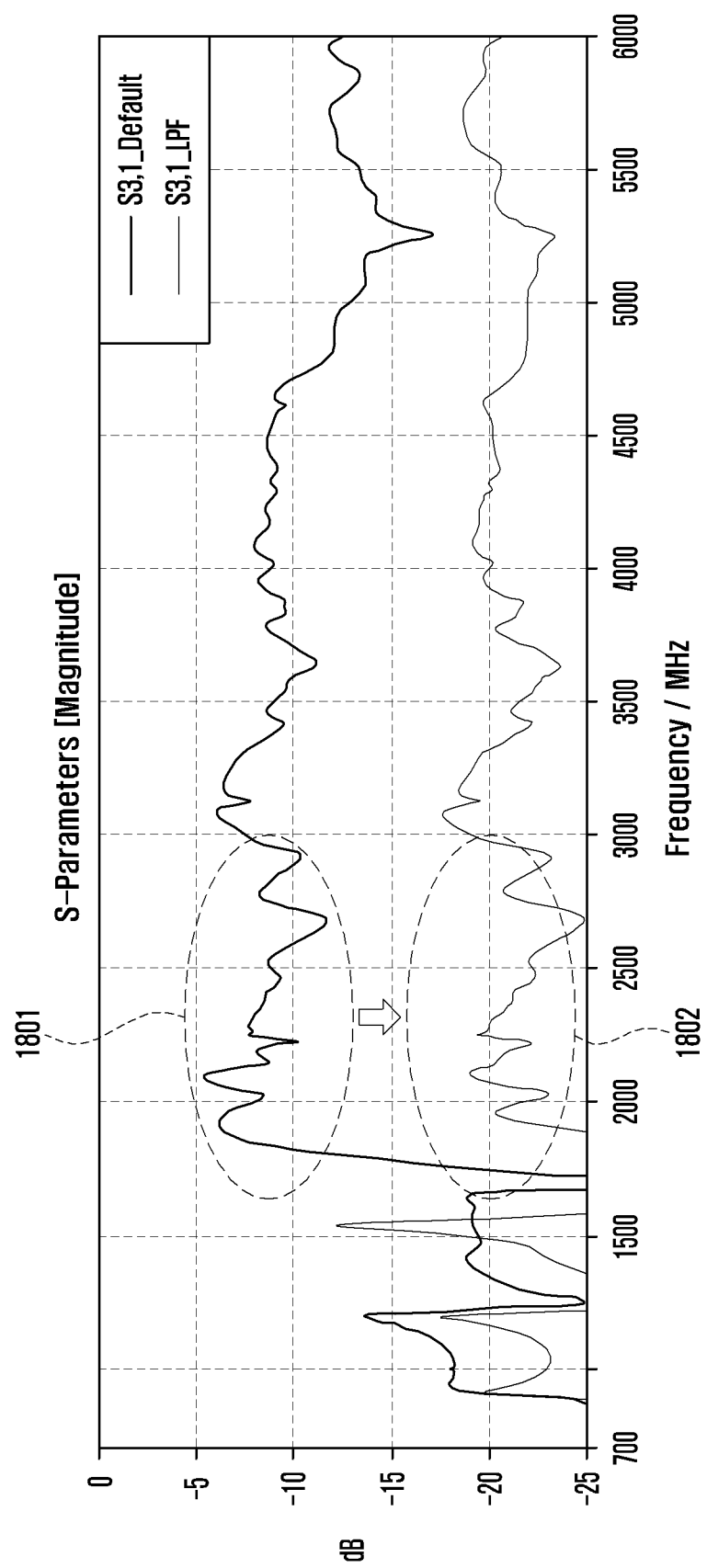
FIG. 18 is a graph comparing isolation degrees of the first antenna and the third antenna of FIG. 17 with or without a filter according to an embodiment of the disclosure.

FIG. 18 is a graph comparing isolation degrees of the first antenna and the third antenna of FIG. 17 with or without a filter according to an embodiment of the disclosure.

Referring to FIG. 18, it may be identified that when the low-pass filter (LPF) is not used, the isolation between the first antenna A1 and the third antenna A3 appears to be about −10 db or more in the mid band and high band (area 1801). In an embodiment, it may be identified that when the low-pass filter (LPF) is used for the first antenna A1, the isolation between the first antenna A1 and the third antenna A3 appears to be about −15 db or less in the mid band and high band (area 1802). This may mean that even if the second segmentation portion 321 is commonly used for the first antenna A1 and the third antenna A3, when the low-pass filter (LPF) is applied to the feed line of the first antenna A1, the isolation between the two antennas A1 and A3 is increased.

Figure 19:
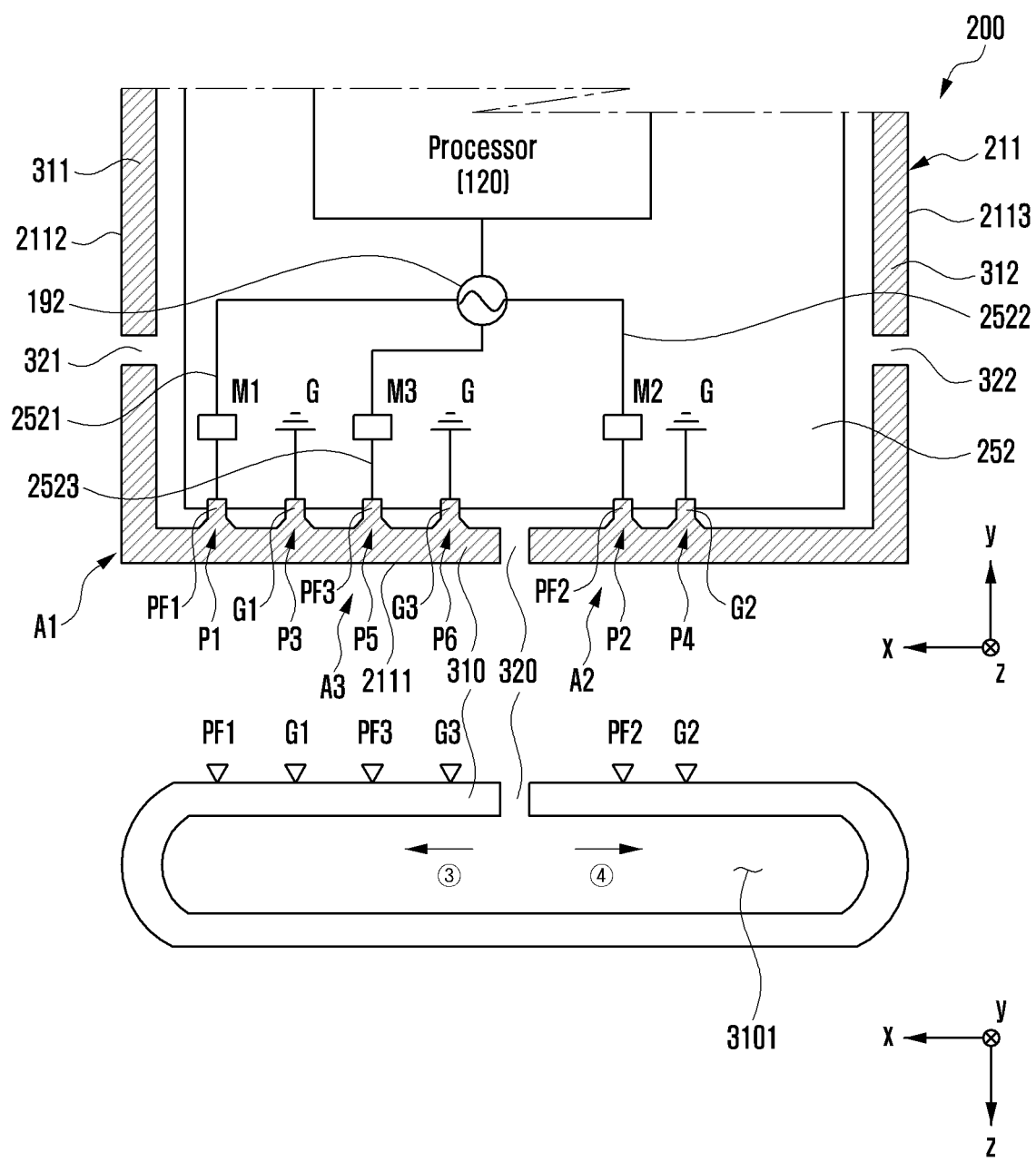
FIG. 19 is a diagram of an electronic device including an antenna disposition structure according to an embodiment of the disclosure.

FIG. 19 is a diagram of an electronic device including an antenna disposition structure according to an embodiment of the disclosure.

In describing the electronic device 200 of FIG. 19, the same reference numerals are assigned to components substantially the same as those of the electronic device 200 of FIG. 7, and detailed descriptions thereof may be omitted.

Referring to FIG. 19, the first conductive portion 310 may include a third power feed unit PF3 disposed at a fifth point P5 between the first segmentation portion 320 and the first ground part G1 in the second side surface 2112 direction (e.g., third direction ③) and electrically connected to the wireless communication circuit 192 of the substrate 252 through the third electrical path 2523. In an embodiment, the first conductive portion 310 may include a third ground part G3 disposed at a sixth point P6 between the first segmentation portion 320 and the third power feed unit PF3 in the second side surface 2112 direction (e.g., third direction ③) and electrically connected to the ground G of the substrate 252. In an embodiment, the electronic device 200 may include a matching circuit M3 disposed in the third electrical path 2523. In an embodiment, at least a portion of the first conductive portion 310 may be operated as a third antenna A3 in the designated frequency band (e.g., mid band and/or high band) through the third power feed unit PF3, the first ground part G1 and the third ground part G3. In this case, the second antenna A2 may have an electrical length passing through the second ground part G2 and the third ground part G3. In some embodiments, as shown in FIG. 17, the electronic device 200 may include further a fourth antenna (e.g., the third antenna A3 of FIG. 17) having a power feed unit (e.g., the third power feed unit PF3 of FIG. 17) disposed on at least a portion of the second conductive portion 311.

Figure 20A:
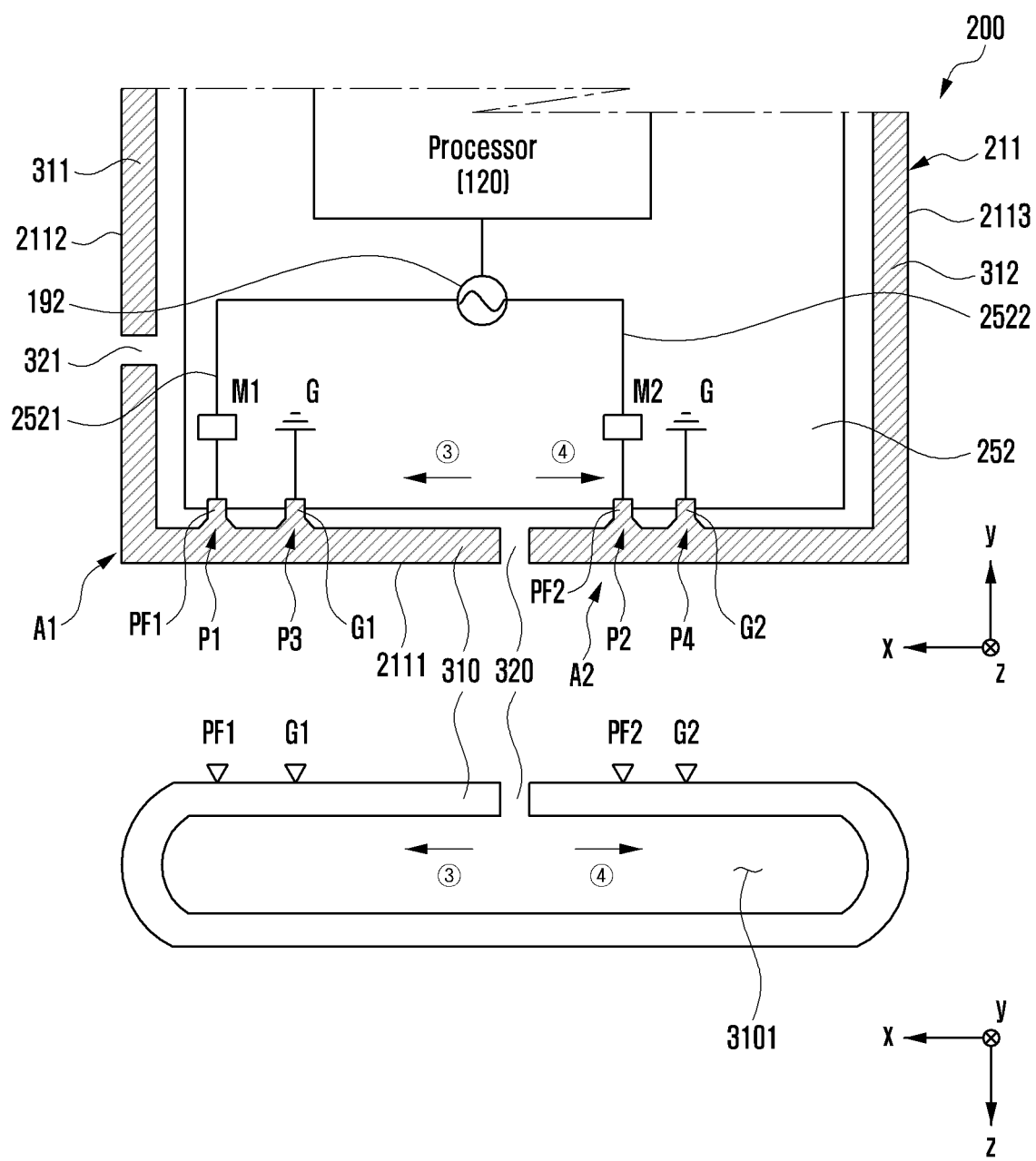
FIGS. 20A and 20B are diagrams of an electronic device including an antenna disposition structure according to various embodiments of the disclosure.
Figure 20B:
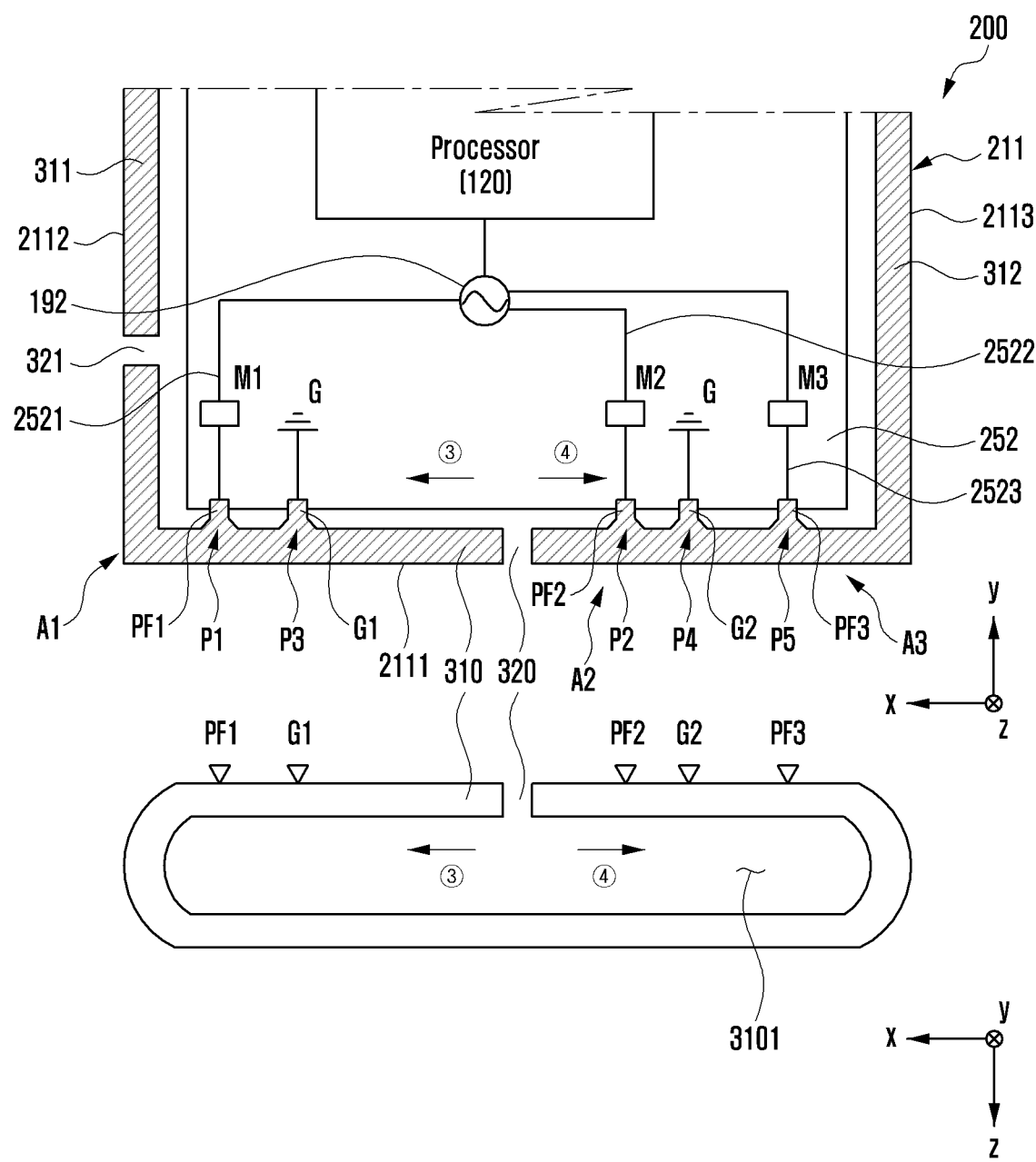

FIGS. 20A and 20B are diagrams of an electronic device including an antenna disposition structure according to various embodiments of the disclosure.

In the description of the electronic device 200 of FIGS. 20A and 20B, the same reference numerals are assigned to components substantially the same as those of the electronic device 200 of FIG. 7, and detailed descriptions thereof may be omitted.

Referring to FIG. 20A, the first conductive portion 310 may be configured to use the entire third side surface 2113 of the first lateral member 211 without the third segmentation portion (e.g., the third segmentation portion 322 of FIG. 7).

Referring to FIG. 20B, in the configuration of FIG. 20A, the first conductive portion 310 may include a third power feed unit PF3 electrically connected to the wireless communication circuit 192 of the substrate 252 at the fifth point P5 between the second ground part G2 and the third side surface 2113 through the third electrical path 2523 in the direction of the third side surface 2113 (e.g., fourth direction CI). In an embodiment, the third power feed unit PF3 may be disposed on at least a portion of the first conductive portion 310 on the first side surface 2111 of the first lateral member 211 and may be used as the third antenna A3.

Figure 21:
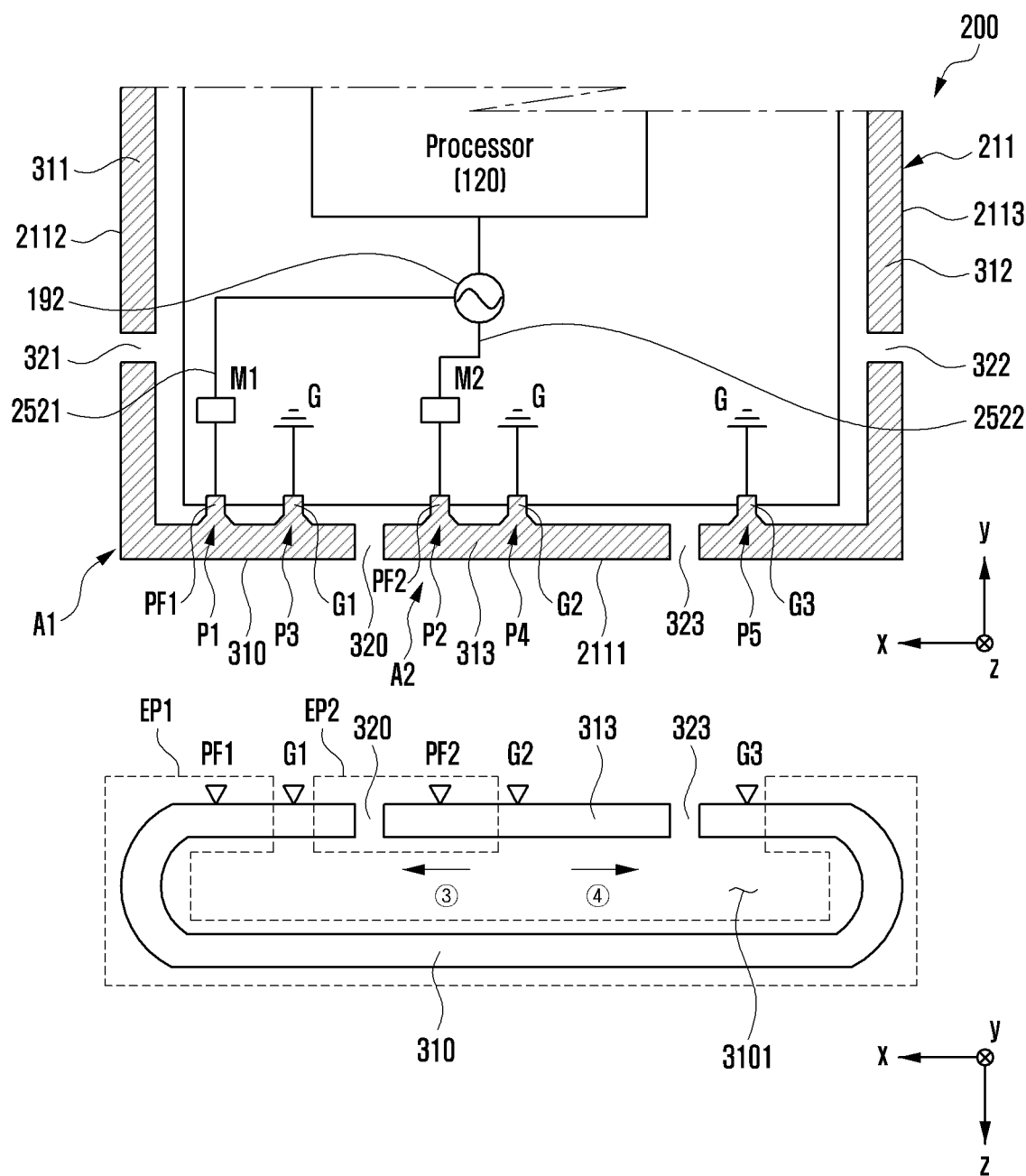
FIGS. 21 and 22 are diagrams of an electronic device including an antenna disposition structure according to various embodiments of the disclosure.
Figure 22:
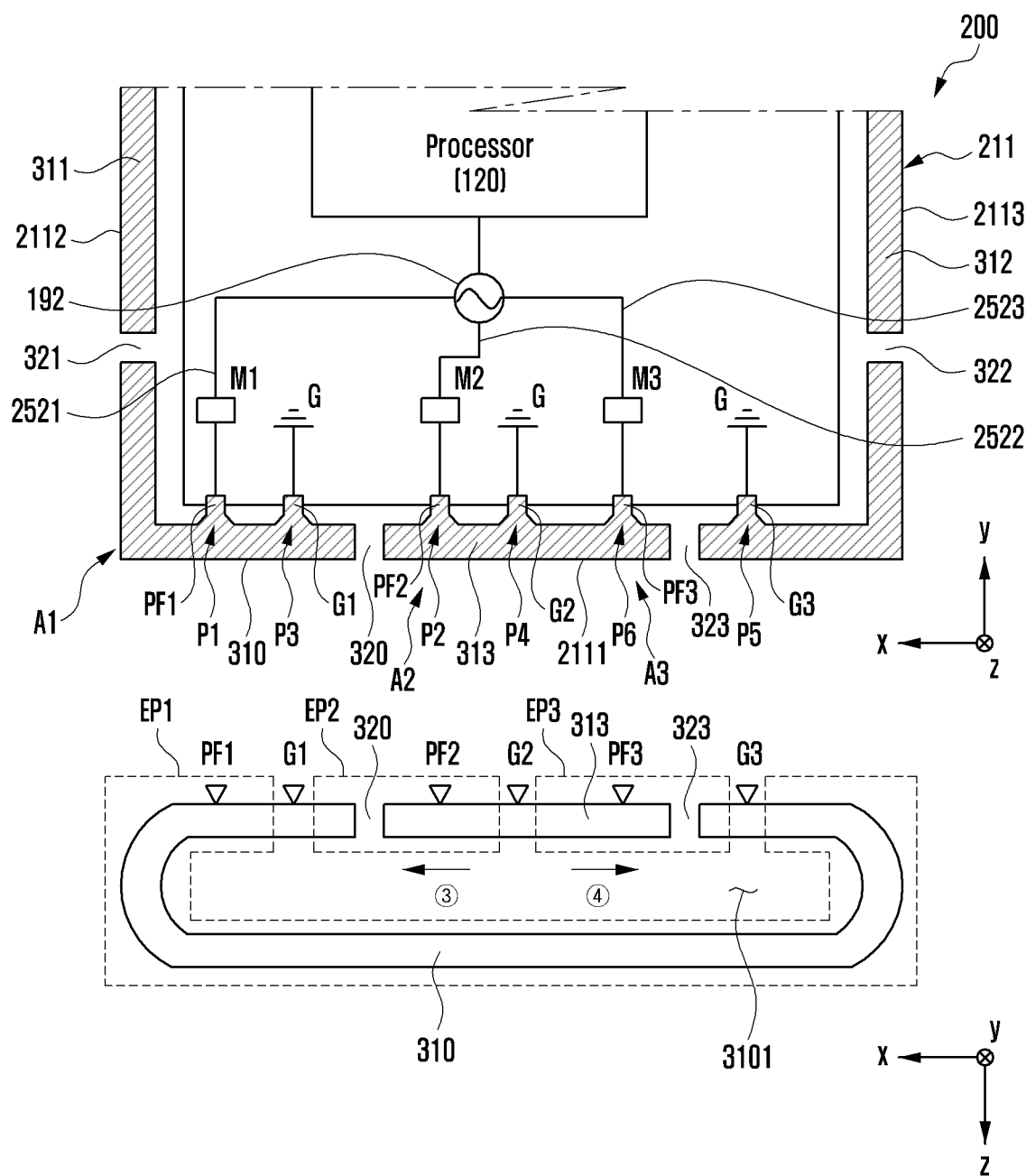

FIGS. 21 and 22 are diagrams of an electronic device including an antenna disposition structure according to various embodiments of the disclosure.

In describing the electronic device 200 of FIGS. 21 and 22, the same reference numerals are assigned to components substantially the same as those of the electronic device 200 of FIG. 7, and detailed descriptions thereof may be omitted.

Referring to FIG. 21, the electronic device 200 may include further a fourth segmentation portion 323 formed between the second ground part G2 and the third side surface 2113 of the first conductive portion 310 in the third side surface 2113 direction (e.g., fourth direction ④). In this case, the electronic device 200 may include a fourth conductive portion 313 segmented through the first segmentation portion 320 and the fourth segmentation portion 323 of the first conductive portion 310. In an embodiment, the first conductive portion 310 may include a third ground part G3 electrically connected to the ground G of the substrate 252 at the fifth point P5 between the fourth segmentation portion 323 and the third side surface 2113 in the third side surface 2113 direction (e.g., fourth direction ④). In an embodiment, the first antenna A1 may be operated in a frequency band (e.g., low band) corresponding to the first electrical length EP1 using the first conductive portion 310 from the first ground part G1 to the third ground part G3 through the first power unit PF1. In an embodiment, the second antenna A2 may be operated in a frequency band (e.g., mid band and/or high band) corresponding to the second electrical length EP2 using a portion of the first conductive portion 310 and a portion of the fourth conductive portion 313 from the first ground part G1 to the second ground part G2 through the first segmentation portion 320.

Referring to FIG. 22, in the configuration of FIG. 21, the electronic device 200 may include a third power feed unit PF3 electrically connected to the wireless communication circuit 192 of the substrate 252 through the third electrical path 2523 at the sixth point P6 between the second ground part G2 and the fourth segmentation portion 323. In an embodiment, the electronic device 200 may include a matching circuit M3 disposed in the third electrical path 2523. In an embodiment, the electronic device 200 may include a third antenna A3 operating in a frequency band (e.g., mid band and/or high band) corresponding to a third electrical length EP3 from the second ground part G2 to the third ground part G3 through the fourth segmentation portion 323.

Figure 23A:
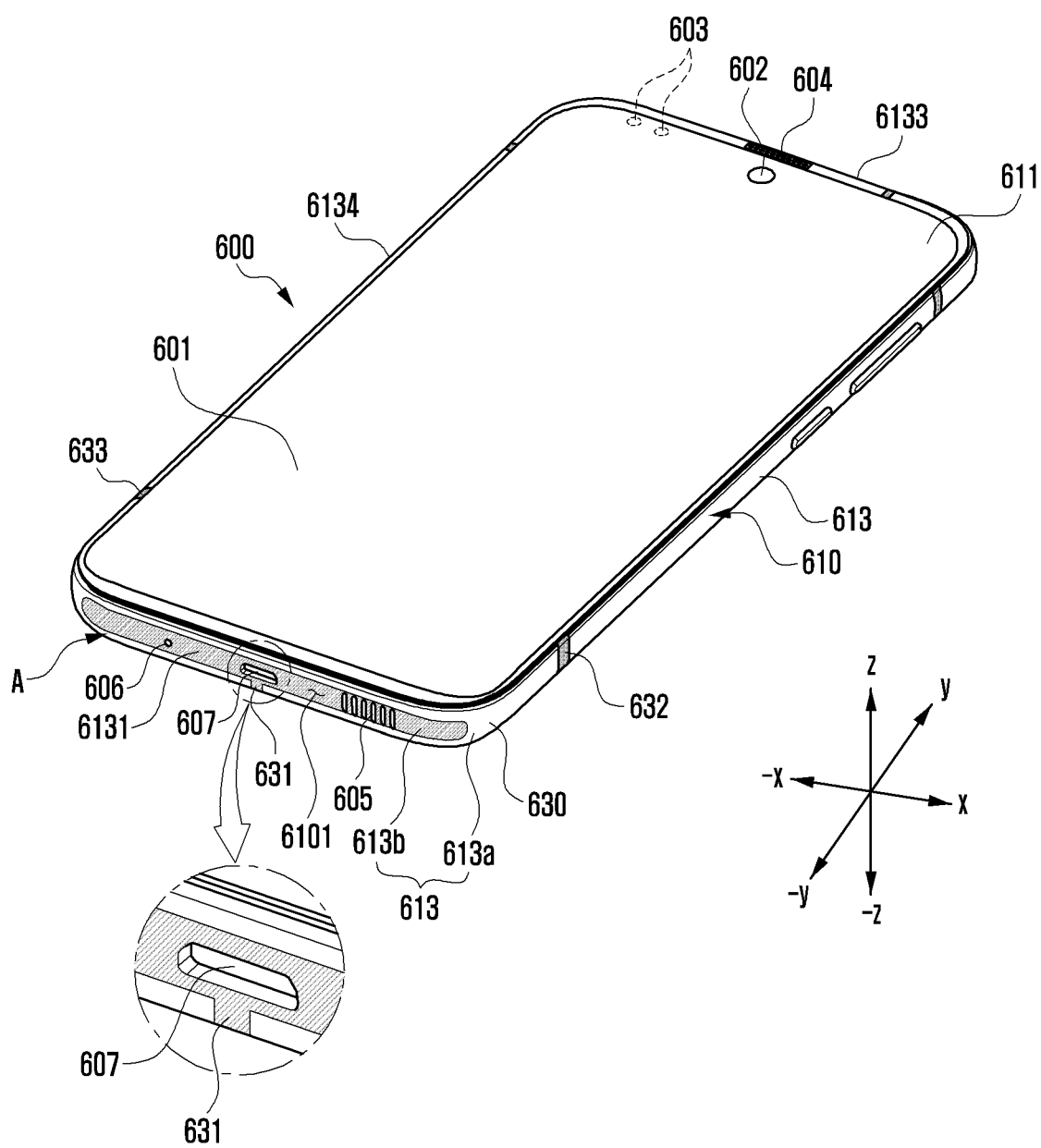
FIGS. 23A and 23B are views of an electronic device including a loop-shaped conductive portion according to various embodiments of the disclosure.
Figure 23B:
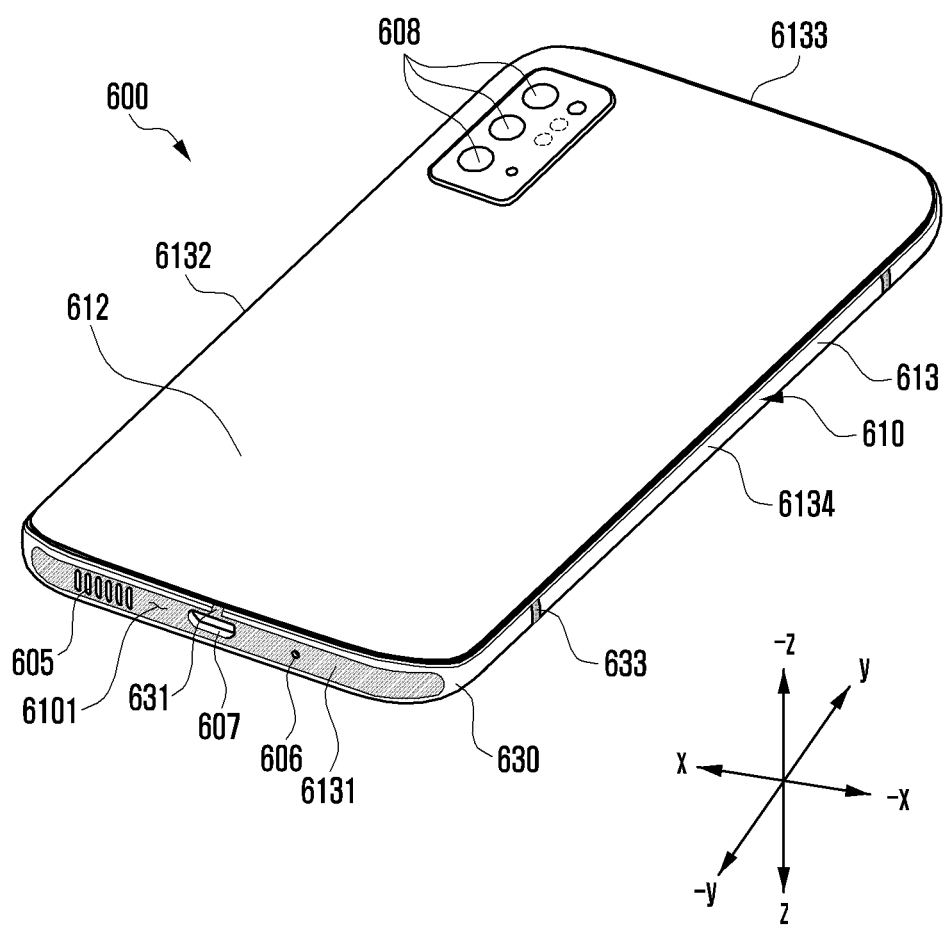

FIGS. 23A and 23B are views of an electronic device including a loop-shaped conductive portion according to various embodiments of the disclosure.

Electronic device 600 of FIGS. 23A and 23B may be at least partially similar to the electronic device 101 of FIG. 1 or may further include other embodiments of the electronic device.

Referring to FIGS. 23A and 23B, an electronic device 600 may include a bar-type electronic device. In an embodiment, the electronic device 600 may include a housing 610 (e.g., a housing structure including a front surface cover 611 facing in a first direction (e.g., a z-axis direction), a rear surface cover 612 facing in a direction opposite to the front surface cover 611 (e.g., a −z-axis direction), and a lateral member 613 disposed to surround a space between the front surface cover 611 and the rear surface cover 612. In an embodiment, the lateral member 613 may include a conductive member 613a and a non-conductive member 613b combined with the conductive member 613a. In an embodiment, the lateral member 613 may include a first side surface 6131 disposed on the lower side (e.g., −y axis direction) of the electronic device 600 and having a first length, a second side surface 6132 extending in a direction perpendicular to the first side surface 6131 and having a second length longer than the first length, a third side surface 6133 extending in a direction parallel to the first side surface 6131 from the second side surface 6132 and having a first length, and a fourth side surface 6134 extending from the third side surface 6133 to the first side surface 6131 in a direction parallel to the second side surface 6132 and having a second length. In an embodiment, the electronic device 600 may include a display 601 disposed in an inner space and visible from the outside through at least a portion of the front surface cover 611. In an embodiment, the electronic device 600 may include at least one camera device 602 and at least one sensor module 603 disposed in an internal space and disposed to detect an external environment through at least a portion of the front surface cover 611 and/or at least a portion of the display 601. In an embodiment, the electronic device 600 may include at least one speaker device 604 and 605, a microphone device 606 and/or an interface connector port 607 disposed to operate through at least a portion of the lateral member 613. In an embodiment, the at least one speaker device 604 and 605 may include a receiver disposed between the lateral member 613 and the front surface cover 611, and an external speaker 605 disposed to operate through the lateral member 613. In an embodiment, the electronic device 600 may include at least one other camera device 608 disposed to detect an external environment through at least a portion of the rear surface cover 612.

According to various embodiments, in the first side surface 6131 of the electronic device 600, an opening 6101 and a first segmentation portion 631 may include a loop-shaped conductive portion 630 (e.g., the first conductive portion 310 of FIG. 7) filled with a non-conductive member 613b. In an embodiment, the conductive portion 630 may be segmented from other parts of the conductive member 613a through a second segmentation portion 632 and a third segmentation portion 633 respectively disposed on the second side surface 6132 and the fourth side surface 5134. In an embodiment, the second segmentation portion 632 and the third segmentation portion 633 may also be filled with a non-conductive member 613b. In an embodiment, the conductive portion 630 may be operated as at least one antenna A operating in at least one frequency band. In some embodiments, the loop-shaped conductive portion 630 may be disposed on at least one of the second side surface 6132, the third side surface 6133, and the fourth side surface 6134.

Figure 24A:
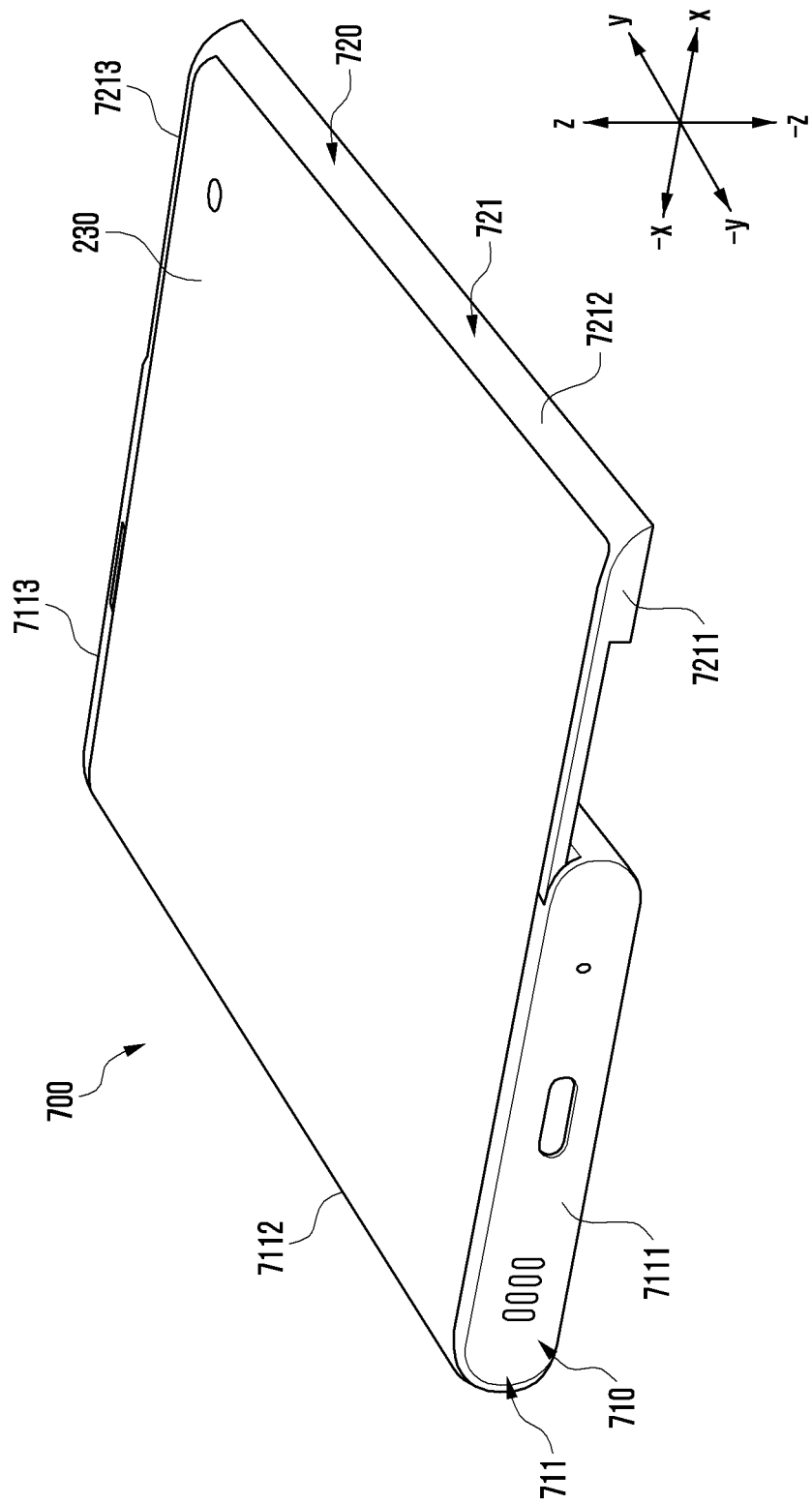
FIGS. 24A and 24B are views of an electronic device including a loop-shaped conductive portion according to various embodiments of the disclosure.
Figure 24B:
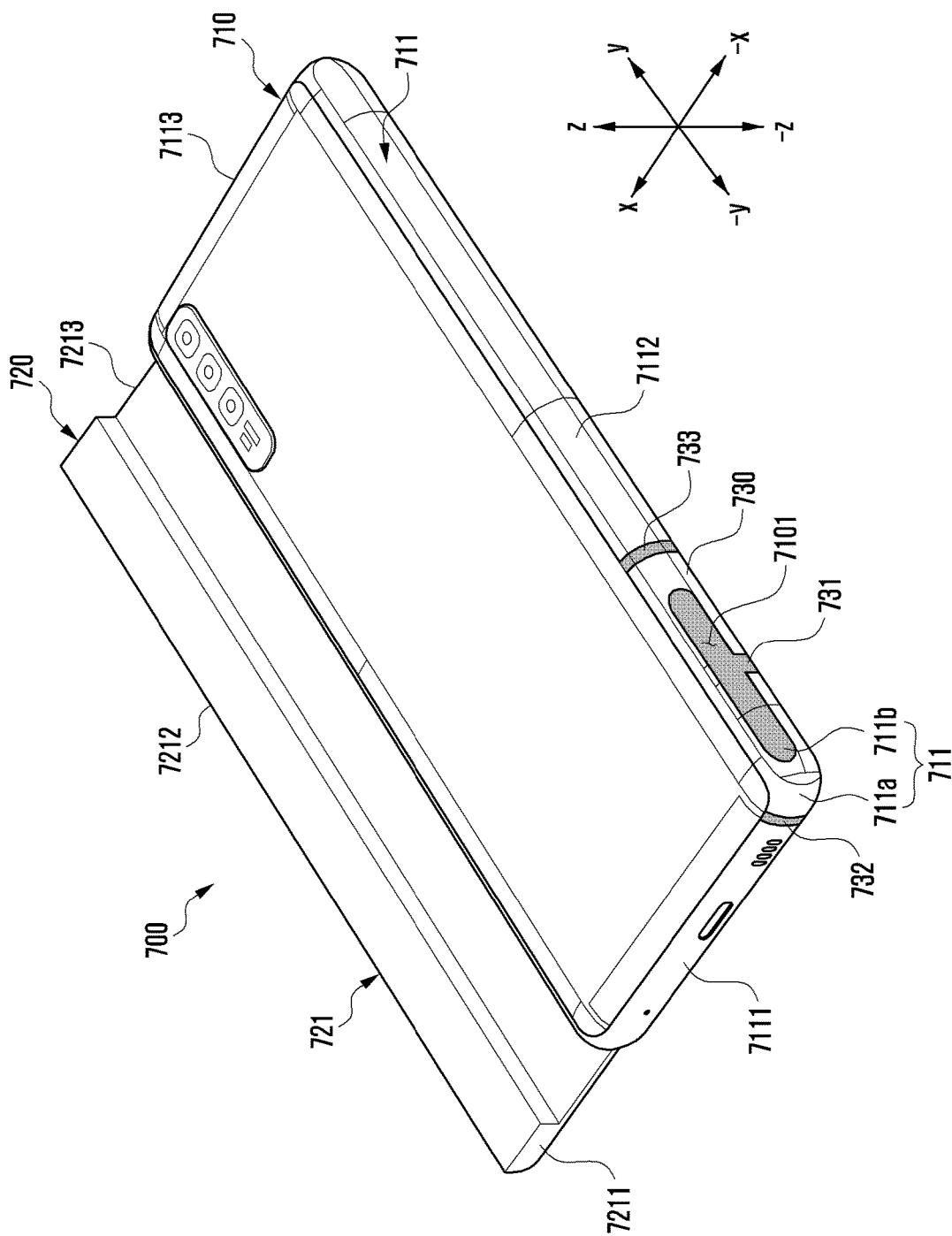

FIGS. 24A and 24B are views of an electronic device including a loop-shaped conductive portion according to various embodiments of the disclosure.

Electronic device 700 of FIGS. 24A and 24B may be at least partially similar to the electronic device 101 of FIG. 1 or may further include other embodiments of the electronic device.

Referring to FIGS. 24A and 24B, an electronic device 700 may include a rollable-type (bar-type) electronic device. In an embodiment, the electronic device 700 may include a first housing 710, a second housing 720 (e.g., a slide structure) coupled to be slid out of the first housing 710 in a first direction (e.g., an x-axis direction) and to be slid in in a direction opposite to the first direction (e.g., an −x-axis direction), and a flexible display 230 disposed to be supported by the first housing 710 and the second housing 720, and of which display area is variable by being accommodated in the inner space of the first housing 710 to be at least partially invisible from the outside in a slide-in state. In an embodiment, the first housing 710 may include a first lateral member 711. In an embodiment, the first lateral member 711 may include a first side surface 7111 disposed on the lower side of the electronic device 700 (e.g., the −y-axis direction) and having a first length, a second side surface 7112 extending in a direction perpendicular to the first side surface 7111 and having a second length longer than the first length, and a third side surface 7113 extending in a direction parallel to the first side surface 7111 from the second side surface 7112 and having a first length. In an embodiment, the second housing 720 may include a second lateral member 721. In an embodiment, the second lateral member 721 may include a fourth side surface 7211 disposed on the lower side of the electronic device 700 (e.g., the −y-axis direction) and corresponding to the first side surface 7111, a fifth side surface 7212 extending in a direction perpendicular to the fourth side surface 7211 and having a length substantially similar to that of the second side surface 7112, and a sixth side surface 7213 extending from the fifth side surface 7212 and corresponding to the third side surface 7113. In an embodiment, the first lateral member 711 may be formed of a conductive member 711a and a non-conductive member 711b combined with the conductive member 711a.

According to various embodiments, in at least a portion of the first side surface 7111 of the electronic device 700, an opening 7101 and a first segmentation portion 731 may include a loop-shaped conductive portion 730 (e.g., the first conductive portion 310 of FIG. 7) filled with a non-conductive member 711b. In an embodiment, the conductive portion 730 may be segmented from other parts of a conductive member 711a through a second segmentation portion 732 and a third segmentation portion 733 disposed on the first side surface 7111 and the second side surface 7112 respectively. In an embodiment, the second segmentation portion 732 and the third segmentation portion 733 may also be filled with a non-conductive member 711b. In an embodiment, the conductive portion 730 may be operated as at least one antenna A operating in at least one frequency band. In some embodiments, the loop-shaped conductive portion 730 may also be disposed at at least one of a first side surface 7111, a third side surface 7113, a fourth side surface 7211, a fifth side surface 7212, or a sixth side surface 7213.

Although not shown, the loop-shaped conductive portion used as at least one antenna may be applied to at least a portion of at least one side of the first housing and the second housing of the foldable electronic device in which the first housing and the second housing are foldably coupled to each other through a hinge device.

According to various embodiments, an electronic device (e.g., the electronic device 200 of FIG. 7) may include: at least one housing (e.g., the first housing 210 of FIG. 3A) including a lateral member (e.g., the first later member 211 of FIG. 7) that includes a first side surface (e.g., the first side surface 2111 of FIG. 7), a second side surface (e.g., the second side surface 2112 of FIG. 7) extended vertically from one end of the first side surface, and a third side surface (e.g., the third side surface 2113) extended vertically from the end of the second side surface; a first conductive portion (e.g., the first conductive portion 310 of FIG. 7) disposed in a loop-shape when the first side surface is viewed from the outside, and segmented through the first segmentation portion (e.g., the first segmentation portion 320 of FIG. 7); a substrate (e.g., the substrate 252 of FIG. 7) disposed in the inner space of the housing and including a ground (e.g., the ground G of FIG. 7); and a wireless communication circuit (e.g., the wireless communication circuit 192 of FIG. 7) disposed on the substrate and configured to transmit and receive the wireless signal through the first conductive portion in at least one frequency band. The first conductive portion may include a first power feed unit (e.g., the first power feed unit PF1 of FIG. 7) electrically connected to the wireless communication circuit through a first point (e.g., the first point P1 of FIG. 7) between the first segmentation portion and the second side surface; a second power feed unit (e.g., the second power feed unit PF2 of FIG. 7) electrically connected to the wireless communication circuit through a second point (e.g., the second point P2 of FIG. 7) between the first segmentation portion and the third side surface; a first ground part (e.g., the first ground part G1 of FIG. 7) electrically connected to the ground through a third point (e.g., the third point P3 of FIG. 7) in a direction toward the second side surface from the first segmentation portion; a second ground part (e.g., the second ground part G2 of FIG. 7) electrically connected to the ground through a fourth point (e.g., the fourth point P4 of FIG. 7) between the second point and the third side surface.

According to various embodiments, the wireless communication circuit may be configured to transmit or receive a wireless signal in a first frequency band through the first power feed unit, and it may be configured to transmit and receive a wireless signal in at least one second frequency band higher than the first frequency band through the second power feed unit.

According to various embodiments, the first frequency band may include a low band, and the second frequency band may include a mid band and/or a high band.

According to various embodiments, the first and second power feed units and the first and second ground parts may be disposed on the same line in the first conductive portion.

According to various embodiments, the first lateral member may include a conductive member and a non-conductive member coupled to the conductive member, and the first segmentation portion may be filled with the non-conductive member.

According to various embodiments, the first conductive portion may be segmented from a surrounding conductive member through a second segmentation portion formed on the second side surface and a third segmentation portion formed on the third side surface.

According to various embodiments, a second conductive portion segmented through the second segmentation portion may be included in the second side surface, and a third power feed unit electrically connected to the wireless communication circuit may be included in the fifth point spaced apart from the second segmentation portion.

According to various embodiments, a low-pass filter (LPF) disposed in an electrical path electrically connecting the first power feed unit and the wireless communication circuit may be included.

According to various embodiments, the first conductive portion may be operated as an antenna through the first portion connected to the first power feed unit and disposed on the first side surface, and a portion of the second side surface extended from the first portion.

According to various embodiments, the first conductive portion may be connected to the second power feed unit and operate as a second antenna through a second part disposed on the first side surface.

According to various embodiments of the disclosure, at least one first additional ground part disposed to be electrically connected to the ground of the substrate at at least one point between the fourth point and the third side surface, and at least one second additional ground part disposed to be electrically connected to the ground of the substrate at at least one point between the third point and the first segmentation portion in a direction toward the second side surface from the first segmentation portion, may be included.

According to various embodiments, a first variable circuit disposed in an electrical path connecting the at least one first additional ground part and a second variable circuit disposed in an electrical path connecting the at least one second additional ground part may be included.

According to various embodiments, the first variable circuit and/or the second variable circuit may include a switching circuit and at least one passive element that is switched through control of the switching circuit, and the switching circuit may perform the switching operation through the control of at least one processor.

According to various embodiments, at least a portion of the first conductive portion may be operated as a first antenna to be configured to transmit or receive a wireless signal in a first frequency band through the first power feed unit, and the first frequency band may be determined through the first variable circuit.

According to various embodiments, at least a portion of the first conductive portion may be operated as a second antenna to be configured to transmit and receive a wireless signal in at least one second frequency band higher than the first frequency band through the second power feed unit, and the second frequency band may be determined through the second variable circuit.

According to various embodiments, the first conductive portion may include a third power feed unit electrically connected to the wireless communication circuit at a fifth point between the first segmentation portion and the first ground in a direction toward the second side surface from the first segmentation portion, and a third ground part electrically connected to the ground of the substrate at a sixth point between the first segmentation portion and a third power feed unit in a direction toward the second side surface from the first segmentation portion.

According to various embodiments, a second conductive portion disposed through a second segmentation portion formed between the first segmentation portion and the third side surface may be included, and the first conductive portion may include a third ground part electrically connected to the ground of the substrate at the fifth point between the second segmentation portion and the third side surface.

According to various embodiments, the second conductive portion may include a third power feed unit electrically connected to the wireless communication circuit at a sixth point between the second ground part and the second segmentation portion.

According to various embodiments, the at least one housing may include a front surface cover, a rear surface cover facing the opposite direction to the front surface cover, the lateral member surrounding a space between the front surface cover and the rear surface cover, and a display disposed in the space to be visible from the outside through a front surface cover, and at least a portion of the first side surface may be disposed substantially vertically from the display surface.

According to various embodiments, at least one housing may include a first housing and a second housing slidably coupled from the first housing, and the lateral member may be disposed on the first housing.

According to various embodiments, the first conductive portion may maintain a state of being electrically disconnected from a second conductive portion and a third conductive portion through a second segmentation portion and a third segmentation portion, respectively, and the second conductive portion is disposed on a portion of the second side surface and the third segmentation portion is disposed on a portion of the third side surface.

According to various embodiments, a first antenna in which power is fed through the first power feeder of the first conductive portion, the first antenna having a first electrical length from the first ground part to the second ground part not through the first segmentation portion and a second antenna in which power is fed through the second power feeder of the first conductive portion, the second antenna having a second electrical length from the second ground part to the first ground part through the first segmentation portion, the first electrical length is longer than the second electrical length.

According to various embodiments, the first antenna operating through the first power feeder operates in a first frequency band and the second antenna operating through the second power feeder operates in a second frequency band higher than the first frequency band.

While the disclosure has been shown and described with reference to various embodiments thereof, it will be understood by those skilled in the art that various changes in form and details may be made therein without departing from the spirit and scope of the of the disclosure as defined by the appended claims and their equivalents.

What is claimed is:

1. An electronic device comprising:
    at least one housing comprising a lateral member, the lateral member comprising:
        a first side surface,
        a second side surface extending vertically from a first end of the first side surface, and
        a third side surface extending vertically from a second end of the first side surface;
    a first conductive portion disposed in a loop-shape and segmented through a first segmentation portion when the first side surface is viewed from outside;
    a substrate disposed in an inner space of the at least one housing and including a ground; and
    a wireless communication circuit disposed on the substrate and configured to transmit and receive, through the first conductive portion, a wireless signal in at least one frequency band,
    wherein the first conductive portion comprises:
        a first power feeder electrically connected to the wireless communication circuit through a first point disposed between the first segmentation portion and the second side surface,
        a second power feeder electrically connected to the wireless communication circuit through a second point disposed between the first segmentation portion and the third side surface,
        a first ground part electrically connected to the ground through a third point disposed between the first segmentation portion and the first point in a direction toward the second side surface from the first segmentation portion, and
        a second ground part electrically connected to the ground through a fourth point disposed between the second point and the third side surface.

2. The electronic device of claim 1, wherein the wireless communication circuit is further configured to:
    transmit or receive a first wireless signal in a first frequency band through the first power feeder; and
    transmit or receive a second wireless signal in at least one second frequency band higher than the first frequency band through the second power feeder.

3. The electronic device of claim 2,
    wherein the first frequency band comprises a low band, and
    wherein the second frequency band comprises at least one of a mid band or a high band.

4. The electronic device of claim 1, wherein the first and second power feeders and the first and second ground parts are disposed on a same line in the first conductive portion.

5. The electronic device of claim 1,
    wherein the lateral member further comprises a conductive member and a non-conductive member combined with the conductive member, and
    wherein the first segmentation portion is filled with the non-conductive member.

6. The electronic device of claim 1, wherein the first conductive portion is segmented from a surrounding conductive member through a second segmentation portion formed on the second side surface and a third segmentation portion formed on the third side surface.

7. The electronic device of claim 6, further comprising:
    a second conductive portion segmented through the second segmentation portion in the second side surface; and
    a third power feeder electrically connected to the wireless communication circuit at a fifth point spaced apart from the second segmentation portion.

8. The electronic device of claim 6, further comprising:
    a low-pass filter (LPF) disposed in an electrical path electrically connecting the first power feeder to the wireless communication circuit.

9. The electronic device of claim 6, wherein the first conductive portion operates as a first antenna through a first portion connected to the first power feeder and disposed on the first side surface and a portion of the second side surface extended from the first portion.

10. The electronic device of claim 6, wherein the first conductive portion operates as a second antenna through a second portion connected to the second power feeder and disposed on the first side surface.

11. The electronic device of claim 1, further comprising:
at least one first additional ground part electrically connected to the ground of the substrate through at least one point between the fourth point and the third side surface; and
at least one second additional ground part electrically connected to the ground of the substrate through at least one point between the third point and the first segmentation portion in a direction toward the second side surface from the first segmentation portion.

12. The electronic device of claim 11, further comprising:
a first variable circuit disposed in an electrical path connecting the at least one first additional ground part; and
a second variable circuit disposed in an electrical path connecting the at least one second additional ground part.

13. The electronic device of claim 12, further comprising:
at least one processor,
wherein at least one of the first variable circuit or the second variable circuit comprises:
a switching circuit; and
at least one passive element that is switched through control of the switching circuit, and
wherein the switching circuit is configured to perform a switching operation through control of the at least one processor.

14. The electronic device of claim 12,
wherein at least a portion of the first conductive portion operates as a first antenna configured to transmit or receive a first wireless signal in a first frequency band through the first power feeder, and
wherein the first frequency band is determined through the first variable circuit.

15. The electronic device of claim 14,
wherein at least a portion of the first conductive portion operates as a second antenna configured to transmit or receive a second wireless signal in at least one second frequency band higher than the first frequency band through the second power feeder, and
wherein the second frequency band is determined through the second variable circuit.

16. The electronic device of claim 1, wherein the first conductive portion comprises:
a third power feeder electrically connected to the wireless communication circuit at a fifth point disposed between the first segmentation portion and the first ground part in a direction toward the second side surface from the first segmentation portion; and
a third ground part electrically connected to the ground of the substrate at a sixth point disposed between the first segmentation portion and the third power feeder in a direction toward the second side surface from the first segmentation portion.

17. The electronic device of claim 1, further comprising:
a second conductive portion disposed through a second segmentation portion formed between the first segmentation portion and the third side surface,
wherein the first conductive portion includes a third ground part electrically connected to the ground of the substrate at a fifth point disposed between the second segmentation portion and the third side surface.

18. The electronic device of claim 17, wherein the second conductive portion comprises a third power feeder electrically connected to the wireless communication circuit at a sixth point disposed between the second ground part and the second segmentation portion.

19. The electronic device of claim 1,
wherein the at least one housing further comprises:
a front surface cover facing a first direction;
a rear surface cover facing a second direction opposite to the first direction, the lateral member surrounding a space between the front surface cover and the rear surface cover; and
a display visible from the outside through the front surface cover, and
wherein at least a portion of the first side surface is disposed substantially vertically from a surface of the display.

20. The electronic device of claim 1,
wherein the at least one housing further comprises:
a first housing; and
a second housing slidably coupled to the first housing, and
wherein the lateral member is disposed in the first housing.

* * * * *